(12) United States Patent
Limberg

(10) Patent No.: US 9,143,785 B2
(45) Date of Patent: Sep. 22, 2015

(54) COFDM BROADCAST SYSTEMS EMPLOYING TURBO CODING

(71) Applicant: Allen LeRoy Limberg, Port Charlotte, FL (US)

(72) Inventor: Allen LeRoy Limberg, Port Charlotte, FL (US)

( * ) Notice: Subject to any disclaimer, the term of this patent is extended or adjusted under 35 U.S.C. 154(b) by 456 days.

(21) Appl. No.: 13/660,861

(22) Filed: Oct. 25, 2012

(65) Prior Publication Data

US 2014/0119458 A1    May 1, 2014

(51) Int. Cl.

| | | |
|---|---|---|
| H03M 13/11 | (2006.01) | |
| H03M 13/27 | (2006.01) | |
| H04N 19/89 | (2014.01) | |
| H03M 13/25 | (2006.01) | |
| H03M 13/00 | (2006.01) | |
| H03M 13/15 | (2006.01) | |
| H03M 13/29 | (2006.01) | |

(52) U.S. Cl.
CPC ....... *H04N 19/00933* (2013.01); *H03M 13/258* (2013.01); *H03M 13/2957* (2013.01); *H03M 13/2966* (2013.01); *H03M 13/6331* (2013.01); *H04N 19/89* (2014.11); *H03M 13/1102* (2013.01); *H03M 13/152* (2013.01); *H03M 13/27* (2013.01); *H03M 13/2732* (2013.01); *H03M 13/2936* (2013.01)

(58) Field of Classification Search
None
See application file for complete search history.

(56) References Cited

U.S. PATENT DOCUMENTS

| | | | |
|---|---|---|---|
| 5,416,801 A | 5/1995 | Chouly et al. | |
| 5,687,165 A | 11/1997 | Daffara et al. | |
| 6,282,168 B1 | 8/2001 | Vijayan et al. | |
| 6,618,454 B1 | 9/2003 | Agrawal et al. | |
| 6,747,948 B1 | 6/2004 | Sarraf et al. | |
| 6,792,258 B1 | 9/2004 | Nokes et al. | |
| 6,907,084 B2 | 6/2005 | Jeong | |
| 7,076,000 B2 | 7/2006 | Rodriguez | |
| 7,139,335 B2 | 11/2006 | Kolze | |
| 7,142,610 B1 | 11/2006 | Wang | |
| 7,406,104 B2 * | 7/2008 | Yang et al. | 370/509 |
| 7,430,257 B1 * | 9/2008 | Shattil | 375/347 |
| 7,480,342 B2 | 1/2009 | Wilhelmsson et al. | |
| 7,519,895 B2 | 4/2009 | Kyung et al. | |

(Continued)

OTHER PUBLICATIONS

S. Le Goff et al, Turbo-codes and high spectral efficiency modulation. IEEE ICC '94, Conference Record, vol. 2, pp. 645-649.

(Continued)

*Primary Examiner* — Jay Patel
*Assistant Examiner* — Reza Aghevli

(57) ABSTRACT

Turbo-coded data are transmitted using quadrature amplitude modulation (QAM) of COFDM carrier waves in digital television (DTV) broadcast systems. The QAM symbol constellations map the parity bits of the turbo coded data so as to be de-mapped with higher confidence levels than the data bits, facilitating turbo decoding. A preferred DTV receiver delays the first transmissions of time-slices of a service selected for iterative-diversity reception to concur with second transmissions of those time-slices. The complex coordinates of QAM constellations in the delayed first transmission and the second transmission of the same time-slice are combined by a maximal-ratio QAM combiner after COFDM demodulation, but before de-mapping QAM constellations and turbo decoding. In a less-preferred DTV receiver, QAM constellations in the delayed first transmission of each time-slice and in the second transmission of the same time-slice are de-mapped separately. A maximal-ratio code combiner then combines de-mapping results before turbo decoding.

28 Claims, 53 Drawing Sheets

(56) References Cited

U.S. PATENT DOCUMENTS

| | | | |
|---|---|---|---|
| 7,649,959 B2* | 1/2010 | Tirkkonen et al. | 375/295 |
| 7,653,153 B2 | 1/2010 | Tosato et al. | |
| 7,751,488 B2* | 7/2010 | Moffatt | 375/260 |
| 7,813,433 B2* | 10/2010 | Moffatt | 375/260 |
| 7,860,147 B2* | 12/2010 | Moffatt | 375/132 |
| 7,903,749 B2* | 3/2011 | Moffatt | 375/260 |
| RE43,741 E | 10/2012 | Shokrollahi et al. | |
| 2002/0034267 A1 | 3/2002 | Chuang et al. | |
| 2002/0054632 A1 | 5/2002 | Chuang et al. | |
| 2002/0154711 A1 | 10/2002 | Collins et al. | |
| 2003/0108115 A1 | 6/2003 | Zhang et al. | |
| 2003/0148060 A1 | 8/2003 | Alcouffe | |
| 2004/0092228 A1 | 5/2004 | Force et al. | |
| 2008/0014992 A1 | 1/2008 | Pescod et al. | |
| 2008/0232499 A1 | 9/2008 | Guerrieri et al. | |
| 2009/0052576 A1 | 2/2009 | Golitschek Edler Von Elbwart et al. | |
| 2009/0074050 A1 | 3/2009 | Wang et al. | |
| 2009/0086849 A1 | 4/2009 | Tsai et al. | |
| 2009/0172492 A1 | 7/2009 | Scarpa et al. | |
| 2009/0323846 A1 | 12/2009 | Sindhushayana | |
| 2010/0040127 A1 | 2/2010 | Wen | |
| 2010/0162073 A1 | 6/2010 | Myung et al. | |
| 2010/0329368 A1 | 12/2010 | Shimezawa et al. | |
| 2011/0038406 A1 | 2/2011 | Pfletschinger | |
| 2011/0200128 A1 | 8/2011 | Ko et al. | |

OTHER PUBLICATIONS

Mauro Lattuada et al, Turbo Coded OFDM system for Video Terrestrial Broadcasting, Feb. 11, 2003.

A. J. Jameel et al., Performance Enhancement of Wireless Communication Systems Using Space-Time Turbo Code, Int. Conf. Communication Technology Proceedings, vol. 2, 2003.

M. K. Gupta et al., To Improve Bit Error Rate of Turbo Coded OFDMTransmission over Noisy Channel, JATIT vol. 8 No. 2, pp. 162-168, 2005. Islamabad, Pakistan.

C. A. Nour et al, Performance improvement using Turbo Coded BICM-ID with 16-QAM over Gaussian and Flat Fading Rayleigh Channels, www.eurasip.org/content/Eusipco/IST05/p288.

Nishar Ahamed Gugudu, Evaluation of Channel Coding in OFDM Systems, 2006, National Institute of Technology, Rourkela, India.

T. Schorr et al., LDPC Code Optimization for Diversity Reception & Turbo Equalization, Proc. of the International IEEE Workshop, SPA, Sep. 2007, pp. 63.68, Poznan, Poland.

Hrudananda Pradhan, Block Turbo Code and Its Application to OFDM for Wireless Local Area Network, 2009, National Institute of Technology, Rourkela, India.

Avijit Patel et al.,Performance Analysis and Formulation of Turbo Coded OFDM over Rayleigh & Rician Fading Channel, IJECCT vol. 2 Issue 3 (May 2012).

Julien Pons, Derivation & optimization of convolutional turbo coded OFDM & DMT modulation schemes, I' Universitéde Cergy-Pontoise, France 2007.

H. M. Savitha et al., Performance evaluation of turbo coded OFDM systems and application of turbo decoding for impulsive channel, ICTACT J. ON COM. TECH., Sep. 2010, Iss. 3.

Neetu Sharma, To Improve Bit Error Rate of OFDM transmission using turbo codes, Int. J. of Adv. Research in Computer Engineering & Technology, vol. 1, Issue 4, Jun. 2012, pp.

Hosein Nikopour et al., Turbo-Coded OFDM Transmission over a Nonlinear Channel,University of Tehran, Tehran, Iran, Tech. Report UW-E&CE#2004-16, Jun. 2004.

B.Balaji Naik, Performance of turbo coded OFDM in wireless application, Dept of Electronics & Communication Engineering,National Institute of Technology,Rourkela, India 2008.

S. K. Singh et al., Performance Evaluation of LDPC & Turbocoded OFDMSystem in Nakagami-M Fading, Int. J.of Computer Theory & Engineering, vol. 4, No. 4, Aug. 2012, pp. 523-526.

Zhang, Xu; Modeling & Performance Analysis of QAM-based COFDM System, MSEE Thesis, University of Toledo, Toledo, OH 2011.

A. G. Burr & G. P. White, Performance of Turbo-Coded COFDM, IEE Colloquium on Turbo Decoding-Can It Double Capacity?, London, 1999.

Z. Zhang, B. QI & P. Zhang, on Bandwidth Efficient Coded OFDM Using Multilevel Turbo Codes and Iterative Multistage Coding,IEE Cooloquium on Turbo Coding, 1999.

F. Tosato & P. Bisaglia, "Simplified soft-output demapper for binary interleaved COFDM with application to HIPERLAN/2", IEEE ICC 2002.

* cited by examiner

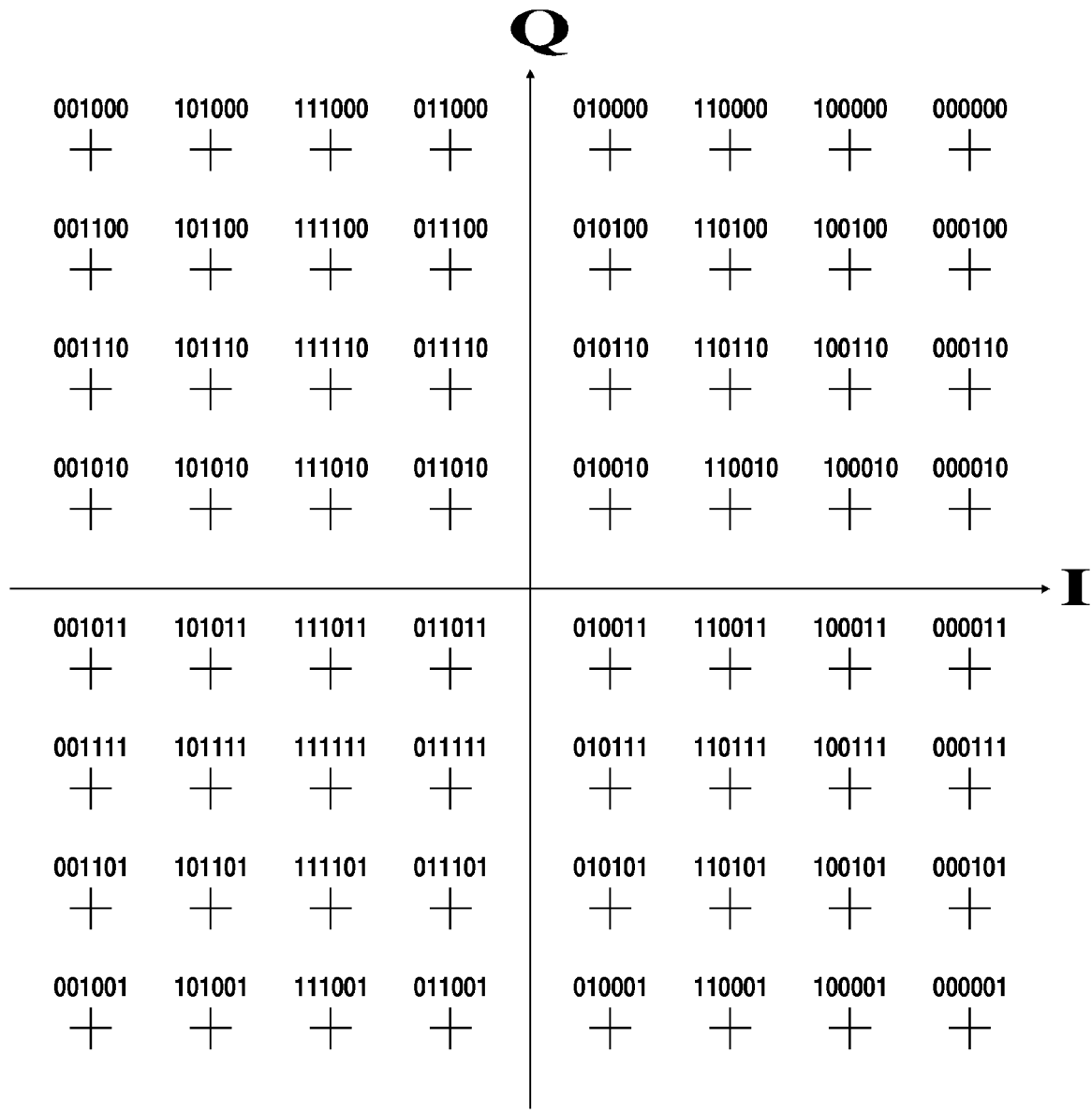
Fig. 9 Gray Mapping of 64-QAM for Concatenated FEC Coding Having One-third Code Rate

| 0 | 1 1 | 0 0 | 1 1 | 0 |
|---|---|---|---|---|
| 0 | 1 1 | 0 0 | 1 1 | 0 |
| 0 | 1 1 | 0 0 | 1 1 | 0 |
| 0 | 1 1 | 0 0 | 1 1 | 0 |
| 0 | 1 1 | 0 0 | 1 1 | 0 |
| 0 | 1 1 | 0 0 | 1 1 | 0 |
| 0 | 1 1 | 0 0 | 1 1 | 0 |
| 0 | 1 1 | 0 0 | 1 1 | 0 |

PATTERN OF 1ST BITS
IN FIG. 9 64QAM
CONSTELLATION

Fig. 10 A

| 0 0 | 1 1 1 1 | 0 0 |
|---|---|---|
| 0 0 | 1 1 1 1 | 0 0 |
| 0 0 | 1 1 1 1 | 0 0 |
| 0 0 | 1 1 1 1 | 0 0 |
| 0 0 | 1 1 1 1 | 0 0 |
| 0 0 | 1 1 1 1 | 0 0 |
| 0 0 | 1 1 1 1 | 0 0 |
| 0 0 | 1 1 1 1 | 0 0 |

PATTERN OF 2ND BITS
IN FIG. 9 64QAM
CONSTELLATION

Fig. 10 B

| 1 1 1 1 | 0 0 0 0 |
|---|---|
| 1 1 1 1 | 0 0 0 0 |
| 1 1 1 1 | 0 0 0 0 |
| 1 1 1 1 | 0 0 0 0 |
| 1 1 1 1 | 0 0 0 0 |
| 1 1 1 1 | 0 0 0 0 |
| 1 1 1 1 | 0 0 0 0 |
| 1 1 1 1 | 0 0 0 0 |

PATTERN OF 3RD BITS
IN FIG. 9 64QAM
CONSTELLATION

Fig. 10 C

| 0 0 0 0 0 0 0 0 |
|---|
| 1 1 1 1 1 1 1 1 |
| 1 1 1 1 1 1 1 1 |
| 0 0 0 0 0 0 0 0 |
| 0 0 0 0 0 0 0 0 |
| 1 1 1 1 1 1 1 1 |
| 1 1 1 1 1 1 1 1 |
| 0 0 0 0 0 0 0 0 |

PATTERN OF 4TH BITS
IN FIG. 9 64QAM
CONSTELLATION

Fig. 10 D

| 0 0 0 0 0 0 0 0 |
|---|
| 0 0 0 0 0 0 0 0 |
| 1 1 1 1 1 1 1 1 |
| 1 1 1 1 1 1 1 1 |
| 1 1 1 1 1 1 1 1 |
| 1 1 1 1 1 1 1 1 |
| 0 0 0 0 0 0 0 0 |
| 0 0 0 0 0 0 0 0 |

PATTERN OF 5TH BITS
IN FIG. 9 64QAM
CONSTELLATION

Fig. 10 E

| 0 0 0 0 0 0 0 0 |
|---|
| 0 0 0 0 0 0 0 0 |
| 0 0 0 0 0 0 0 0 |
| 0 0 0 0 0 0 0 0 |
| 1 1 1 1 1 1 1 1 |
| 1 1 1 1 1 1 1 1 |
| 1 1 1 1 1 1 1 1 |
| 1 1 1 1 1 1 1 1 |

PATTERN OF 6TH BITS
IN FIG. 9 64QAM
CONSTELLATION

Fig. 10 F

| EARLIER DATA BIT | EARLIER PARITY BIT FROM SET 1 | EARLIER PARITY BIT FROM SET 2 | LATER DATA BIT | LATER PARITY BIT FROM SET 1 | LATER PARITY BIT FROM SET 2 |
|---|---|---|---|---|---|

Fig. 11 Nature of Bits at Each Target Point in Each 64QAM Symbol Constellation for One-third Rate FEC Coding

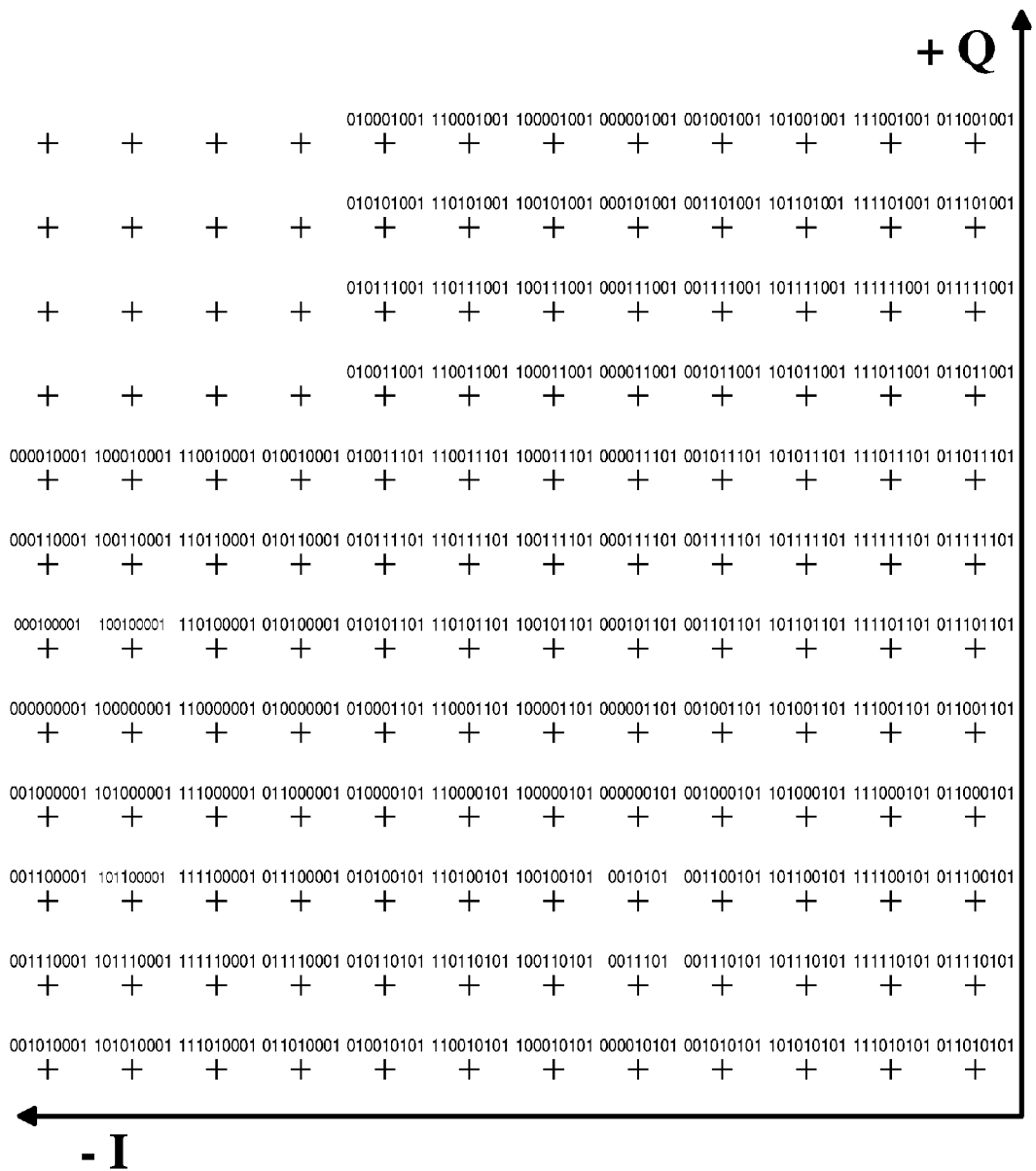
Fig. 12A Gray Mapping for -I, +Q Quadrant of 512QAM Used for Bit-wise FEC Coding Having One-third Code Rate

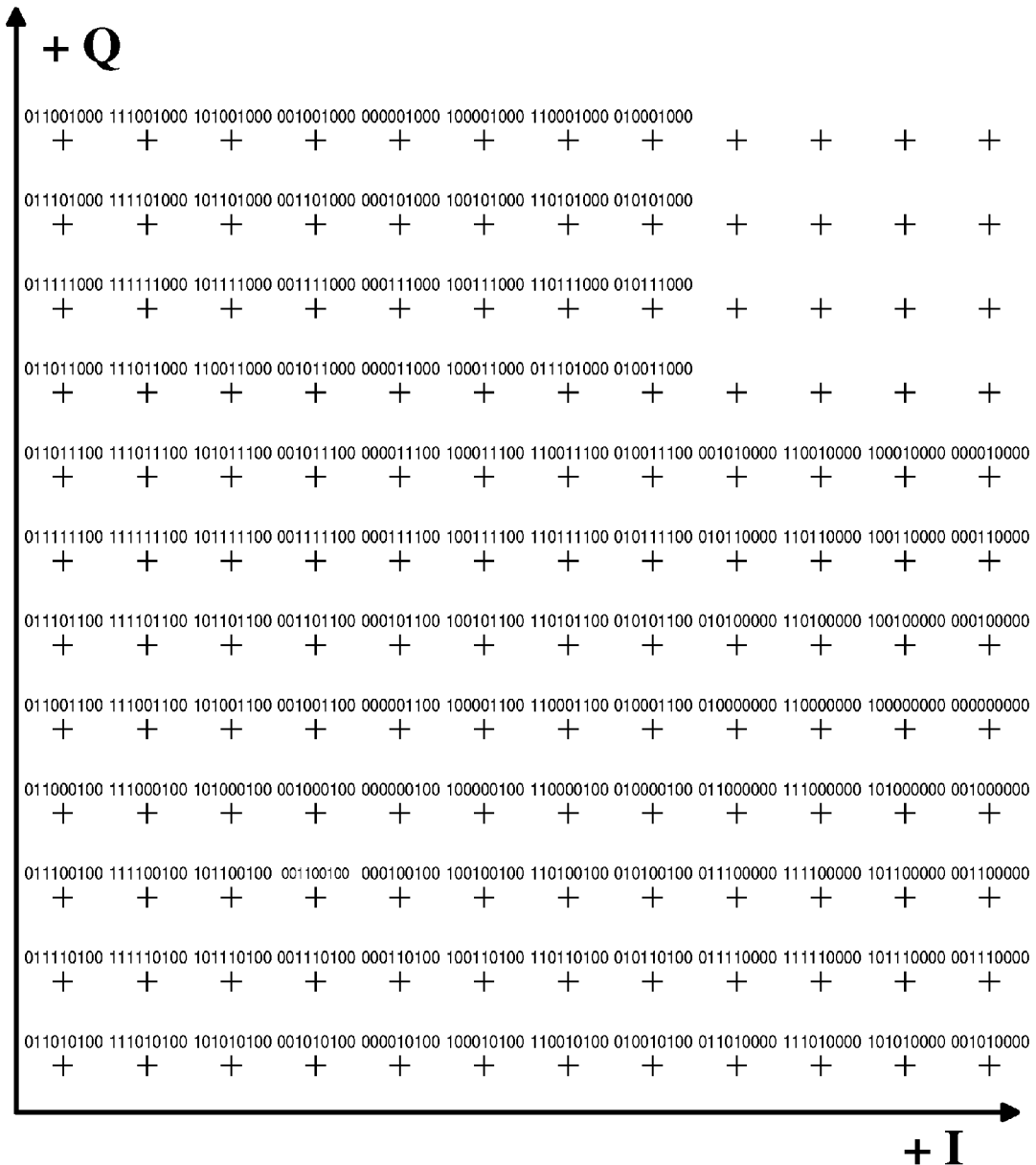
Fig. 12B Gray Mapping for +I, +Q Quadrant of 512QAM Used for Bit-wise FEC Coding Having One-third Code Rate

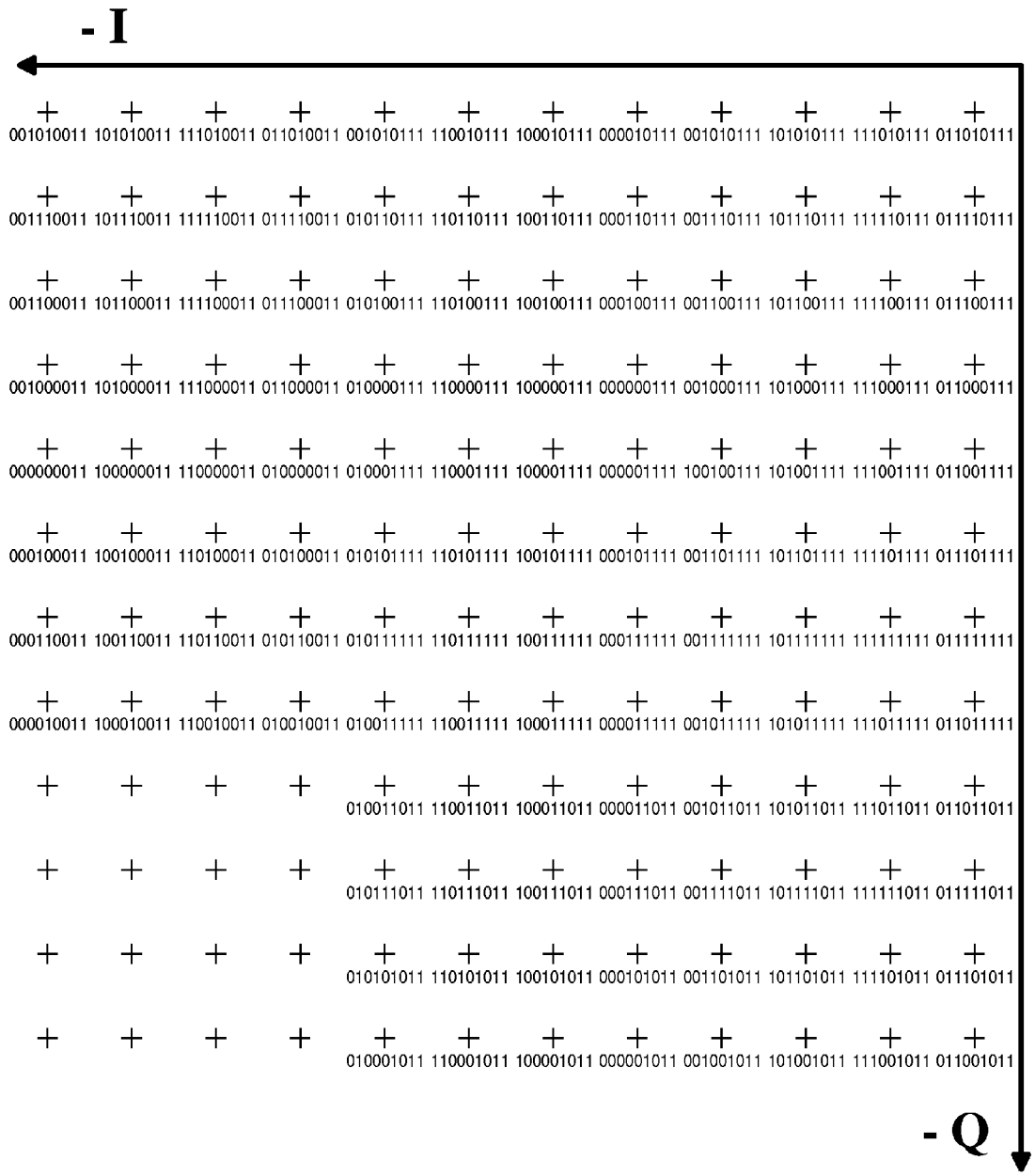
Fig. 12C Gray Mapping for -I, -Q Quadrant of 512QAM Used for Bit-wise FEC Coding Having One-third Code Rate

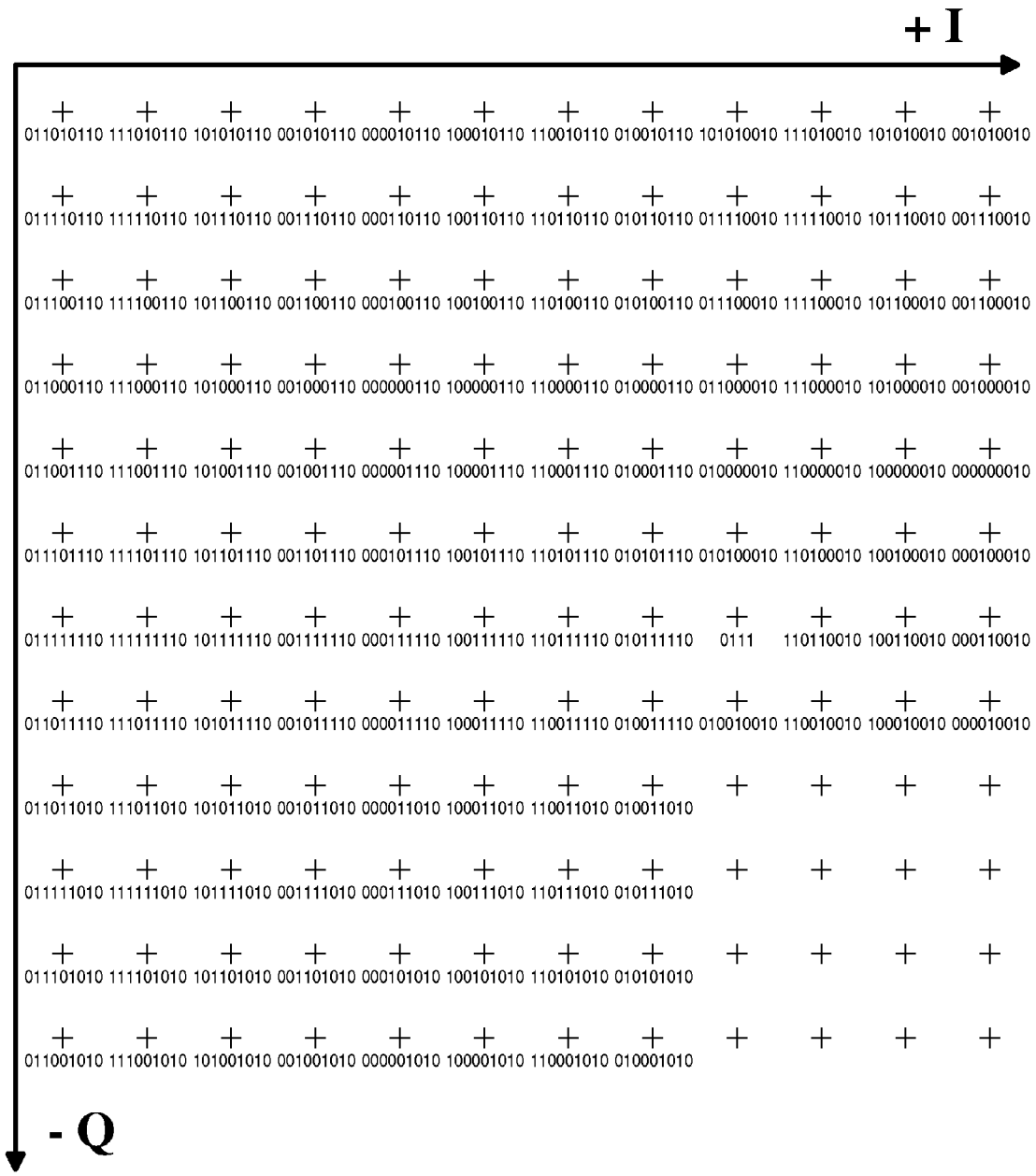
Fig. 12D Gray Mapping for + I, - Q Quadrant of 512QAM Used for Bit-wise FEC Coding Having One-third Code Rate

Mapping of 3rd, 6th, 7th, 8th & 9th Bits of 9-Bit Sequences re 512QAM Symbol Constellation

| 0100 | 1100 | 1000 | 0000 |
|------|------|------|------|
| 0110 | 1110 | 1010 | 0010 |
| 0111 | 1111 | 1011 | 0011 |
| 0101 | 1101 | 1001 | 0001 |

MAPPING OF 1ST, 2ND, 4TH & 5TH BITS IN 9-BIT SEQUENCES IN REGIONS 01001, 11000, 00101, 10100, 10000, 01111, 11110 & 00010 OF THE 512QAM SYMBOL CONSTELLATION

Fig. 14A

| 0000 | 1000 | 1100 | 0100 |
|------|------|------|------|
| 0010 | 1010 | 1110 | 0110 |
| 0011 | 1011 | 1111 | 0111 |
| 0001 | 1001 | 1101 | 0101 |

MAPPING OF 1ST, 2ND, 4TH & 5TH BITS IN 9-BIT SEQUENCES IN REGIONS 11001, 01000, 10001, 10101, 00100, 00010, 11111 & 01110 OF THE 512QAM SYMBOL CONSTELLATION

Fig. 14B

| 0101 | 1101 | 1001 | 0001 |
|------|------|------|------|
| 0111 | 1111 | 1011 | 0011 |
| 0110 | 1110 | 1010 | 0010 |
| 0100 | 1100 | 1000 | 0000 |

MAPPING OF 1ST, 2ND, 4TH & 5TH BITS IN 9-BIT SEQUENCES IN REGIONS 01101, 11100, 00000, 00111, 10110, 10010, 01011 & 11010 OF THE 512QAM SYMBOL CONSTELLATION

Fig. 14C

| 0001 | 1001 | 1101 | 0101 |
|------|------|------|------|
| 0011 | 1011 | 1111 | 0111 |
| 0010 | 1010 | 1110 | 0110 |
| 0000 | 1000 | 1100 | 0100 |

MAPPING OF 1ST, 2ND, 4TH & 5TH BITS IN 9-BIT SEQUENCES IN REGIONS 00001, 11101, 01100, 10011, 10111, 00110, 11011 & 01010 OF THE 512QAM SYMBOL CONSTELLATION

PATTERN OF 1ST
BITS IN REGION OF
512QAM SYMBOL
CONSTELLATION

PATTERN OF 4TH
BITS IN REGION OF
512QAM SYMBOL
CONSTELLATION

PATTERN OF 7TH
BITS IN 512QAM
CONSTELLATION

PATTERN OF 2ND
BITS IN REGION OF
512QAM SYMBOL
CONSTELLATION

PATTERN OF 5TH
BITS IN REGION OF
512QAM SYMBOL
CONSTELLATION

PATTERN OF 8TH
BITS IN 512QAM
CONSTELLATION

PATTERN OF 3RD
BITS IN 512QAM
CONSTELLATION

PATTERN OF 6TH
BITS IN 512QAM
CONSTELLATION

PATTERN OF 9TH
BITS IN 512QAM
CONSTELLATION

Fig. 15I

| FIRST DATA BIT | FIRST PARITY BIT FROM SET 1 | FIRST PARITY BIT FROM SET 2 | SECOND DATA BIT | SECOND PARITY BIT FROM SET 1 | SECOND PARITY BIT FROM SET 2 | THIRD DATA BIT | THIRD PARITY BIT FROM SET 1 | THIRD PARITY BIT FROM SET 2 |
|---|---|---|---|---|---|---|---|---|

Nature of Bits at Each Target Point in Each 512QAM Symbol Constellation for One-third Rate FEC Coding

Fig. 16

| 1ST DATA BIT | 2ND DATA BIT | 1ST PARITY BIT | 3RD DATA BIT | 4TH DATA BIT | 2ND PARITY BIT | 5TH DATA BIT | 6TH DATA BIT | 3RD PARITY BIT |
|---|---|---|---|---|---|---|---|---|

Nature of Bits at Each Lattice Point in Each 512QAM Symbol Constellation for Two-thirds Rate FEC Coding

Fig. 17

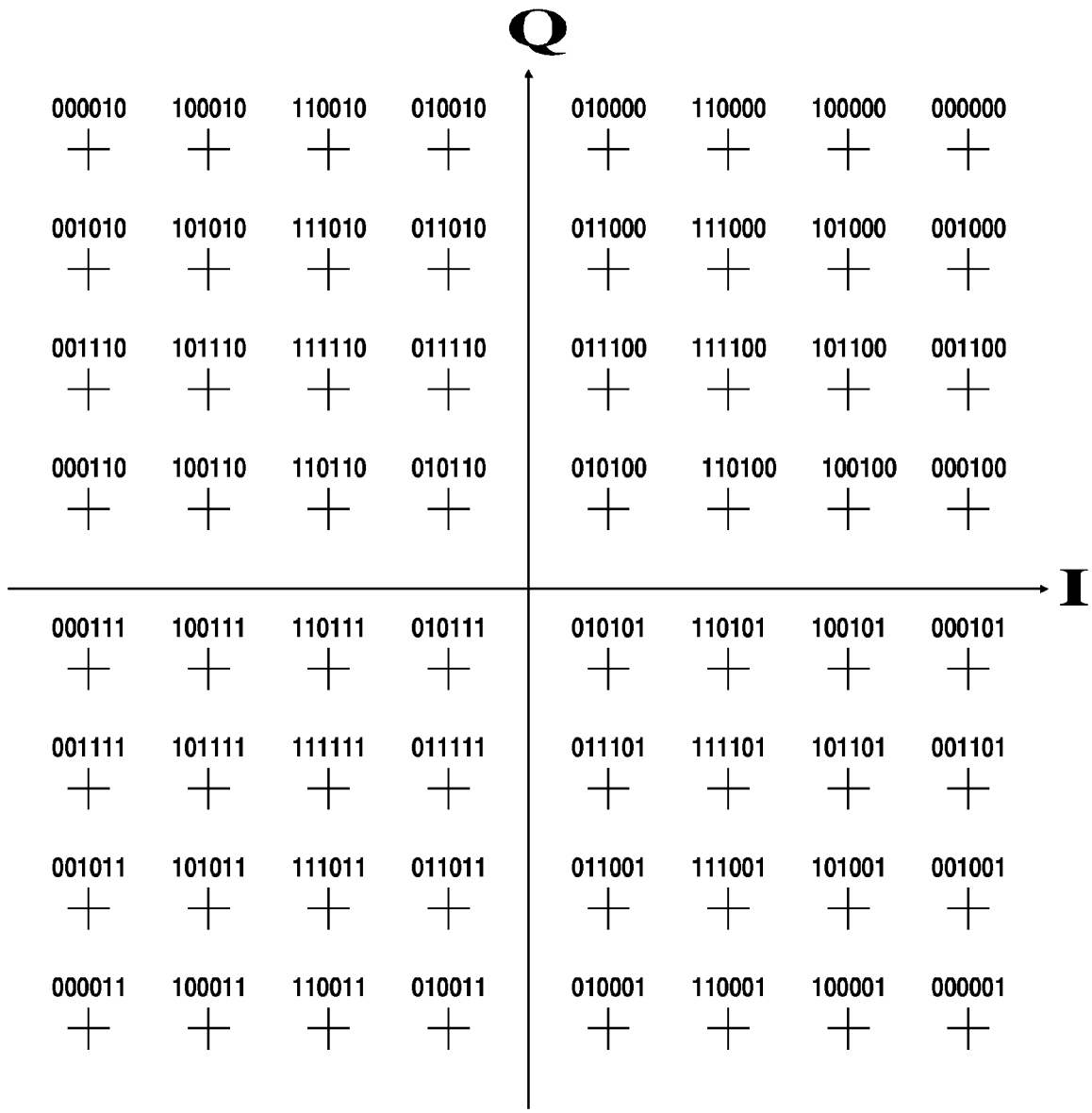
Fig. 36 Gray Mapping of 64-QAM for Concatenated FEC Coding Having One-half Code Rate

```
0 | 1 1 | 0 0 | 1 1 | 0        0  0  0  0  0  0  0  0        1 1 1 1 | 0 0 0 0
0 | 1 1 | 0 0 | 1 1 | 0        1  1  1  1  1  1  1  1        1 1 1 1 | 0 0 0 0
0 | 1 1 | 0 0 | 1 1 | 0        1  1  1  1  1  1  1  1        1 1 1 1 | 0 0 0 0
0 | 1 1 | 0 0 | 1 1 | 0        0  0  0  0  0  0  0  0        1 1 1 1 | 0 0 0 0
0 | 1 1 | 0 0 | 1 1 | 0        0  0  0  0  0  0  0  0        1 1 1 1 | 0 0 0 0
0 | 1 1 | 0 0 | 1 1 | 0        1  1  1  1  1  1  1  1        1 1 1 1 | 0 0 0 0
0 | 1 1 | 0 0 | 1 1 | 0        1  1  1  1  1  1  1  1        1 1 1 1 | 0 0 0 0
0 | 1 1 | 0 0 | 1 1 | 0        0  0  0  0  0  0  0  0        1 1 1 1 | 0 0 0 0
```

PATTERN OF 1ST BITS IN 64QAM CONSTELLATION

Fig. 37A

PATTERN OF 3RD BITS IN 64QAM CONSTELLATION

Fig. 37C

PATTERN OF 5TH BITS IN 64QAM CONSTELLATION

PATTERN OF 2ND BITS IN 64QAM CONSTELLATION

Fig. 37B

PATTERN OF 4TH BITS IN 64QAM CONSTELLATION

Fig. 37D

PATTERN OF 6TH BITS IN 64QAM CONSTELLATION

Fig. 37F

| 1ST DATA BIT | 1ST PARITY BIT | 2ND DATA BIT | 2ND PARITY BIT | 3RD DATA BIT | 3RD PARITY BIT |
|---|---|---|---|---|---|

Fig. 38 Nature of Bits at Each Target Point in Each 64QAM Symbol Constellation for One-half Rate FEC Coding

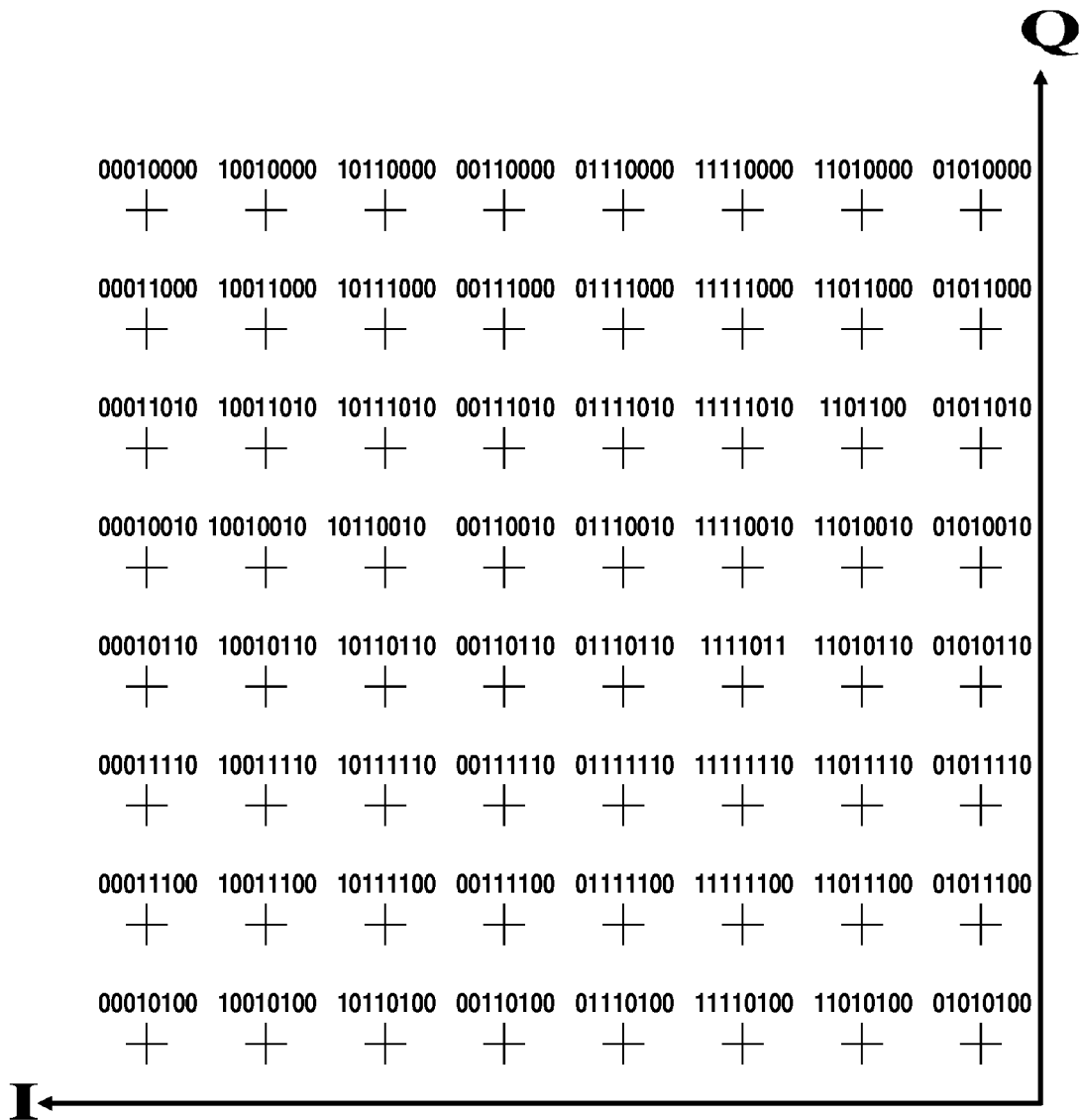
Fig. 40A Gray Mapping for -I, +Q Quadrant of 256QAM Used for Bit-wise FEC Coding Having One-half Code Rate

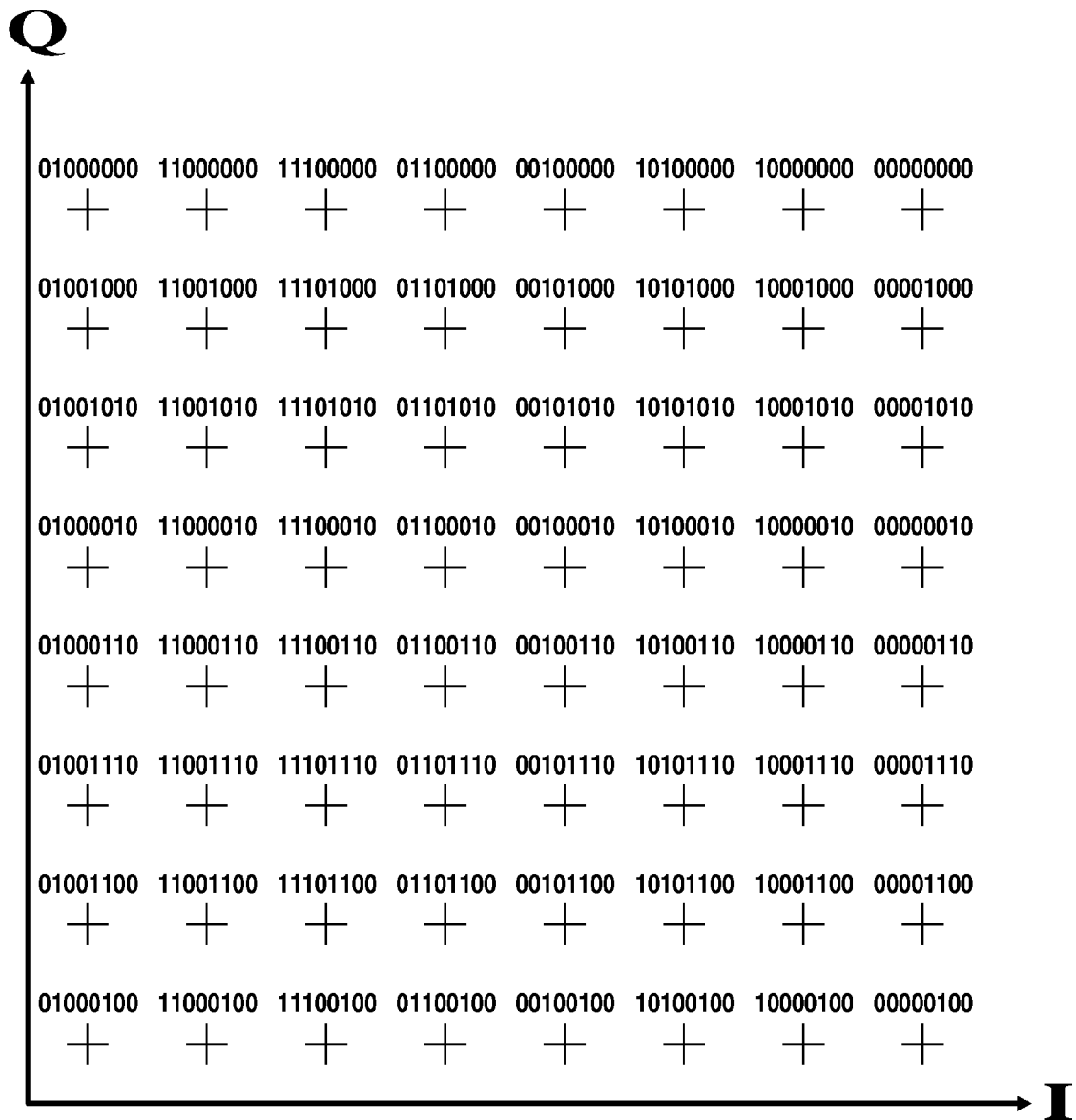
Fig. 40B Gray Mapping for + I, + Q Quadrant of 256QAM Used for Bit-wise FEC Coding Having One-half Code Rate

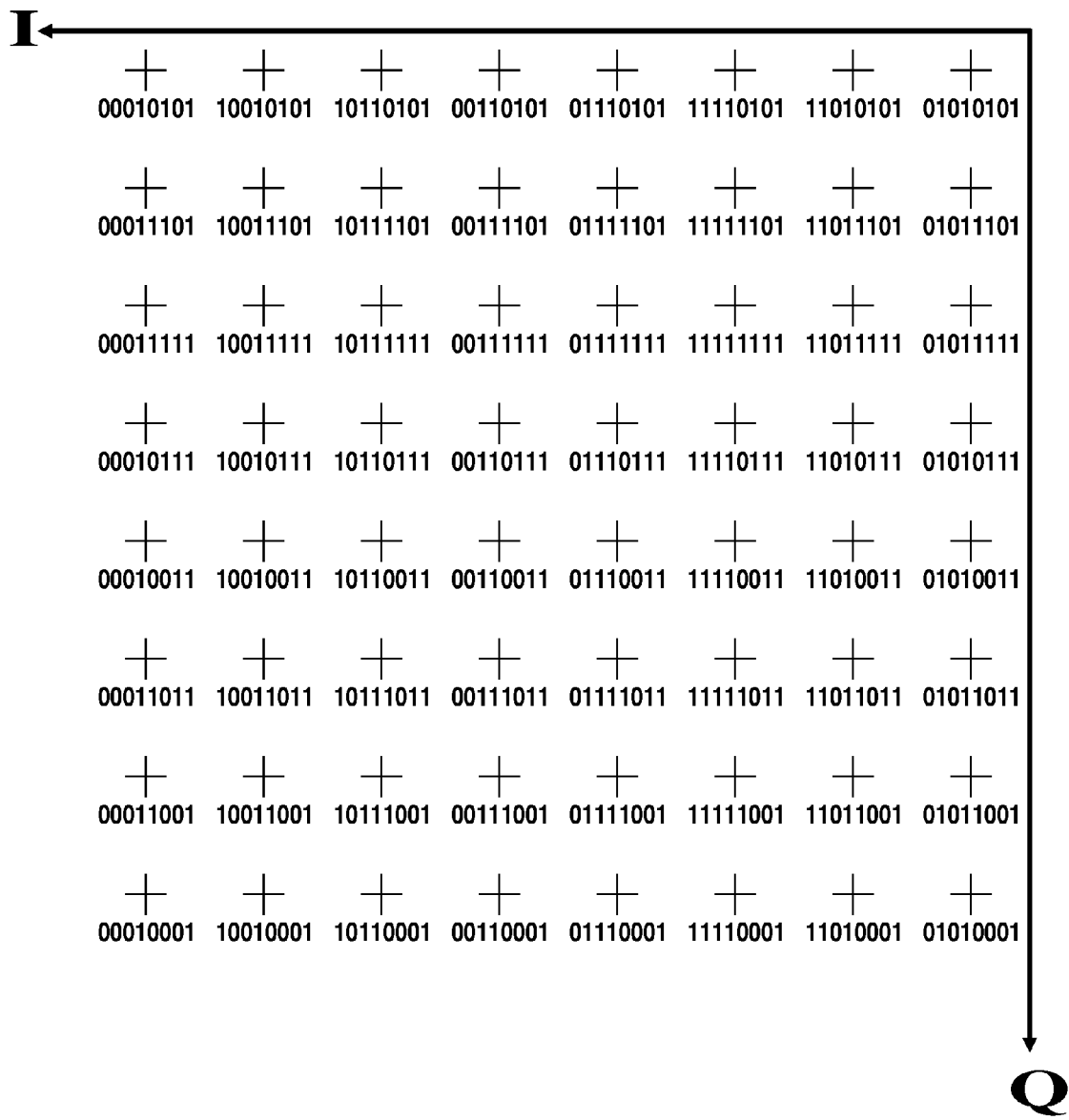
Fig. 40C Gray Mapping for -I, -Q Quadrant of 256QAM Used for Bit-wise FEC Coding Having One-half Code Rate

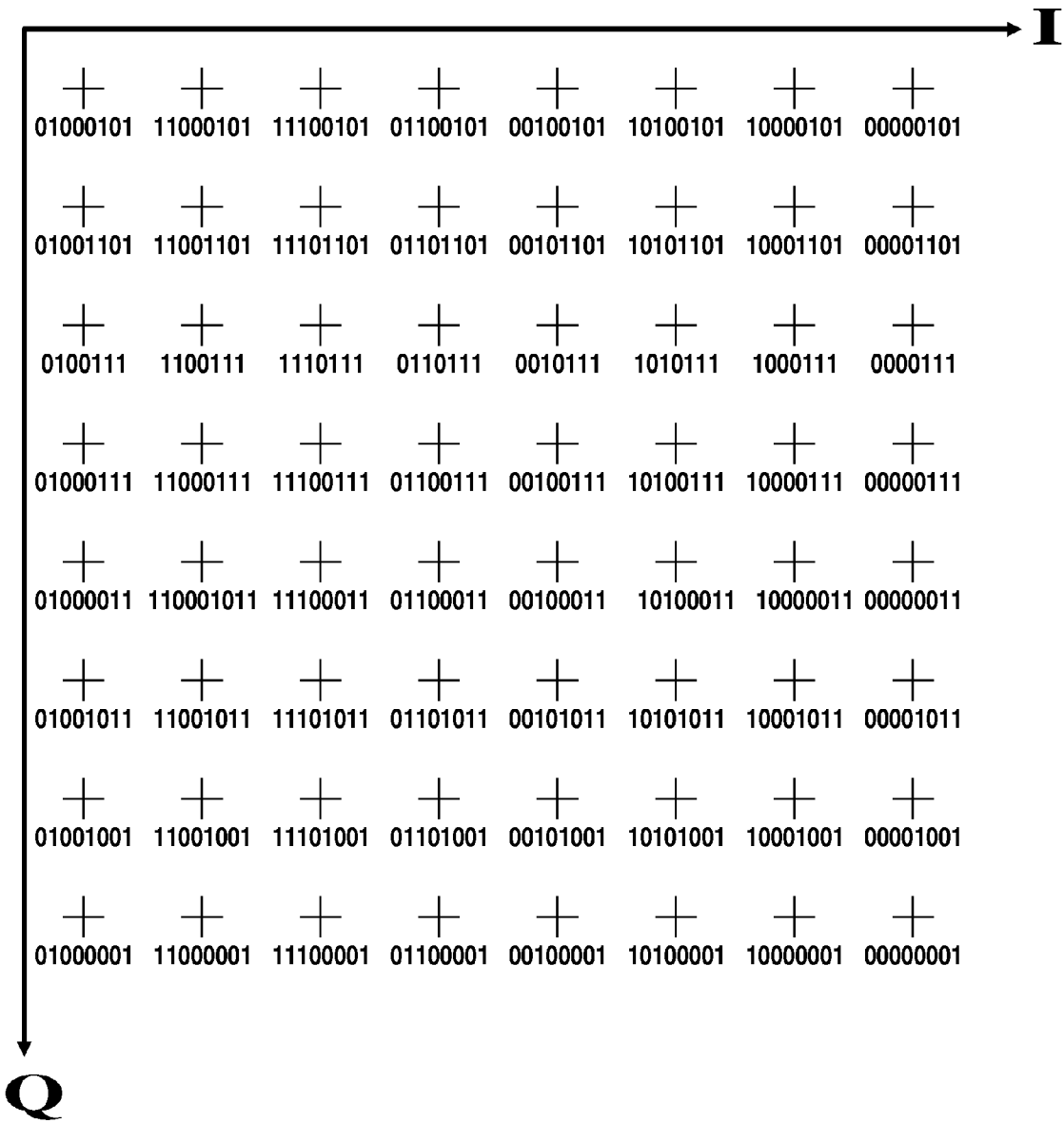
Fig. 40D  Gray Mapping for + I, - Q Quadrant of 256QAM Used for Bit-wise FEC Coding Having One-half Code Rate

PATTERN OF 1ST
BITS IN 256QAM
CONSTELLATION

PATTERN OF 2ND
BITS IN 256QAM
CONSTELLATION

PATTERN OF 3RD
BITS IN 256QAM
CONSTELLATION

PATTERN OF 4TH
BITS IN 256QAM
CONSTELLATION

PATTERN OF 5TH
BITS IN 256QAM
CONSTELLATION

PATTERN OF 6TH
BITS IN 256QAM
CONSTELLATION

PATTERN OF 7TH
BITS IN 256QAM
CONSTELLATION

PATTERN OF 8TH
BITS IN 256QAM
CONSTELLATION

| 1ST DATA BIT | 1ST PARITY BIT | 2ND DATA BIT | 2ND PARITY BIT | 3RD DATA BIT | 3RD PARITY BIT | 4TH DATA BIT | 4TH PARITY BIT |
|---|---|---|---|---|---|---|---|

Fig. 42

Nature of Bits at Each Lattice Point in Each 256QAM Symbol Constellation for One-half Rate FEC Coding

| 1ST DATA BIT | 2ND DATA BIT | 3RD DATA BIT | 4TH DATA BIT | 5TH DATA BIT | 6TH DATA BIT | 7TH DATA BIT | PARITY BIT |

Fig. 53 Nature of Bits at Each Lattice Point in Each 256QAM Symbol Constellation for Seven-eighths Rate FEC Coding

| 1ST DATA BIT | 2ND DATA BIT | 3RD DATA BIT | 1ST PARITY BIT | 4TH DATA BIT | 5TH DATA BIT | 6TH DATA BIT | 2ND PARITY BIT |

Fig. 54 Nature of Bits at Each Lattice Point in Each 256QAM Symbol Constellation for Three-fourths Rate FEC Coding

| 1ST DATA BIT | 2ND DATA BIT | 3RD DATA BIT | 1ST PARITY BIT |
|---|---|---|---|

Fig. 55 Nature of Bits at Each Lattice Point in Each 16QAM Symbol Constellation for Three-fourths Rate FEC Coding

| 1ST DATA BIT | 2ND DATA BIT | 1ST PARITY BIT | 3RD DATA BIT | 4TH DATA BIT | 2ND PARITY BIT |
|---|---|---|---|---|---|

Fig. 56 Nature of Bits at Each Lattice Point in Each 64QAM Symbol Constellation for Five-sixths Rate FEC Coding

| 1ST DATA BIT | 2ND DATA BIT | 1ST PARITY BIT | 3RD DATA BIT | 4TH DATA BIT | 2ND PARITY BIT |
|---|---|---|---|---|---|

Fig. 57 Nature of Bits at Each Lattice Point in Each 64QAM Symbol Constellation for Two-thirds Rate FEC Coding

COFDM BROADCAST SYSTEMS EMPLOYING TURBO CODING

This is a continuation-in-part of U.S. patent application Ser. No. 13/555,117 filed 21 Jul. 2012 claiming the benefit of the filing dates of provisional U.S. Pat. App. Ser. No. 61/574,138 filed 28 Jul. 2011, of provisional U.S. Pat. App. Ser. No. 61/575,179 filed 16 Aug. 2011, of provisional U.S. Pat. App. Ser. No. 61/626,437 filed 27 Sep. 2011, of provisional U.S. Pat. App. Ser. No. 61/627,495 filed 13 Oct. 2011 and of provisional U.S. Pat. App. Ser. No. 61/631,180 filed 28 Dec. 2011. Provisional U.S. Pat. App. Ser. No. 61/711,268 filed on 9 Oct. 2012 is in its entirety incorporated herein, and the benefit of its priority date is hereby claimed.

FIELD OF THE INVENTION

In general the invention relates to systems of over-the-air broadcasting of digital television (DTV) signals suited for reception by mobile and handset receivers, commonly referred to collectively as "M/H" receivers, and by "stationary" receivers that customarily remain at one reception site. Each system employs forward-error-correction (FEC) coding of the DTV signals, which are subsequently transmitted using coded orthogonal frequency-division multiplexing (COFDM) of a plurality of carrier waves. Some aspects of the invention more specifically concern transmitters for such systems. Other aspects of the invention more specifically concern both stationary and M/H receivers for such systems.

BACKGROUND OF THE INVENTION

DTV broadcasting in the United States of America has been done in accordance with broadcasting standards formulated by an industry consortium called the Advanced Television Systems Committee (ATSC). ATSC published a Digital Television Standard in 1995 that employed 8-level vestigial-sideband amplitude modulation of a single radio-frequency (RF) carrier wave. This DTV transmission system is referred to as 8-VSB. In the beginning years of the twenty-first century efforts were made to provide for more robust transmission of data over broadcast DTV channels without unduly disrupting the operation of so-called "legacy" DTV receivers already in the field. These efforts culminated in an ATSC standard directed to broadcasting digital data for reception by mobile receivers being adopted on 15 Oct. 2009. This subsequent standard also used 8-level vestigial-sideband amplitude modulation of a single RF carrier wave, so the more robust transmission of data could be time-division multiplexed with the transmission of DTV signal to so-called "legacy" DTV receivers already in the field. The digital data to be transmitted for reception by mobile receivers employ Internet Protocol (IP) and are subjected to serial concatenated convolutional coding (SCCC) before being encapsulated in MPEG-2 transport stream (TS) packets. These TS packets are subsequently time-division multiplexed with the MPEG-2 TS packets of data transmitted for reception by "legacy" DTV receivers.

DTV broadcasting in Europe has employed coded orthogonal frequency-division multiplexing (COFDM) that employs a multiplicity of RF carrier waves closely spaced across each 8-MHz-wide television channel, rather than a single RF carrier wave per television channel. Adjacent carrier waves are orthogonal to each other. Successive multi-bit symbols are selected from a serial data stream and used to modulate respective ones of the multiplicity of RF carrier waves in turn, in accordance with a conventional modulation scheme—such as quaternary phase shift keying (QPSK) or quadrature amplitude modulation (QAM). QPSK is preferably DQPSK, using differential modulation that is inherently insensitive to slowly changing amplitude and phase distortion. DPSK simplifies carrier recovery in the receiver. Customarily, the QAM is either 16QAM or 64QAM using square 2-dimensional modulation constellations. In actual practice, the RF carrier waves are not modulated individually. Rather, a single carrier wave is modulated at high symbol rate using QPSK or QAM. The resulting modulated carrier wave is then transformed in an inverse discrete Fourier transform (I-DFT) procedure to generate the multiplicity of RF carrier waves each modulated at low symbol rate.

In Europe, broadcasting to handheld receivers is done using a system referred to as DVB-H. DVB-H (Digital Video Broadcasting—Handheld) is a digital broadcast standard for the transmission of broadcast content to handheld receivers, published in 2004 by the European Telecommunications Standards Institute (ETSI) and identified as EN 302304. DVB-H, as a transmission standard, specifies the physical layer as well as the elements of the lowest protocol layers. It uses a power-saving technique based on the time-multiplexed transmission of different services. The technique, called "time slicing", allows substantial saving of battery power. Time slicing allows soft hand-over as the receiver moves from network cell to network cell. The relatively long power-save periods may be used to search for channels in neighboring radio cells offering the selected service. Accordingly, at the border between two cells, a channel hand-over can be performed that is imperceptible by the user. Both the monitoring of the services in adjacent cells and the reception of the selected service data can utilize the same receiver front end.

In contrast to other DVB transmission systems, which are based on the DVB Transport Stream adopted from the MPEG-2 standard, the DVB-H system is based on Internet Protocol (IP). The DVB-H baseband interface is an IP interface allowing the DVB-H system to be combined with other IP-based networks. Even so, the MPEG-2 transport stream is still used by the base layer. The IP data are embedded into the transport stream using Multi-Protocol Encapsulation (MPE), an adaptation protocol defined in the DVB Data Broadcast Specification. At the MPE level, DVB-H employs an additional stage of forward error correction called MPE-FEC, which is essentially (255, 191) transverse Reed-Solomon (TRS) coding. The transverse direction is orthogonal to the direction of the (204, 188) Reed-Solomon (RS) coding employed both in DVB-H and in DVB-T terrestrial broadcasting to stationary DTV receivers. This TRS coding is reported to reduce the S/N requirements for reception by a handheld device by a 7 dB margin compared to DVB-T. The block interleaver used for the TRS coding engenders a specific frame structure, called the "FEC frame", for incorporating the incoming data of the DVB-H codec.

The physical radio transmission of DVB-H is performed according to the DVB-T standard and employs OFDM multi-carrier modulation. DVB-T employed coded orthogonal frequency-division multiplexing (COFDM) in which an 8 MHz-wide radio-frequency (RF) channel comprises 2000 or 8000 evenly-spaced carriers for transmitting to stationary receivers. DVB-T2, an upgrade of DVB-T proposed in 2011, further permits approximately 4000 evenly-spaced carrier waves better to accommodate transmitting to mobile and handheld receivers. These choices as to number of carrier waves are commonly referred to as 2K, 8K and 4K options. DVB-H uses only a fraction—e.g., one quarter—of the digital payload capacity of the RF channel.

DVB-T2 employs low-density parity check (LDPC) coding as forward-error-correction (FEC), rather than using concatenated convolutional coding (CCC) or using product coding. An LDPC code is based on an H matrix containing a low count of ones. Encoding uses equations derived from the H matrix to generate the parity check bits. Decoding is accomplished using these equations with "soft-decisions" as to transmitted symbols to generate new estimates of the transmitted symbols. This process is repeated in an iterative manner resulting in a very powerful decoder. Like parallel concatenated convolutional coding (PCCC), LDPC codes are subject to error floors. Outer coding, such as Bose-Chaudhuri-Hocquenghem (BCH) coding, can be added to LDPC technology to overcome error floor phenomena. LDPC coding provides AWGN performance that can approach the Shannon Limit even more closely than PCCC.

COFDM may again be considered for DTV broadcasting in the United States of America, where 6-MHz-wide rather than 8-MHz-wide RF channels are employed for such broadcasting. Generally, the 2K, 8K and 4K options are retained in proposals for such DTV broadcasting, with bit rates being scaled back to suit the 6-MHz-wide RF channels.

COFDM is able to overcome frequency-selective fading quite well, but reception will fail when there is severe flat-spectrum fading. Such flat-spectrum fading is sometimes referred to as a "drop-out" in received signal strength. Such drop-out occurs when the receiving site changes such that a sole effective signal transmission path is blocked by an intervening hill or structure, for example. Because the signaling rate in the individual OFDM carriers is very low, COFDM receivers are capable of maintaining reception despite drop-outs that are only a fraction of a second in duration. However, drop-outs that last as long as a few seconds disrupt television reception perceptibly. Such protracted drop-outs are encountered in a vehicular receiver when the vehicle passes through a tunnel, for example. By way of further example of a protracted drop-out in reception, a stationary DTV receiver may briefly discontinue COFDM reception when receiver synchronization is momentarily lost during dynamic multipath reception conditions, such as caused by aircraft flying over the reception site.

The ATSC standard directed to broadcasting digital television and digital data to M/H receivers used TRS coding that extended over eighty dispersed-in-time short time-slot intervals, rather than being confined to a single longer time-slot interval. A principal purpose of the TRS coding that extended over eighty time-slot intervals was overcoming occasional protracted drop-outs in received signal strength. The DVB-SH standard that will replace the DVB-H standard also employs long-duration TRS coding that extends over a few data frames. Confining TRS coding to a single longer time-slot interval as done in DVB-H is advantageous, however, in that error-correction is completed within a shorter time. This helps speed up changes in RF-channel tuning, for example.

Iterative-diversity transmissions were proposed to ATSC to facilitate alternative or additional techniques for dealing with flat-spectrum fading of 8-VSB signals. Some of these proposals were directed to separate procedures being used for decoding earlier and later transmissions of the same coded data to generate respective sets of data packets, each identified after such decoding either as being probably correct or probably incorrect. Corresponding data packets from the two sets were compared, and a further set of data packets was chosen from the ones of the compared data packets more likely to be correct. A. L. R. Limberg proposed delaying earlier transmissions of concatenated convolutionally coded (CCC) data so as to be concurrently available with later transmissions of similar CCC data, then decoding the contemporaneous CCC data with respective turbo decoders that exchanged information concerning soft data bits to secure coding gain. These various iterative-diversity transmission techniques, although comparatively robust in regard to overcoming additive White Gaussian noise (AWGN), were not incorporated into the ATSC 8-VSB system for DTV broadcasting since supposedly the single-time retransmissions halved available digital payload.

Iterative-diversity reception implemented at the transfer-stream (TS) data-packet level does not require as much delay memory for the earlier transmitted data as delaying complete earlier transmissions to be concurrent with later transmissions of the same data. This is because the redundant parity bits associated with FEC coding contained in those complete earlier transmissions is removed during its decoding and so do not need to be delayed. However, implementation of diversity reception at the TS data-packet level sacrifices the substantial coding gain that can be achieved by decoding delayed earlier transmissions concurrently with later transmissions of similar data and interchanging preliminary decoding results between the concurrent decoding procedures. Implementation of diversity reception at the TS data-packet level is also incompatible with code-combining of delayed earlier transmissions and later transmissions of similar data being used to improve signal-to-noise ratio (SNR).

With developing memory technology, it is becoming feasible to delay complete earlier transmissions of DTV time-slices for a few seconds in physically small memory that consumes little power and is practical for inclusion in a handheld receiver. Developments that will be commercialized in just a few years will make it feasible to delay transmissions of entire DTV time-slices for several seconds within an M/H receiver. Such delay memory is required for implementing long-duration TRS coding or for implementing iterative-diversity reception of once-repeated transmissions, whichever is done. Memory capable of delaying the initial ones of once-repeated transmissions for a number of seconds allows a DTV receiver to overcome severe drop-outs in received signal strength substantially as long as that number of seconds. If the same memory were used to support TRS coding over that number of seconds, the capability of a DTV receiver to overcome severe drop-outs in received signal strength is only a fraction of that number of seconds.

If long-duration TRS coding is used in COFDM transmissions of DTV, the DTV receiver will usually include an OFDM demodulator followed by employ a single decoder for convolutional coding or for LDPC coding. This decoder is usually followed by a de-interleaver and a block decoder for some form of BCH block decoding, which is one-dimensional Reed-Solomon (RS) coding in DVB-T and is two-dimensional RS coding in DVB-H. This block decoder corrects errors introduced by impulse noise or short-duration drop-outs in received signal strength, better to avoid impairing the capability of a subsequent decoder for the long-duration TRS coding to overcome protracted drop-outs in received signal strength owing to flat-fading arising from multipath reception at a location near the DTV transmitter.

If the DTV transmitter provides once-repeated transmissions to facilitate iterative-diversity reception, the DTV receiver could include an OFDM demodulator followed by a differential delay network to supply delayed initial transmissions of error-correction-coded (ECC) data to a first turbo decoder concurrently with final re-transmissions of the same ECC data to a second turbo decoder. This would permit parallel iterative operation of two turbo decoders, with exchange of information between them to improve coding gain, much as A. L. R. Limberg proposed doing in 8-VSB.

The parallel iterative operation of two turbo decoders consumes more power than is desirable, particularly in battery-powered receivers. Maximal-ratio code combining is a technique that has been used for combining similar transmissions from a plurality of transmitters in multiple-input/multiple-output (MIMO) networks. Searching for a way to avoid parallel iterative operation of two turbo decoders, A. L. R. Limberg considered the use of maximal ratio code combining of later transmissions of ECC data with earlier transmissions of similar ECC from the same 8-VSB transmitter. The hope was that a combined signal would be generated that could be decoded by iterative operation of a single turbo decoder. One problem encountered when trying to implement such an approach is that the coding of M/H-service data is not independent of the coding of main-service data in 8-VSB broadcasting per the ATSC standard. The inner convolutional coding of the M/H signal is part of a one-half-rate convolutional coding that intersperses main-service signal components with M/H-service signal components. Accordingly, practically considered, the inner convolutional coding of the later transmissions of CCC and the inner convolutional coding of the delayed earlier transmissions of CCC still have to be decoded separately. The outer convolutional coding of the M/H signal is affected by the pre-coding of the most-significant bits of 8-VSB symbols responding to main-service data interspersed among the most-significant bits of 8-VSB symbols responding to M/H-service data. There are also some problems with measuring the energies of the later transmissions of CCC and the delayed earlier transmissions of CCC to provide the information needed for weighting these transmissions for maximal-ratio code combining.

In a replacement system for DTV broadcasting in the United States of America that uses COFDM of a plurality of carrier waves, the FEC coding of main-service data and the FEC coding of M/H-service data can be kept independent of each other. Also, the inclusion of unmodulated carrier waves among the COFDM carrier waves facilitates measurements of their total root-mean-square (RMS) energy in later transmissions and in earlier transmissions of similar data to provide the information needed to weight later and delayed earlier transmissions appropriately for maximal-ratio code combining.

European engineers updated the COFDM transmissions used in the DVB-H standard as originally developed for European broadcasting, so as to support a form of iterative-diversity reception. The orthogonal coordinates of lattice points in 16QAM symbol constellations are rotated, so the imaginary-axis coordinates duplicate the real-axis coordinates. Then the imaginary-axis coordinates of successive 16QAM symbol constellations are delayed a prescribed period of time respective to their real-axis coordinates to provide iterative diversity between the two sets of coordinates. The rotation of the axes of the orthogonal coordinates decreases by a factor of four the spacing between lattice-point coordinates along each axis. The inventor points out that it is preferable to repeat 256QAM symbol constellations without rotation, rather than using rotated 16QAM symbol constellations. The spacing between lattice-point coordinates along each axis is reduced by a factor of four by going from 16QAM symbol constellations to 256QAM symbol constellations, too. The duplication of the 256QAM symbol constellations halves their digital payload. However, sixteen times as many lattice points are available in each 256QAM symbol constellation as in each 16QAM symbol constellation. So, overall, a pair of the repeated 256 QAM symbol constellations provides eight times the digital payload of the rotated 16QAM symbol constellation of same duration as each of the 256 QAM symbol constellations. This eight times larger digital payload can support more forward-error-correction (FEC) coding, if such be desired.

A normal presumption of one skilled in the art of DTV broadcasting casually considering the possibility of repeating frames or time-slices of coded data transmissions is that single-time repetition necessarily will halve digital payload overall. Surprisingly, in actual practice this need not be the case for COFDM DTV transmissions. Customarily, the number of lattice points in the QAM symbol constellation used in modulating the COFDM carrier waves is set by the desired performance in the presence of additive white Gaussian noise (AWGN). Repeating frames or time-slices of COFDM DTV transmissions a single time accommodates the number of lattice points in the QAM symbol constellation used in modulating the COFDM carrier waves being quadrupled, doubling the number of data-slicing bins along each of the I-axis and Q-axis coordinates of each QAM symbol constellation. The smaller size of the data-slicing bins doubles the ratio of AWGN to bin-size for a 6 dB loss of performance in the presence of AWGN. Additively combining the two similar COFDM DTV transmissions improves performance in the presence of AWGN by 3 dB. Alternatively, using code combining techniques can improve performance in the presence of AWGN by somewhat more than 3 dB. The quadrupled number of lattice points in the QAM symbol constellation permits additional FEC coding that can more than recover any remaining portion of the 6 dB loss in performance in the presence of AWGN. The simple convolutional coding (CC) with one-half code rate used in DVB-T can be replaced by parallel concatenated convolutional coding (PCCC) with one-third code rate, for example. When PCCC replaces CC, overall digital payload is two-thirds of what it is in DVB-T, and performance in the presence of AWGN is substantially better than for DVB-T. Puncturing the PCCC to one-half code rate provides the same overall digital payload as DVB-T with possibly as good or even somewhat better performance in the presence of AWGN.

Repeating frames or time-slices of COFDM DTV transmissions a single time may even allow the number of lattice points in the QAM symbol constellation used in modulating the COFDM carrier waves to be increased by a factor of sixteen, quadrupling the number of data-slicing bins along each of the I-axis and Q-axis coordinates of each QAM symbol constellation. The smaller size of the data-slicing bins quadruples the ratio of AWGN to bin-size for a 12 dB loss of performance in the presence of AWGN. Combining similar transmissions can recover 3 DB or more of this loss in performance. The sixteen times increase in the number of lattice points secures eight times more overall digital payload than DVB-T has, even though some of this digital payload must be sacrificed to get as good performance in the presence of AWGN as DVB-T provides.

That is, surprisingly, the reduction in overall code rate that results from repeating COFDM transmissions for iterative-diversity reception can be counteracted by increasing the size of the symbol constellations associated with quadrature amplitude modulation (QAM) of the plural carriers. Increasing the size of the QAM symbol constellations tends to reduce the capability of DTV receivers to decode COFDM transmissions received over the air when accompanied by additive white Gaussian noise (AWGN). FEC coding of data bits is used to facilitate DTV receivers being better able to decode COFDM transmissions accompanied by AWGN. Various types of FEC coding are particularly effective for enabling DTV receivers to overcome AWGN by using iterative decoding procedures called "turbo decoding" because of a fancied resemblance to turbo-charging in automobile engines. The various types of FEC coding that can use turbo decoding procedures are collectively referred to as "turbo coding" in this specification, although the term was originally applied specifically to what is now called parallel concatenated convolutional coding (PCCC). By way of specific examples, turbo decoding procedures are also applicable to serial concatenated convolutional coding (SCCC), to product coding and to parallel concatenated low-density parity-check (LDPC) coding.

Turbo decoding allows QAM symbol constellations larger than 16QAM to be practical in wireless, over-the-air COFDM transmissions of wideband digital signals such as those employed in DTV broadcasting. Signal strength of the COFDM transmissions need not be so large to obtain a large coverage area. So, transmission towers need not be spaced as close together in a single-frequency network (SFN).

A typical receiver for COFDM plural-carrier signals includes an OFDM demodulator, a frequency-domain channel equalizer, and a symbol de-mapper of modulation symbol constellations for successively considered ones of the OFDM carriers. The OFDM demodulator recovers descriptions of the complex amplitude modulation of each carrier, which for digital television broadcasting is usually quadrature amplitude modulation (QAM). The frequency-domain channel equalizer normalizes the descriptions of the amplitudes of the in-phase and quadrature-phase components of each successively considered carrier. The symbol de-mapper converts each successive modulation symbol to a respective set of decision bits. These decision bits may be soft-decision bits, each composed of a hard-decision bit that is either a ONE or a ZERO and of further bits descriptive of the level of confidence that the hard-decision bit is correct.

The hard-decision bits in each successive set of decision bits are associated with one of a number of lattice points in a two-dimensional range of complex amplitude modulation, which number of lattice points define a constellation of ideal complex-amplitude-modulation possibilities. These lattice points correspond to the values of complex amplitude modulation that are transmitted by COFDM plural-carrier signals emanating from the broadcast television station. These lattice points are enumerated consecutively according to some prescribed pattern. Customarily, the number of lattice points in the two-dimensional range of complex amplitude modulation is an integral power of two, and the enumeration employs binary numbers descriptive of respective ones of all the different respective segments of binary coding that are possible.

A receiver for the COFDM plural-carrier signals is apt to recover values of complex amplitude modulation that depart in some degree from lattice points in the two-dimensional range of complex amplitude modulation, owing to imperfect reception. Ongoing departures are caused by Johnson noise arising in the atmosphere and in the receiver elements. Occasional departures are caused by burst noise, often generated by electrical equipment near the receiver. Some departure may arise from imperfect channel equalization filtering. Generally, the further bits of the soft-decision bits associated with the complex amplitude modulation actually received are determined by how far the position defined by that complex amplitude modulation departs from the boundaries of change in the hard-bit values associated with closest lattice point in the two-dimensional range of complex amplitude modulation.

The hard-decision bits in each successive set of decision bits with each lattice point in the two-dimensional range of complex amplitude modulation can be independent of the more significant bits of the in-phase coordinates and quadrature-phase coordinates of the two-dimensional QAM symbol constellation. This permits the commonplace prior-art practice of using Gray mapping of QAM constellations. Paragraphs 0053-0059 of Pat. App. US-2009/0323846-A1 published 13 Nov. 2003 for B. W. Kroeger and titled "Digital audio broadcasting method and apparatus using complementary pattern-mapped convolutional codes" analyzes the Gray mapping of QAM constellations in terms of bit-mapping of in-phase and quadrature-phase amplitude-shift-keying (ASK) components of the QAM symbol constellation. In this mapping procedure the set of decision bits associated with any lattice point differs by only a single bit from the set of decision bits associated with any one of the closest by lattice points in the QAM symbol constellation, so the ASK components exhibit the fewest transitions of bit values possible with any mapping. Kroeger notes in paragraph 0058 of Pat. App. US-2009/0323846-A1 that Gray coding is known to be beneficial upon detection of the ASK signals in noise, since the most likely bit estimation errors are made when the level is near a bit transition. Kroeger observes that the most significant bit of each ASK component exhibits only a single transition in bit value and each successively less significant bit of the ASK component exhibits twice as many transitions in bit value as its predecessor. So, the most significant bit of each ASK component is less susceptible of error than its least significant bit, with varying susceptibilities of error in its other bits. Accordingly, he advocates using the more significant bits of the ASK components for the more important bits of the coding mapped to the QAM symbol constellations and using the more significant bits of the ASK components for the less important bits of the coding mapped to the QAM symbol constellations.

Perfect Gray mapping is possible for a square QAM constellation having an even power of two lattice points therein. I. e., perfect Gray mapping is possible for 16QAM, 64QAM, 256QAM or 1024QAM constellations that are square. The inventor found that perfect Gray mapping cannot be obtained with cruciform QAM constellations having an odd-power-of-two lattice points therein. Conditions at the interior vertices of the cruciform constellation disrupt perfect Gray mapping. I. e., perfect Gray mapping cannot be obtained with cruciform constellations for 8QAM, 32QAM, 128QAM, 512QAM or 2048QAM. However, the inventor has determined that Gray mapping perfect except for double-bit changes between certain sets of decision bits is possible in 8QAM, 32QAM, 128QAM, 512QAM and 2048QAM. Consider the number of lattice points between change in each hard-decision bit within successive sets of decision bits sharing the same in-phase coordinates or the same quadrature-phase coordinates in a two-dimensional QAM symbol constellation. Such numbers vary from hard-decision bit to hard-decision bit within each set of decision bits. The variation in this number for each hard-decision bit exhibits a well-defined pattern if perfect or almost perfect Gray mapping is used.

SUMMARY OF THE INVENTION

The invention is based upon matching this pattern to the particular form of turbo coding of data bits that is used before mapping the FEC coding results to QAM symbol constellations. Iterative decoding in a receiver of QAM symbol constellations transmitted via COFDM plural carrier waves adjusts data bits from the QAM constellations best to conform to parity bits from the QAM constellations. These adjustments are made with the goal of maximizing overall the confidence levels of the bits in estimates that the receiver generates as to the FEC coding actually transmitted. These procedures are facilitated by proper placement of the parity bits of the FEC coding within the sets of information bits associated with respective lattice points in each QAM symbol constellation. The parity bits, which are not adjusted during iterative decoding procedures, are placed within each set of information bits in the bit places more likely to have high confidence levels associated with them. The data bits, which are adjusted during iterative decoding procedures, are placed within each set of information bits in the bit places less likely to have high confidence levels associated with them. The optimal placements of data bits respective to parity bits in the QAM symbol constellations larger than those of 16QAM are of especial interest. This is because turbo decoding makes such larger QAM symbol constellations practical for wireless, over-the-air COFDM broadcasting of DTV signals.

An aspect of the invention is transmitter apparatus for transmitting QAM symbol constellations via COFDM carrier waves, which QAM symbol constellations map FEC coding as described in the paragraph just previous. Another aspect of the invention is receiver apparatus for de-mapping QAM symbol constellations transmitted via COFDM carrier waves.

By way of illustration, aspects of the invention are described infra as they relate to novel DTV transmitter apparatus that uses COFDM of a plurality of carrier waves, successive time-slices of data from each of a number of separate services are twice transmitted, with the later transmission of each time-slice being delayed a prescribed interval some seconds long after the earlier transmission of that time-slice. Coded initial descriptions of data are intermittently transmitted in a first set of time-slices. Coded subsequent descriptions of the same data are intermittently transmitted after the prescribed delay interval in a second set of time-slices that are time-division multiplexed with the first set of time-slices. Forward-error-correction (FEC) coding of each time-slice is independent of the FEC coding of all other time-slices. Block and convolutional interleaving of bytes, partial bytes, and individual bits within each time-slice do not extend outside that time-slice. The plurality of COFDM carrier waves used for transmission of each time-slice are accompanied by unmodulated carrier waves that a DTV receiver can determine the total RMS energy of, for use in maximal-ratio code combining of the later and delayed earlier transmissions of that time-slice.

Further aspects of the invention are described infra which relate to one sort of novel DTV receivers for iterative-diversity reception of COFDM carrier waves. In such a receiver the coordinates of modulation constellations that are intermittently transmitted in a first set of time-slices are delayed, so as to be concurrently available with the coordinates of similar modulation constellations that are intermittently transmitted in a second set of time-slices. The coordinates are complex in form, having imaginary as well as real components. De-mapping is performed after a maximal-ratio combining procedure combines the delayed complex coordinates of modulation constellations transmitted in the first set of time-slices with the corresponding complex coordinates of modulation constellations transmitted in the second set of time-slices. De-mapping of the modulation constellations from the maximal-ratio combining procedure generates soft bits used in subsequent decoding procedures, which soft bits are less susceptible to interruption caused by losses in received signal strength. During the maximal-ratio combining procedure, the weighting of the coordinates of modulation constellations in the first set of time-slices is determined by measuring the total RMS energy of unmodulated pilot carrier waves among the COFDM carrier waves, including ones modulated for conveying those coordinates in the first set of time-slices. These measurements are delayed for being supplied for use in the maximal-ratio combining procedure concurrently with complex coordinates of modulation constellations in the second set of time-slices being supplied for maximal-ratio combining. During the combining procedure, the weighting of the coordinates of modulation constellations in the second set of time-slices is determined by measuring the total RMS energy of unmodulated pilot carrier waves among the COFDM carrier waves, including ones modulated for conveying those coded bits in the second set of time-slices. These latter measurements are supplied concurrently with coordinates of modulation constellations in the second set of time-slices, to be used in the maximal-ratio combining procedure.

Yet further aspects of the invention are described infra which relate to another sort of novel DTV receivers for iterative-diversity reception of COFDM carrier waves. In such a receiver coded initial descriptions of real-only data that are intermittently transmitted in a first set of time-slices are delayed, so as to be contemporaneously available with the coded subsequent descriptions of the same real-only data that are intermittently transmitted in a second set of time-slices. Decoding procedures are performed after a preceding procedure in which a maximal-ratio code combiner combines soft bits extracted from the delayed first set of time-slices with corresponding soft bits extracted from the second set of time-slices. This preceding procedure generates the soft bits used in the subsequent decoding procedures, which soft bits are less susceptible to interruption caused by losses in received signal strength. During the code-combining procedure, the weighting of coded bits in the first set of time-slices is determined by measuring the total RMS energy of unmodulated pilot carrier waves among the COFDM carrier waves that include carrier waves modulated for conveying those coded bits in the first set of time-slices. These measurements are delayed for being supplied to the maximal-ratio code combiner concurrently with the second set of time-slices being supplied to the code combiner. During the code-combining procedure, the weighting of coded bits in the second set of time-slices is determined by measuring the total RMS energy of unmodulated pilot carrier waves among the COFDM carrier waves including carrier waves modulated for conveying those coded bits in the second set of time-slices. These latter measurements are also supplied to the maximal-ratio code combiner concurrently with the second set of time-slices being supplied to the code combiner.

BRIEF DESCRIPTION OF THE DRAWING FIGURES

FIGS. 1 and 2 together provide a schematic diagram of a portion of a COFDM transmitter for a DTV system, which transmitter is capable of transmitting turbo-coded data packets twice, at times separated by a second or more, for iterative-diversity reception by stationary DTV receivers.

FIGS. 3 and 4 together provide a schematic diagram of a further portion of the COFDM transmitter for a DTV system, which transmitter is capable of transmitting FEC-coded data packets twice, at times separated by a second or more, for iterative-diversity reception by M/H DTV receivers.

FIG. 9 is a representative 64QAM symbol constellation map that the constellation mapper in the FIG. 2 portion of a COFDM transmitter uses for conveying one-third-rate bit-wise forward-error-correction coding.

FIGS. 10A, 10B, 10C, 10D, 10E and 10F are diagrams showing patterns of the first, second, third, fourth, fifth and sixth bits within the 64QAM symbol constellation map of FIG. 9.

FIG. 11 is a diagram showing the nature of the information in the six bits of one-third-rate turbo coding associated with each of the 64 lattice points in the 64QAM symbol constellation shown in FIG. 9.

FIGS. 12A, 12B, 12C and 12D illustrate the four quadrants of a representative 512QAM symbol constellation map that the constellation mapper in the FIG. 4 portion of a COFDM transmitter uses for conveying one-third-rate bit-wise forward-error-correction coding.

FIGS. 14A, 14B, 14C and 14D are diagrams showing the mapping of first, second, fourth and fifth bits in 9-bit sequences of one-third-rate turbo coding in various arrays of sixteen lattice points within the complete 512QAM symbol constellation.

FIGS. 15A, 15B, 15C, 15D, 15E, 15F, 15G, 15H and 15I are diagrams showing patterns of the first, second, third, fourth, fifth, sixth, seventh, eighth and ninth bits within the 512QAM symbol constellation.

FIG. 16 is a diagram showing the nature of the information in the nine bits of one-third-rate turbo coding associated with each of the 512 lattice points in the 512QAM symbol constellation shown in 12A, 12B, 12C and 12D.

FIG. 17 is a diagram showing the nature of the information in the nine bits of two-thirds-rate punctured one-half-rate bit-wise FEC coding associated with each of 512 lattice points in a 512QAM symbol constellation mapping bits differently from the 512QAM symbol constellation shown in FIGS. 12A, 12B, 12C and 12D.

Figure 1:
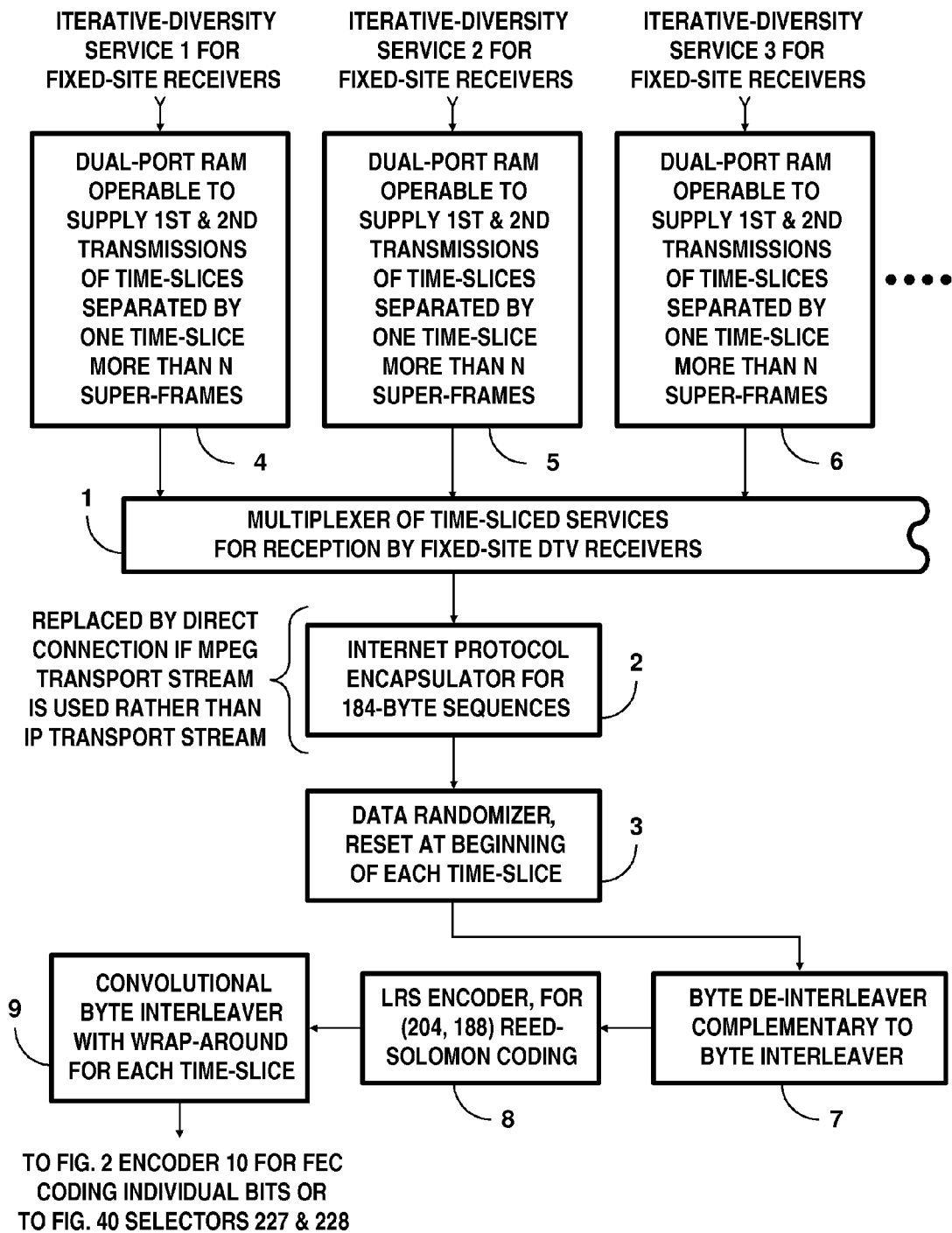
Figure 2:
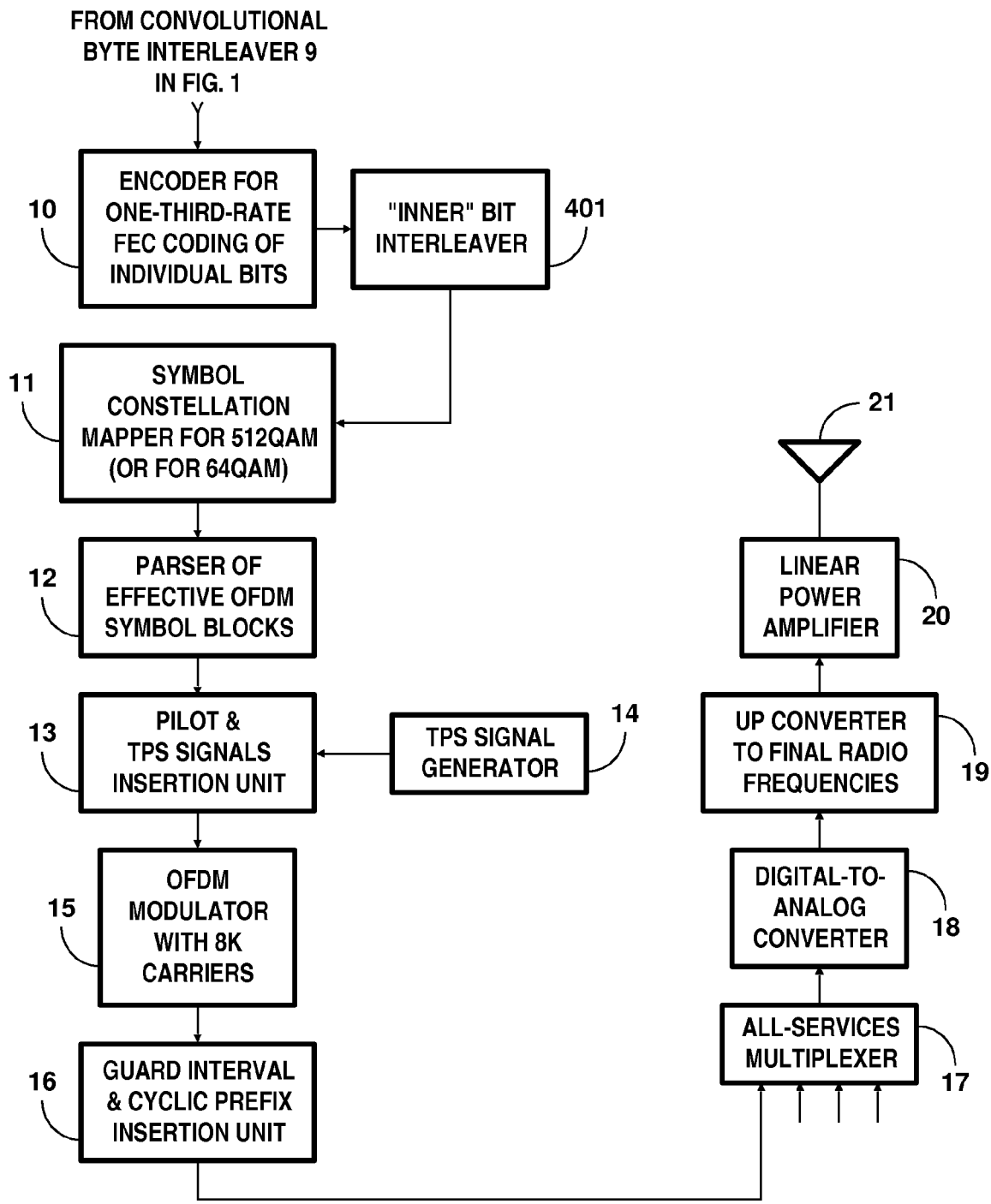
Figure 18:
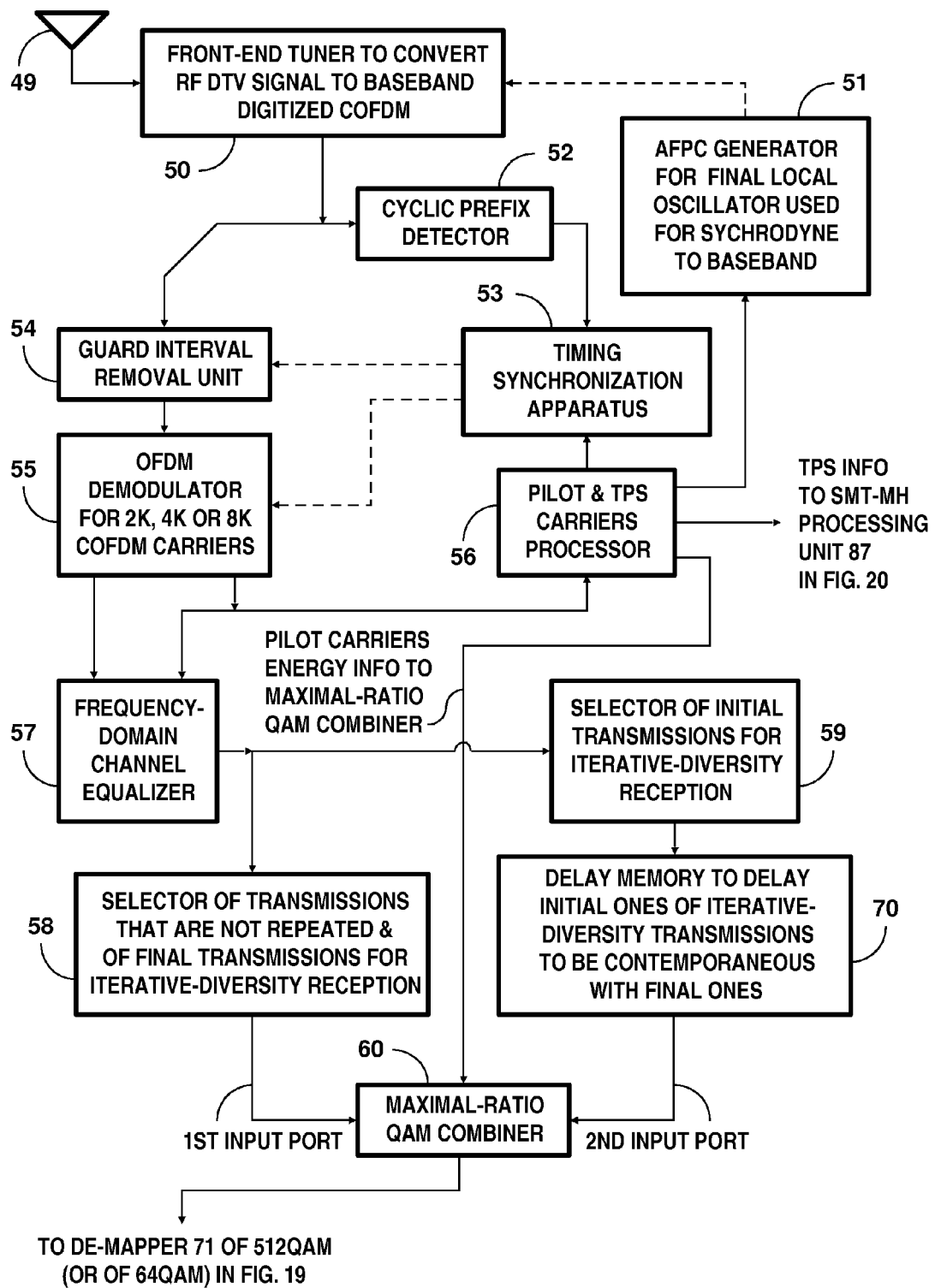
Figure 19:
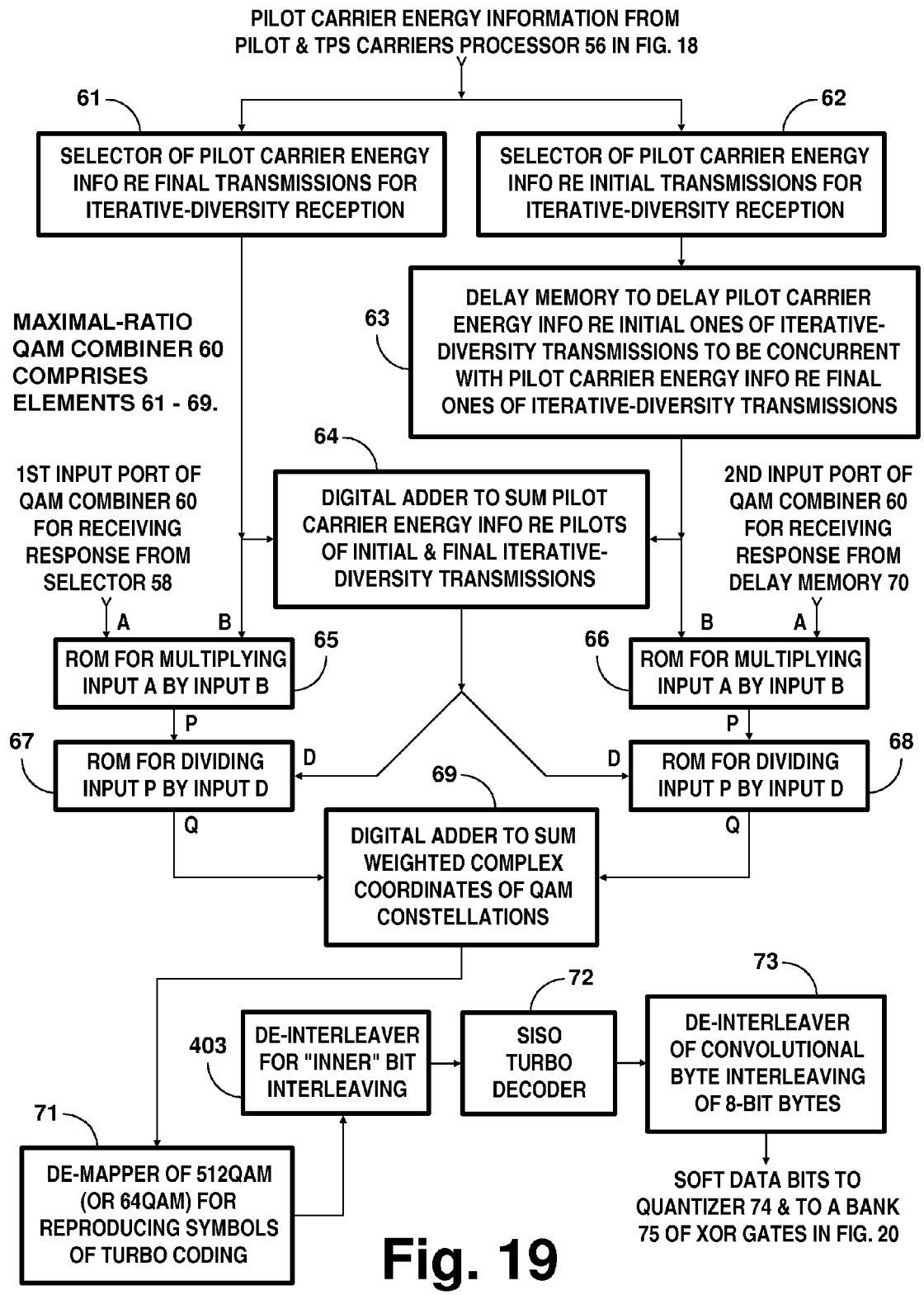
Figure 20:
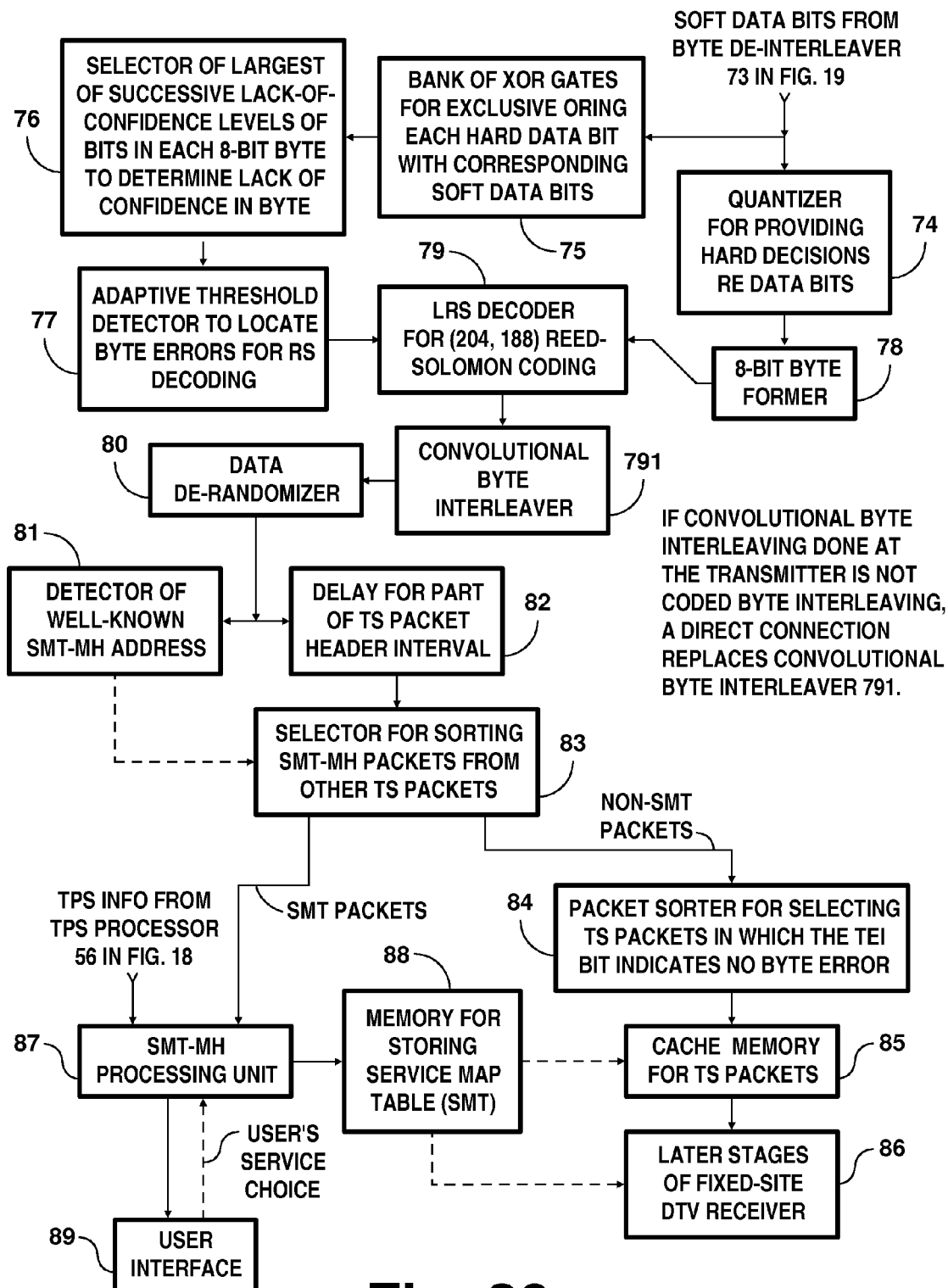

FIGS. 18, 19 and 20 combine to provide a generic schematic diagram of a DTV receiver adapted for stationary iterative-diversity reception of COFDM signals as transmitted by the portions of the DTV transmitter depicted in FIGS. 1 and 2, which DTV receiver is novel and embodies aspects of the invention.

Figure 21:
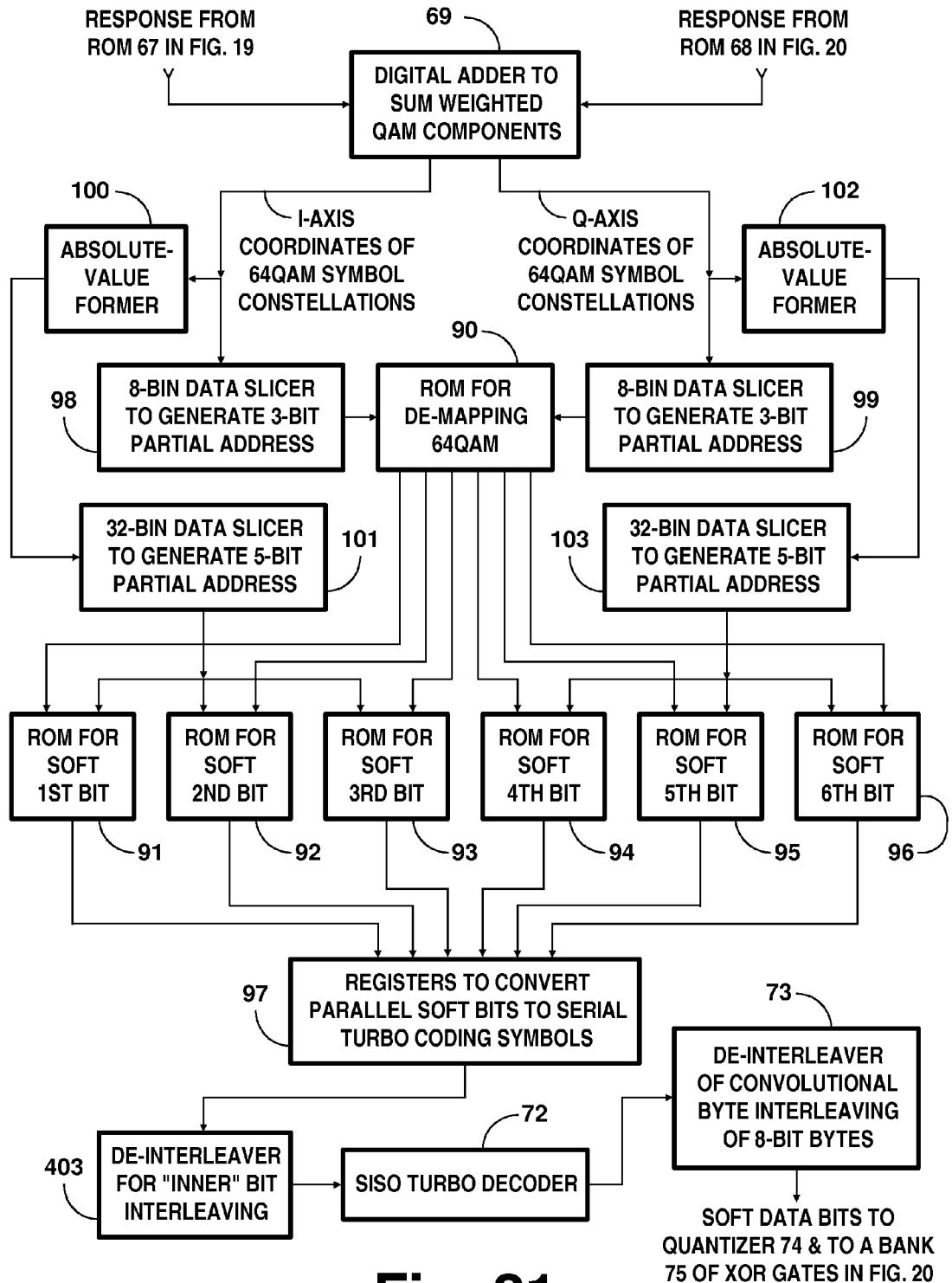
Figure 24:
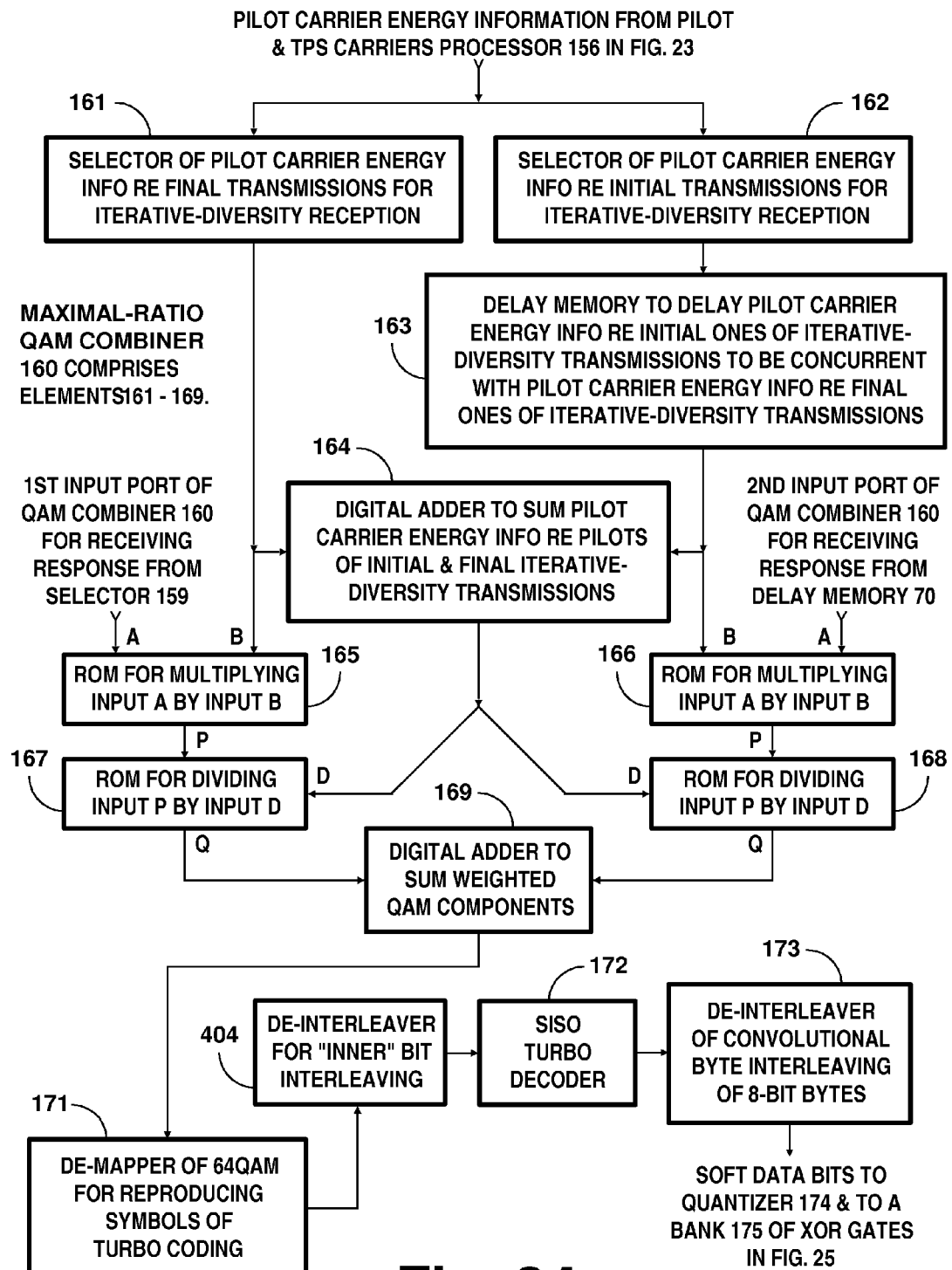
Figure 30:
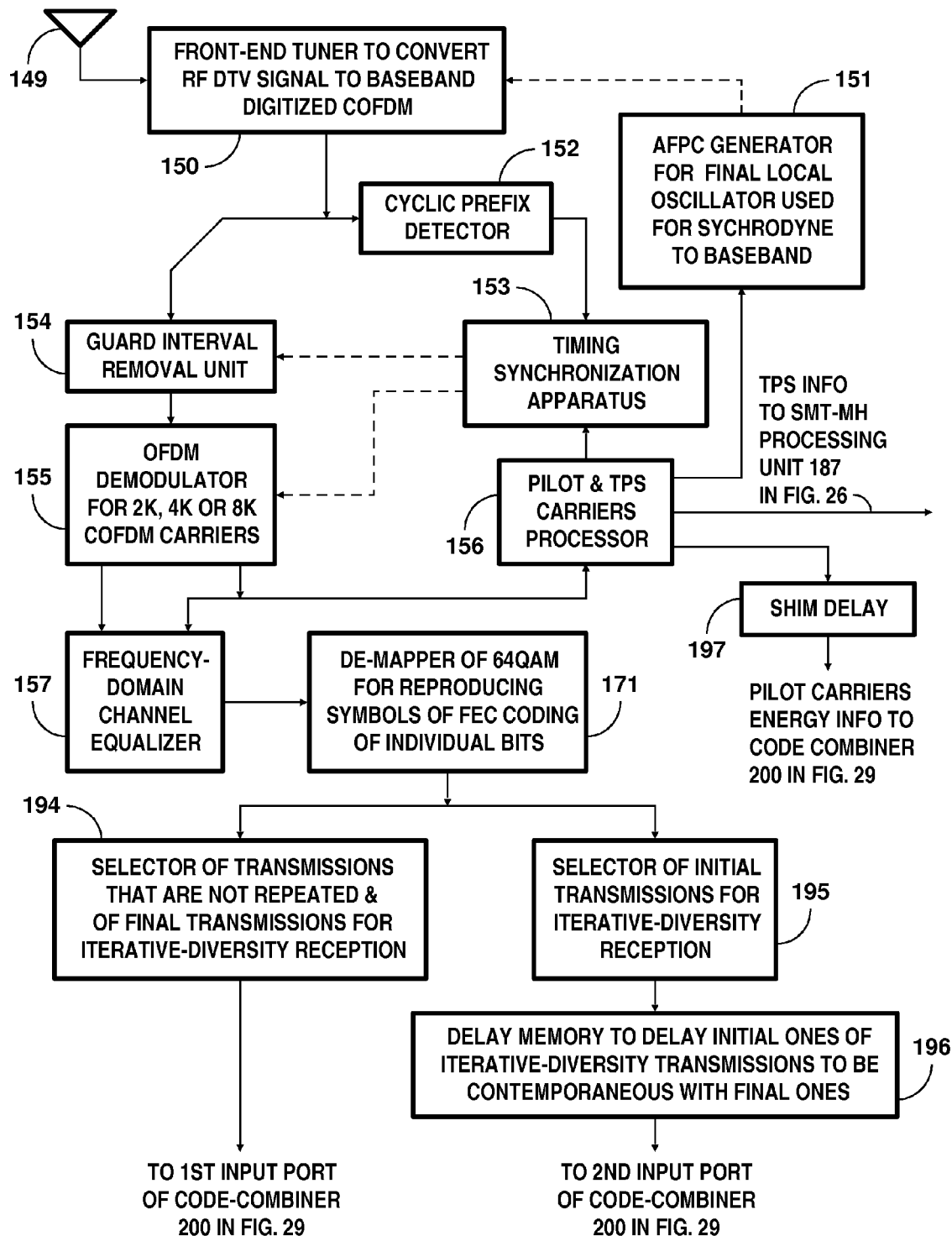
Figure 32:
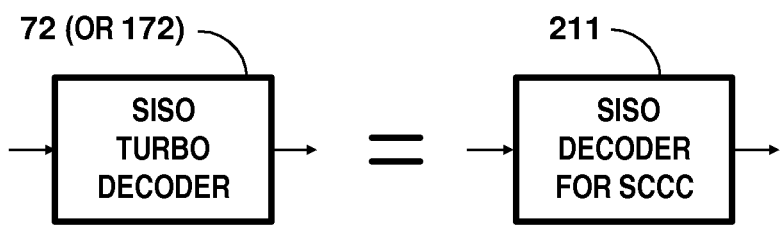

FIG. 21 is a detailed schematic diagram of a representative de-mapper of square 64QAM symbol constellations that recovers soft bits of successive symbols of turbo decoding in a portion of a DTV receiver as shown in FIG. 19, in FIG. 24, in FIG. 30 or in FIG. 32.

Figure 22:
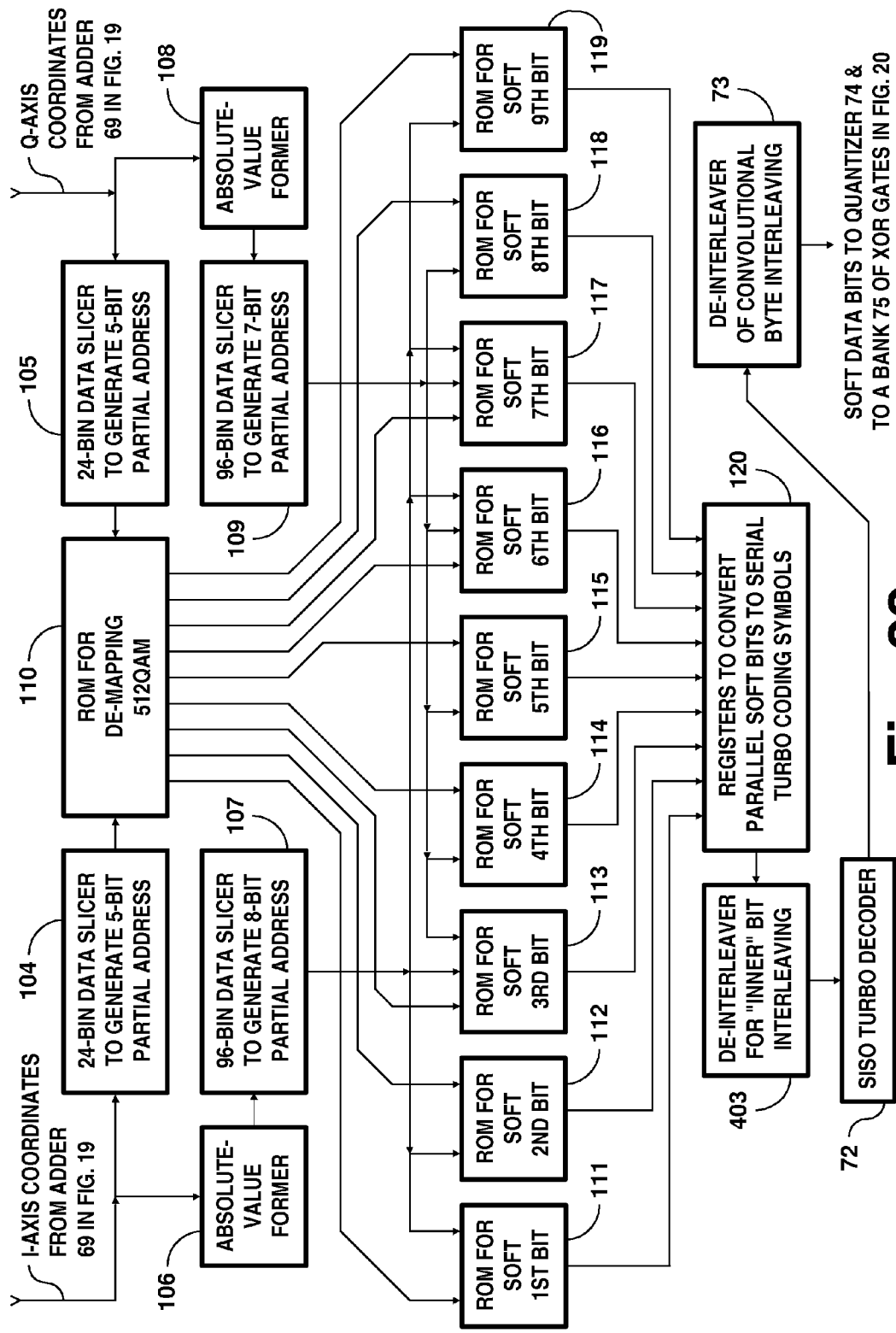

FIG. 22 is a detailed schematic diagram of a representative de-mapper of cruciform 512QAM symbol constellations that recovers soft bits of successive symbols of turbo decoding in a portion of a stationary DTV receiver as shown in FIG. 19 or in FIG. 30.

Figure 3:
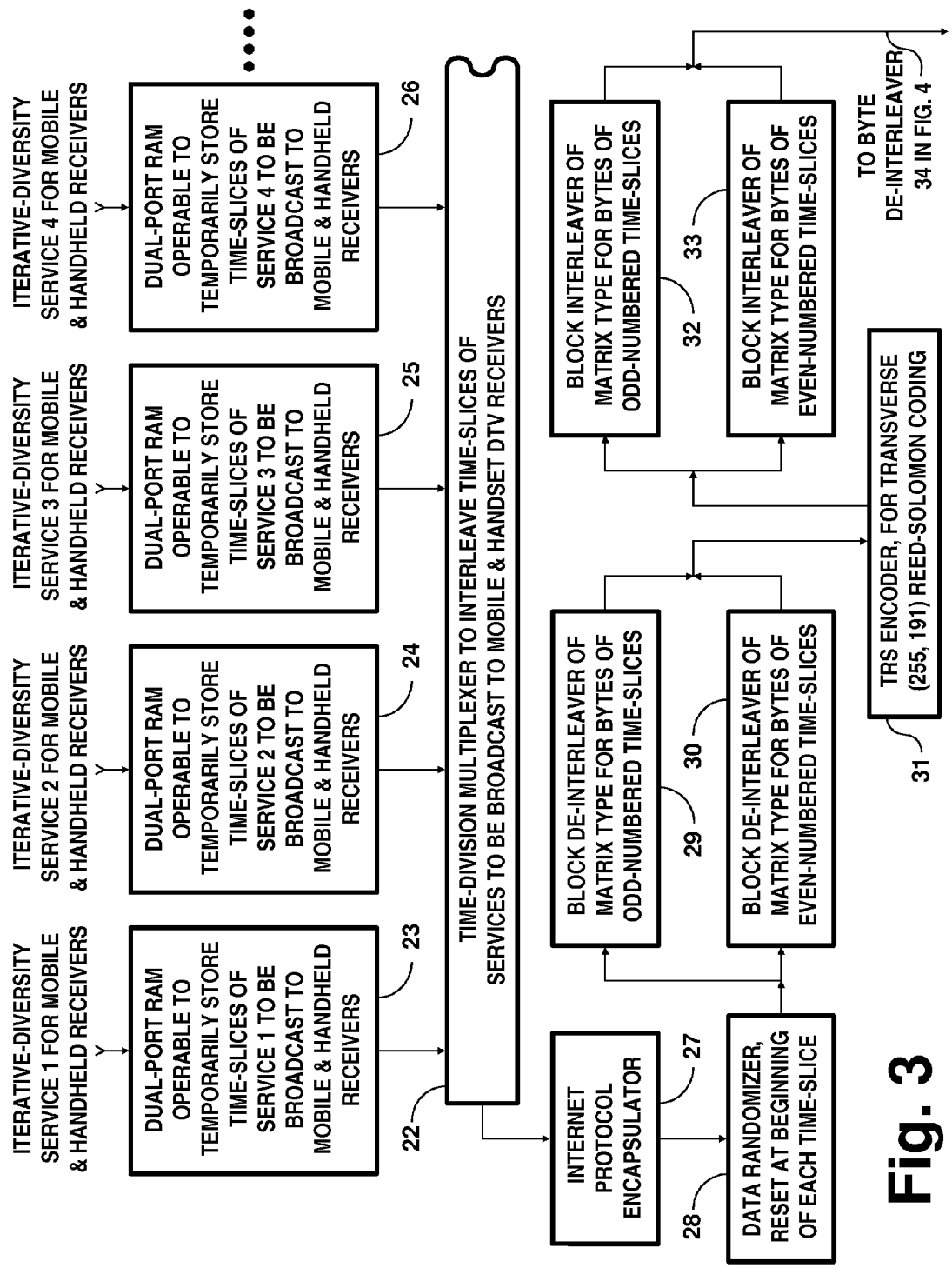
Figure 4:
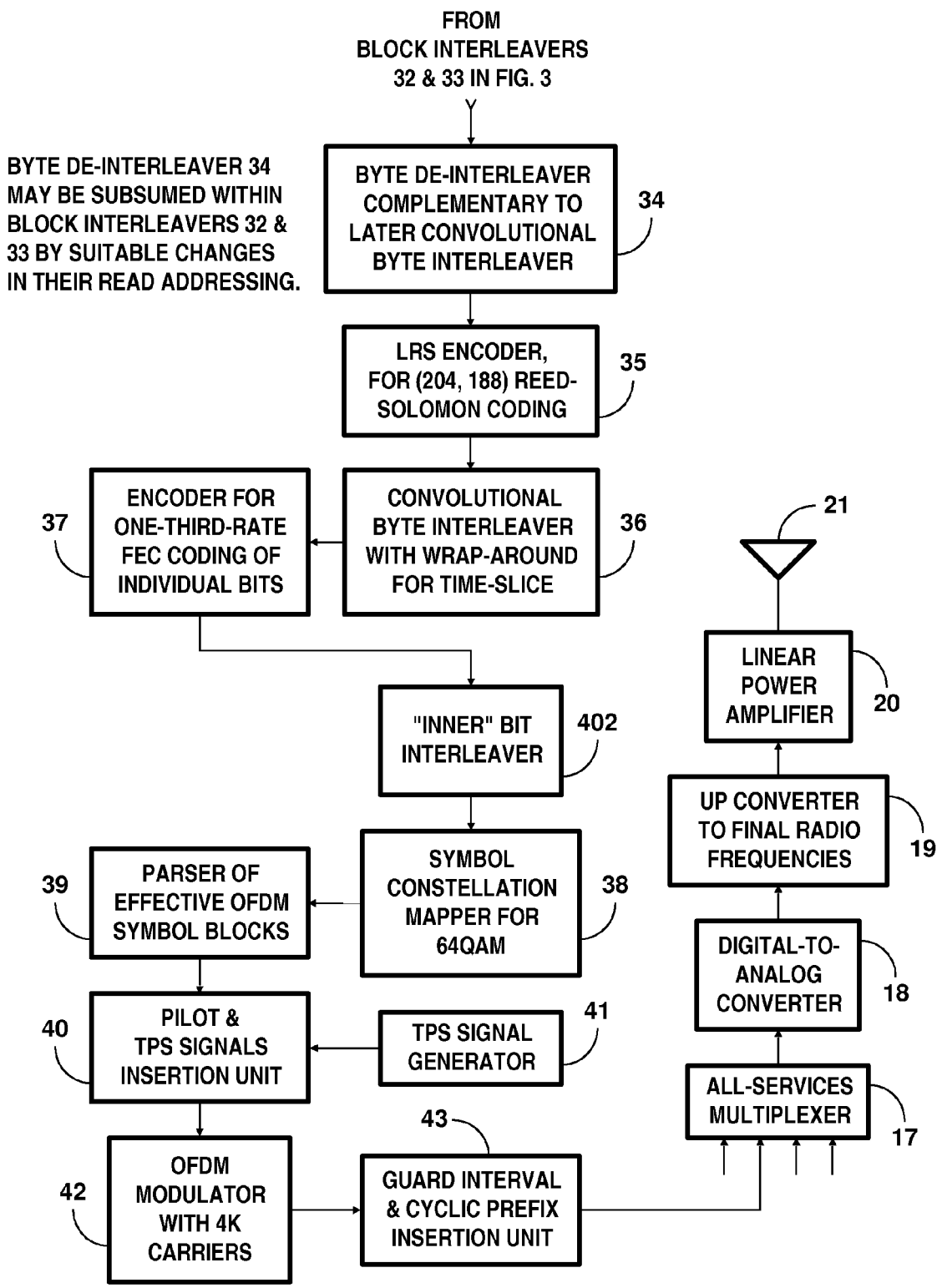

FIGS. 23, 24, 25 and 26 combine to provide a generic schematic diagram of an M/H DTV receiver adapted for iterative-diversity reception of COFDM signals as transmitted by the portions of the DTV transmitter depicted in FIGS. 3 and 4, which M/H DTV receiver is novel and embodies aspects of the invention.

Figure 25:
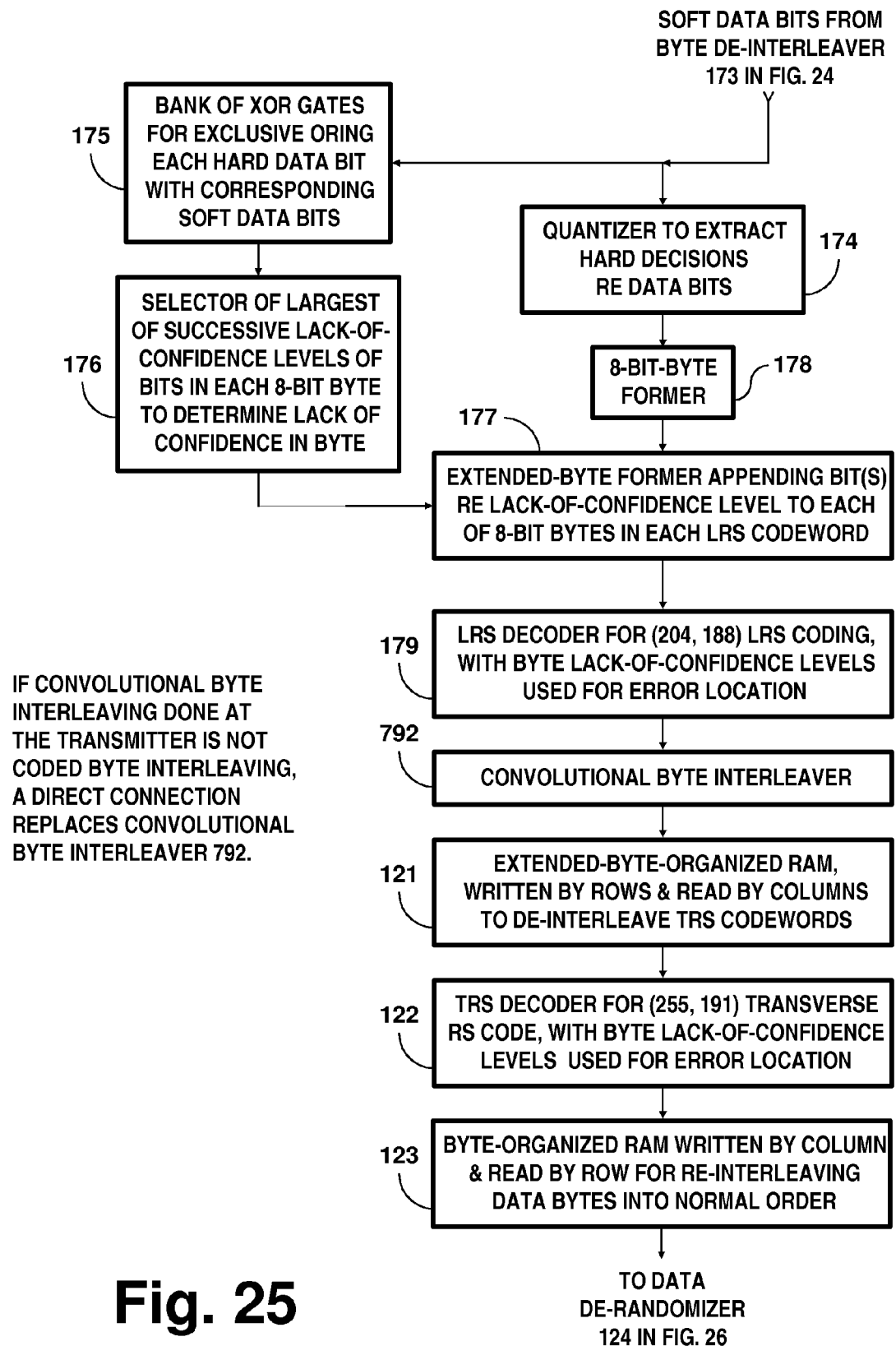
Figure 27:
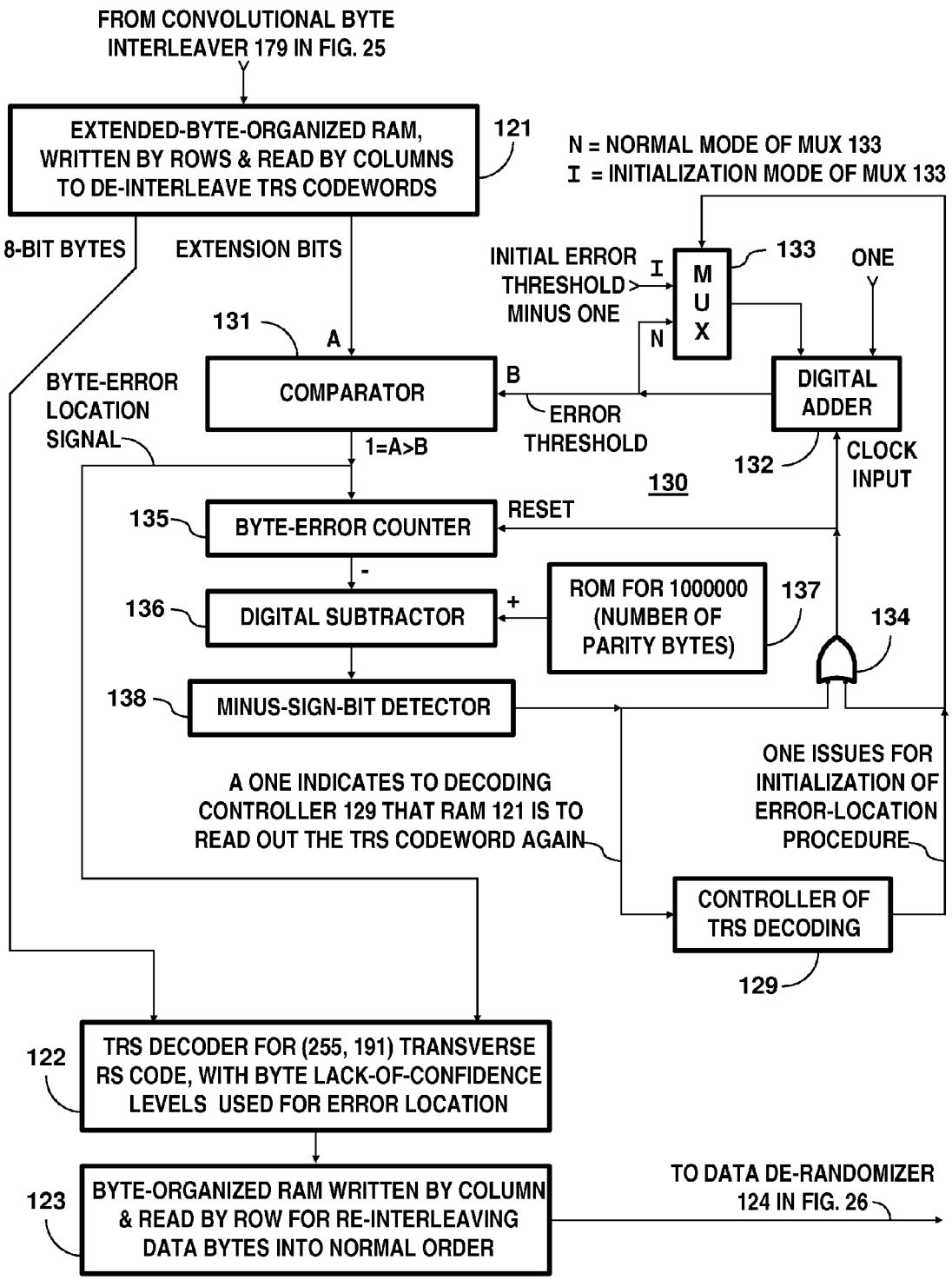

FIG. 27 is a schematic diagram of a portion of the circuitry shown in FIG. 25 showing in more detail how the decoder for (255, 191) Reed-Solomon coding of FEC frames is provided with indications of byte errors.

Figure 28:
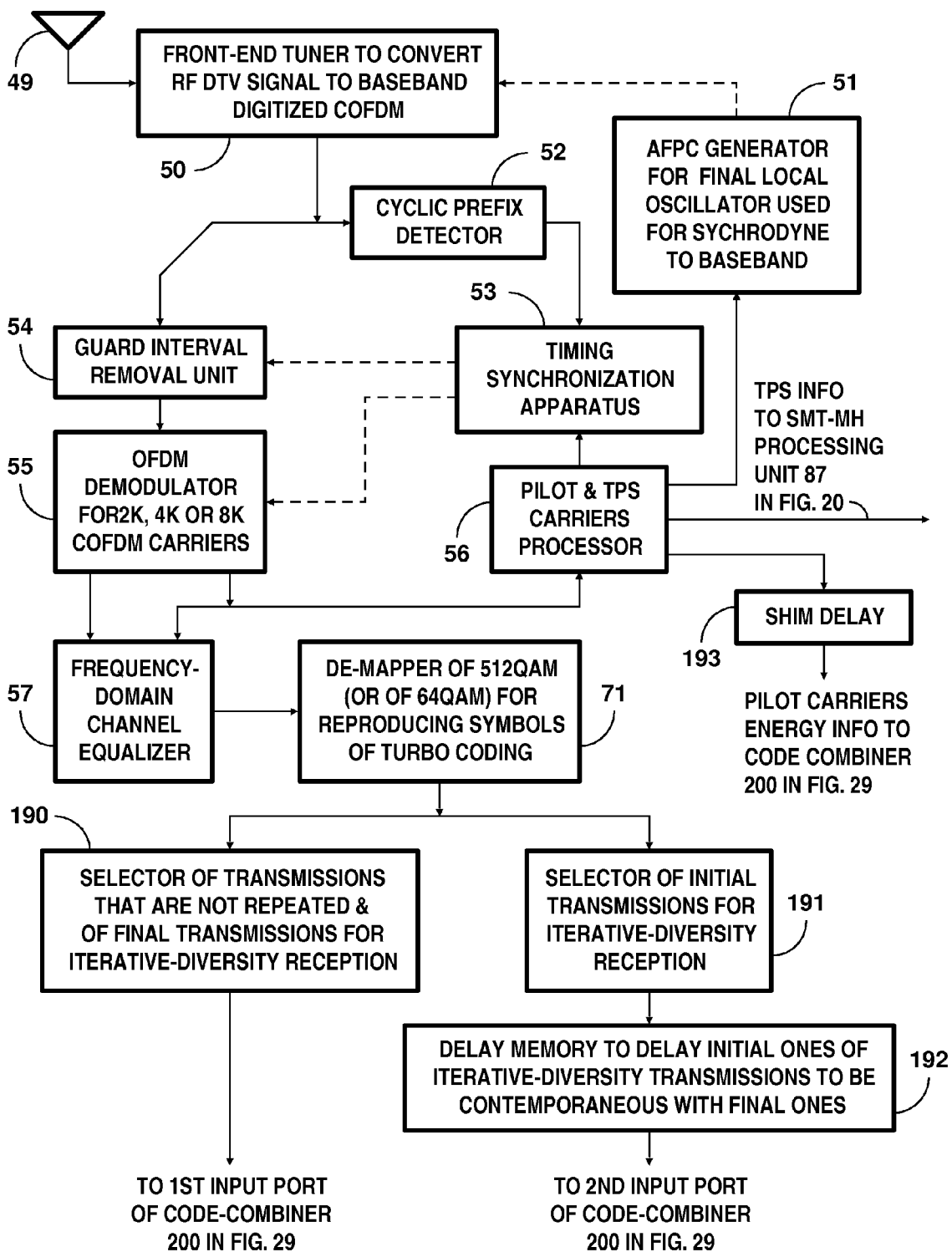
Figure 29:
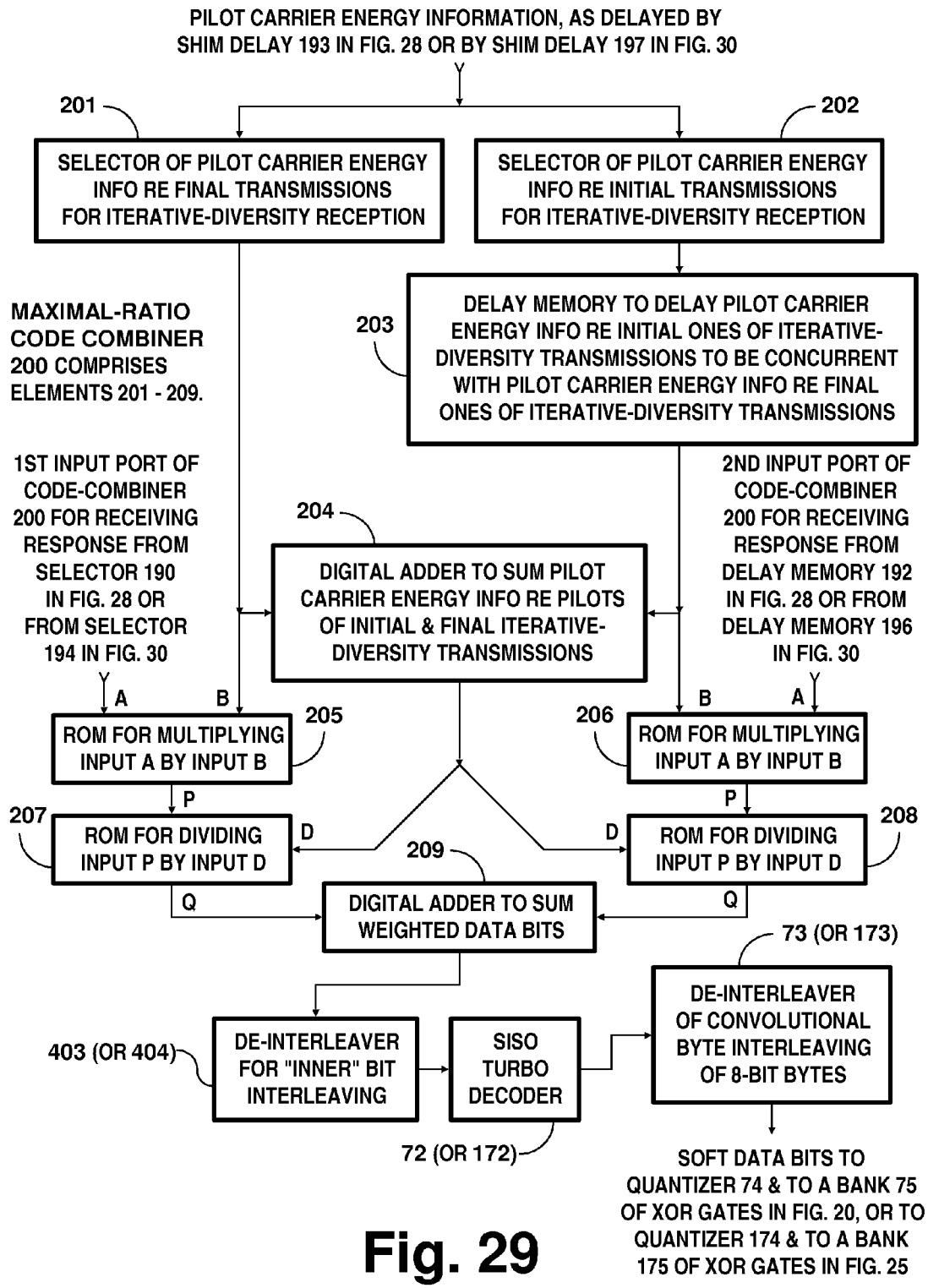

FIGS. 28 and 29 are modifications of FIGS. 18 and 19 that combine with FIG. 20 to provide a generic schematic diagram of a DTV receiver adapted for stationary iterative-diversity reception of COFDM signals as transmitted by the portions of the DTV transmitter as depicted in FIGS. 1 and 2, which modified DTV receiver is novel and embodies aspects of the invention.

Figure 23:
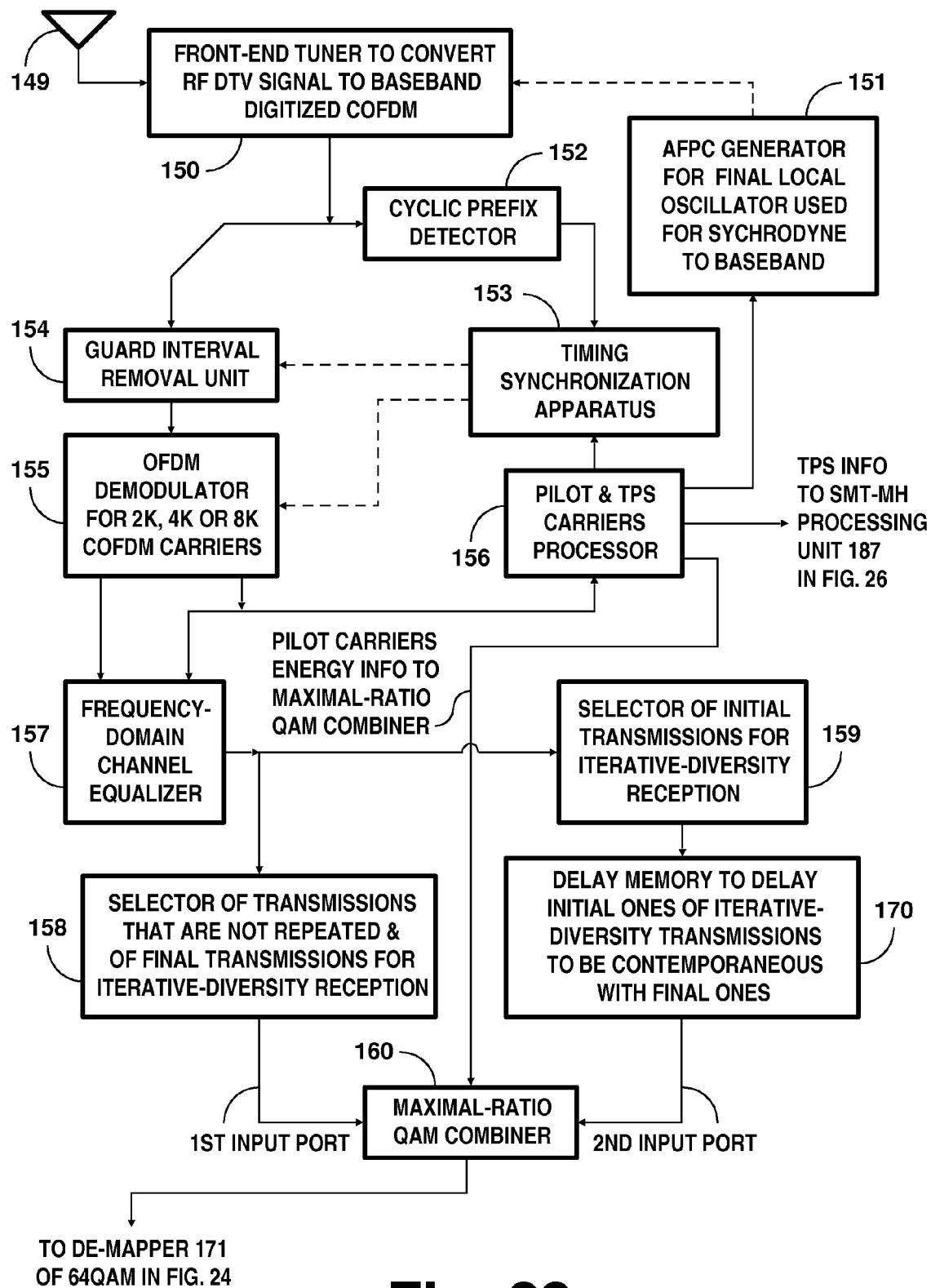
Figure 26:
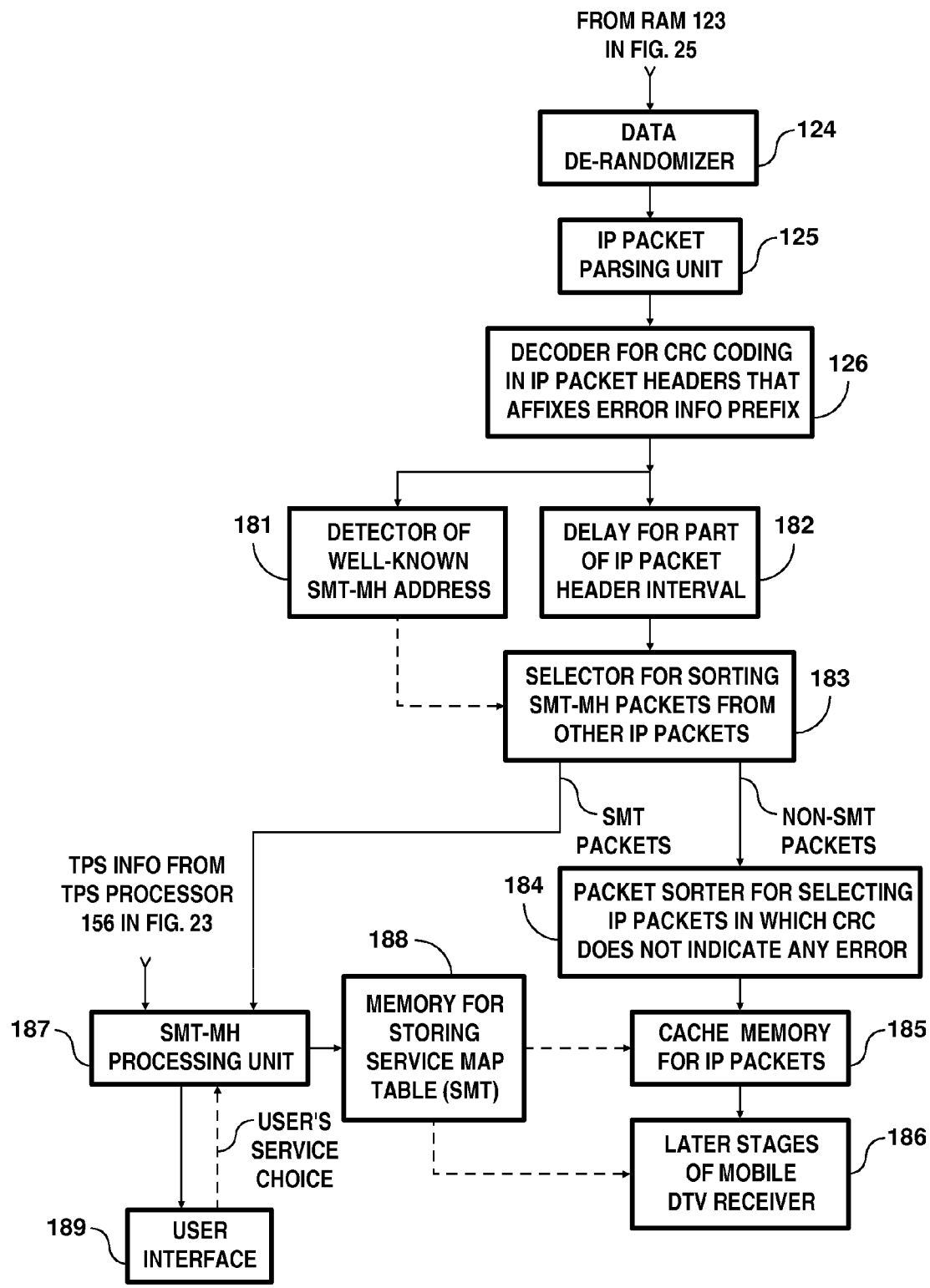

FIG. 30 is a modification of FIG. 23 that combines with FIGS. 29, 25 and 26 to provide a generic schematic diagram of an M/H DTV receiver adapted for iterative-diversity reception of COFDM signals as transmitted by the portions of the DTV transmitter depicted in FIGS. 3 and 4, which M/H DTV receiver is novel and embodies aspects of the invention.

FIGS. 31, 32, 33 and 34 illustrate decoders for various species of turbo coding, any one of which sorts of decoders can be used in the FIGS. 19, 24 and 29 portions of COFDM receivers for a DTV system embodying aspects of the invention.

Figure 35:
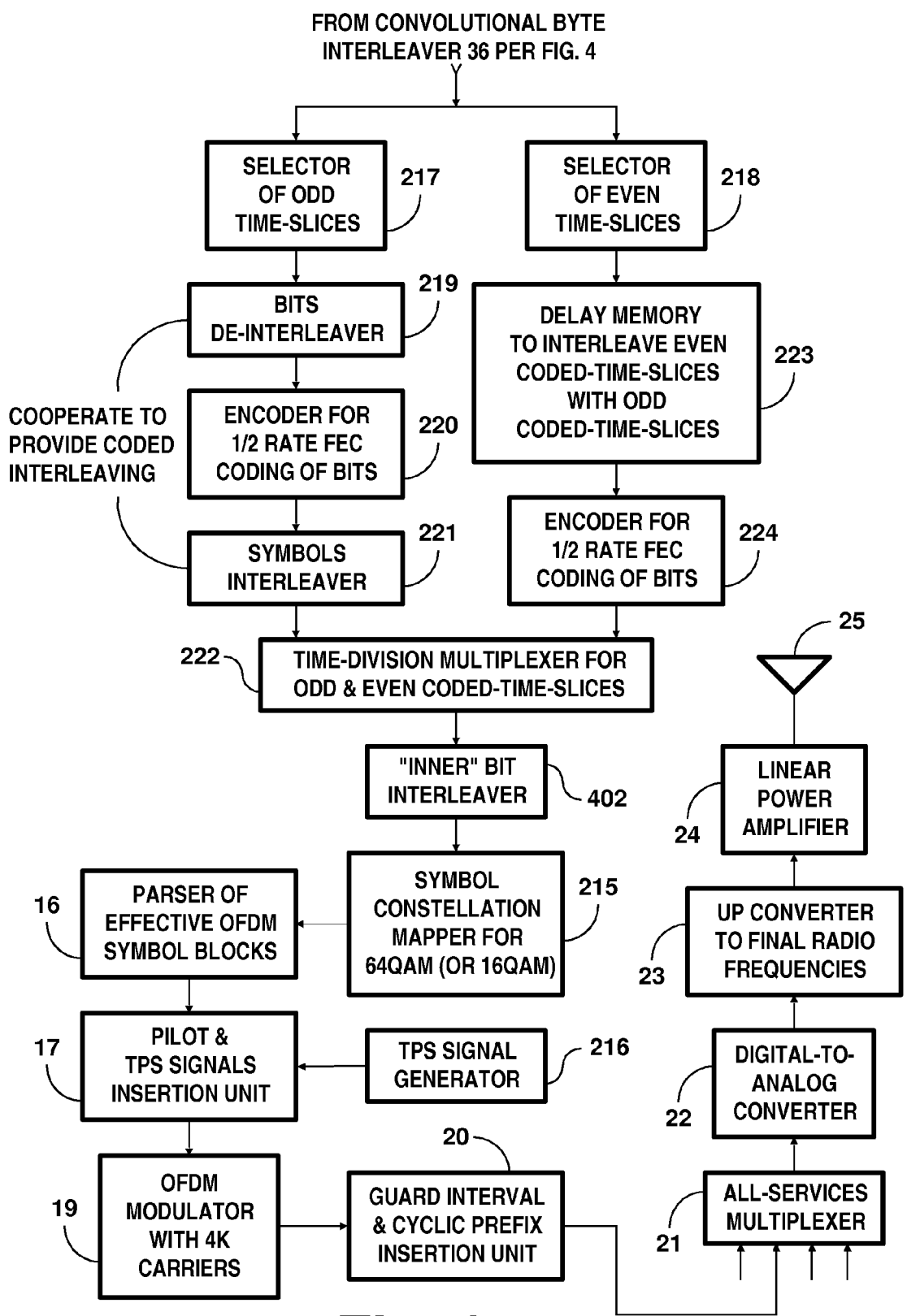

FIG. 35 is a schematic diagram of a modification of the FIG. 4 portion of a COFDM transmitter for a DTV system, which transmitter as so modified transmits different portions of turbo-coded data packets at times separated by a second or more, for iterative-diversity reception by M/H DTV receivers.

FIG. 36 is a representative 64QAM symbol constellation map that the constellation mapper in the FIG. 35 portion of a COFDM transmitter uses for conveying one-half-rate bit-wise forward-error-correction coding.

FIGS. 37A, 37B, 37C, 37D, 37E and 37F are diagrams showing patterns of the first, second, third, fourth, fifth and sixth bits within the 64QAM symbol constellation map of FIG. 36.

Figures 37A, 37B, 37C, 37D, 37E, 37F, 38:
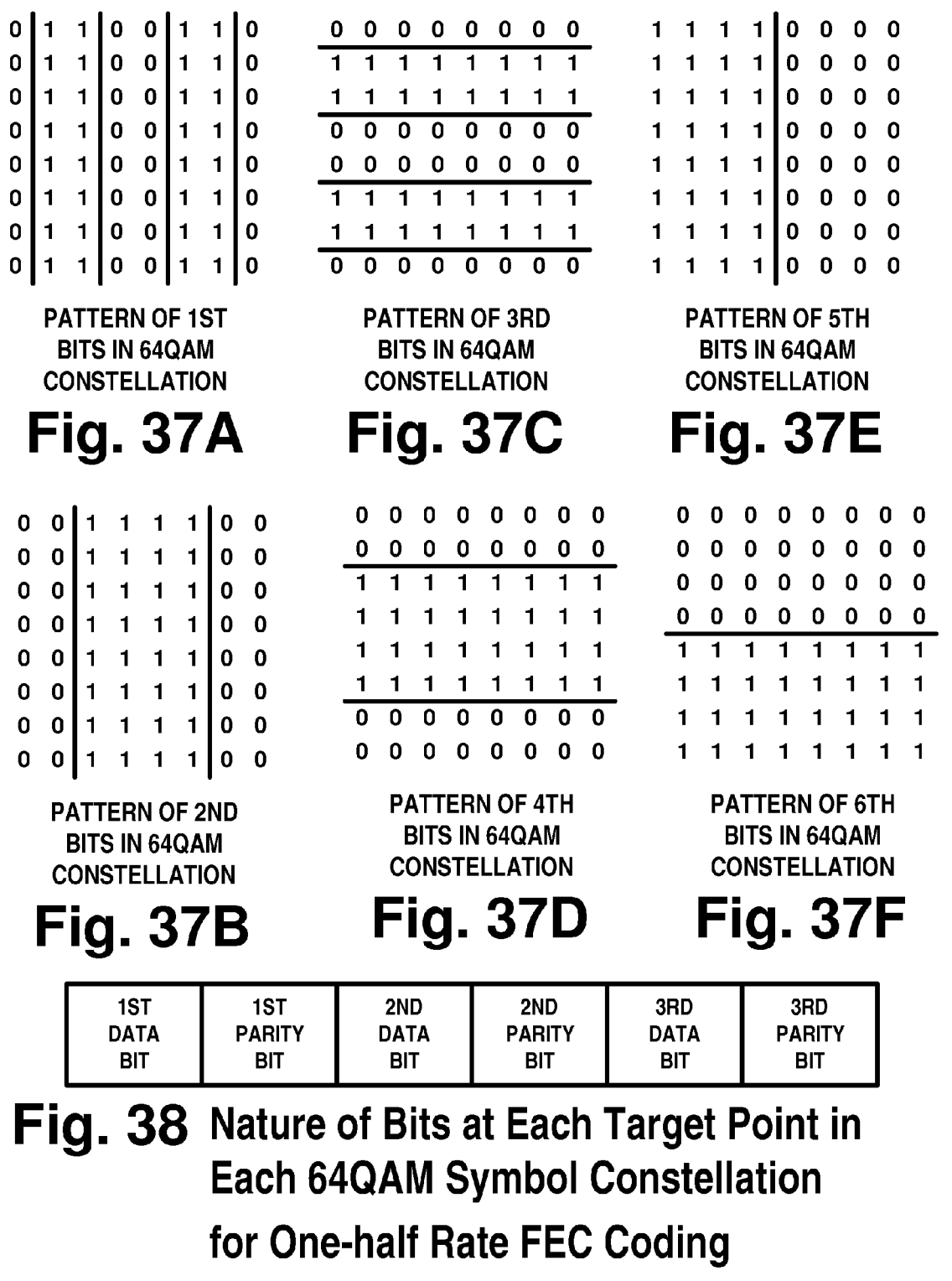

FIG. 38 is a diagram showing the nature of the information in the six bits of one-half-rate turbo coding associated with each of the 64 lattice points in the 64QAM symbol constellation shown in FIG. 9.

Figure 39:
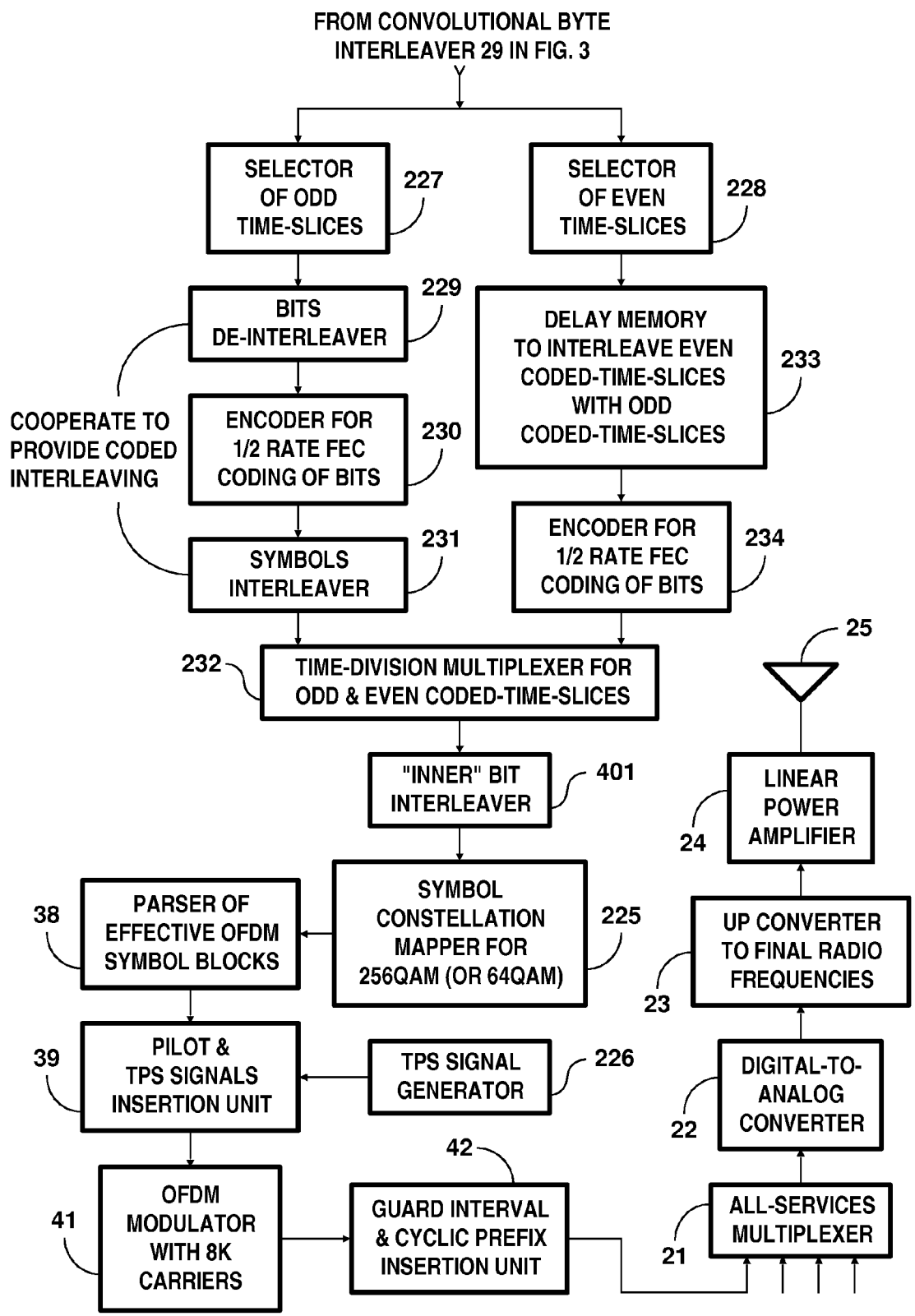

FIG. 39 is a schematic diagram of a modification of the FIG. 2 portion of a COFDM transmitter for a DTV system, which transmitter as so modified transmits different portions of turbo-coded data packets at times separated by a second or more, for iterative-diversity reception by stationary DTV receivers.

FIGS. 40A, 40B, 40C and 40D illustrate the four quadrants of a representative 256QAM symbol constellation map that the constellation mapper in the FIG. 39 portion of a COFDM transmitter uses for conveying one-half-rate bit-wise forward-error-correction coding FIGS. 41A, 41B, 41C, 41D, 41E, 41F, 41G and 41H are diagrams showing patterns of the first, second, third, fourth, fifth, sixth, seventh and eighth bits within the 256QAM symbol constellation.

FIG. 42 is a diagram showing the nature of the information in the eight bits of one-half-rate turbo coding associated with each of the 256 lattice points in the 256QAM symbol constellation shown in FIGS. 40A, 40B, 40C and 40D.

Figure 43:
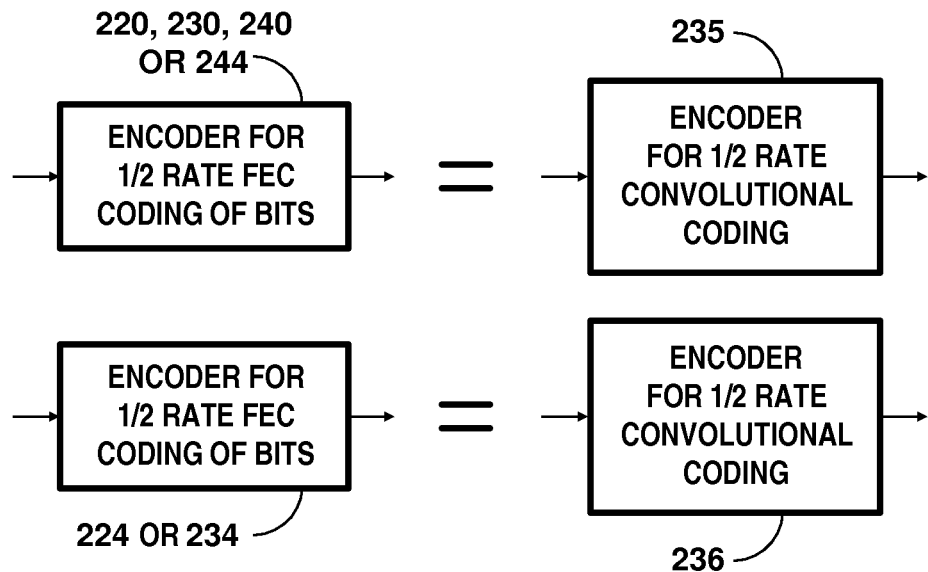
Figure 44:
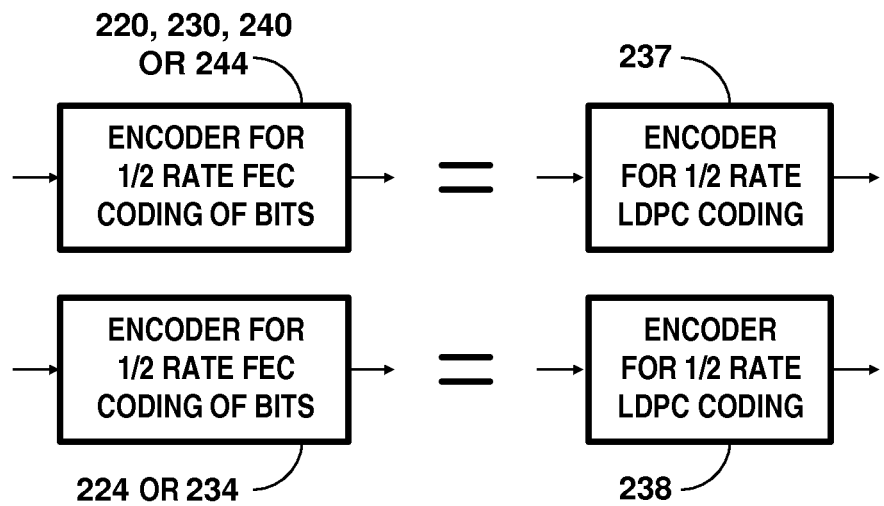

FIGS. 43 and 44 illustrate encoders for two species of turbo coding, either of which sorts of encoders can be used in the FIG. 35 and FIG. 39 portions of a COFDM transmitter for a DTV system embodying aspects of the invention.

Figure 45:
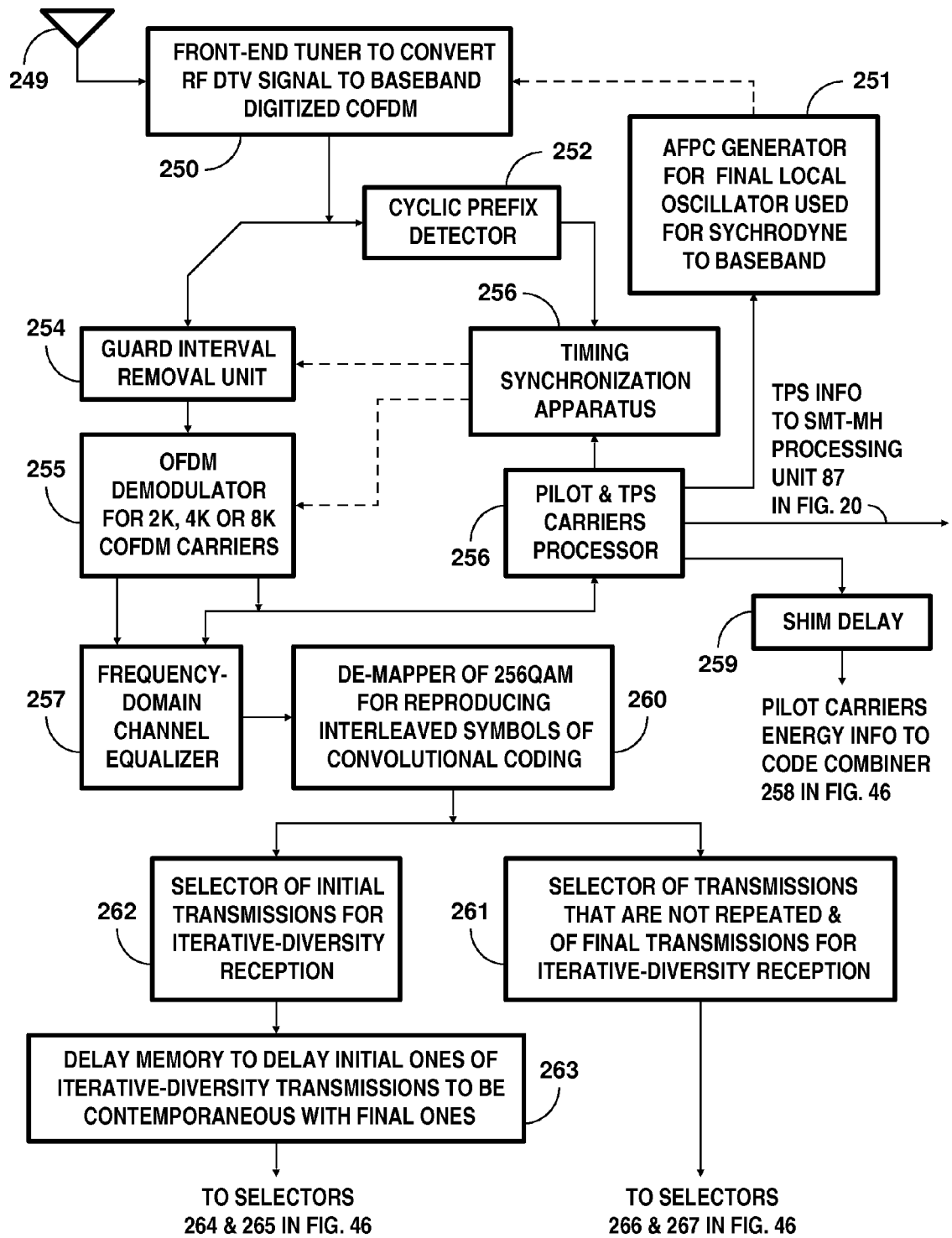
Figure 46:
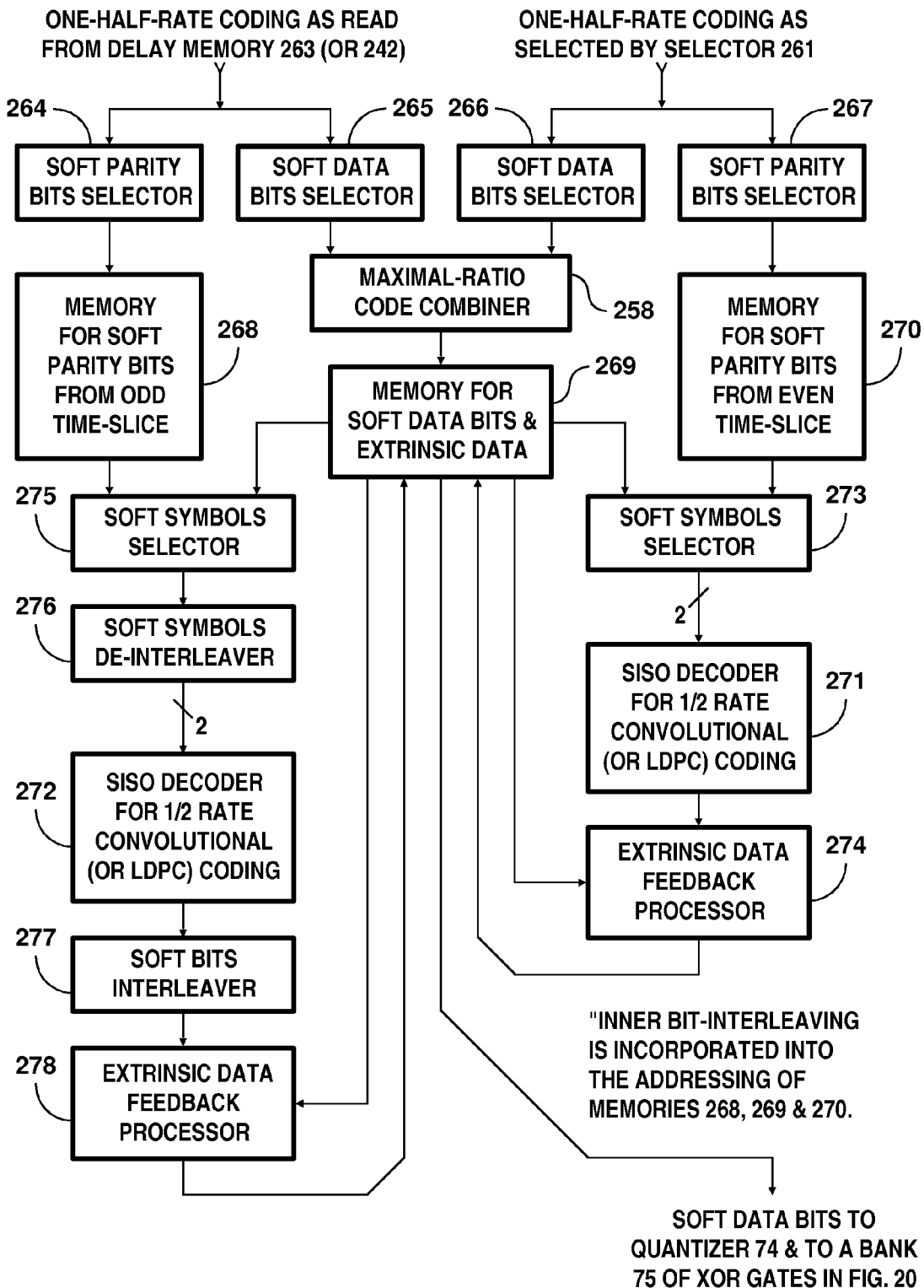

FIGS. 45 and 46 combine with FIG. 20 to provide a generic schematic diagram of a stationary DTV receiver adapted for iterative-diversity reception of COFDM signals as transmitted by the portions of the DTV transmitter as depicted in FIGS. 1 and 39, which DTV receiver is novel and embodies aspects of the invention.

Figure 47:
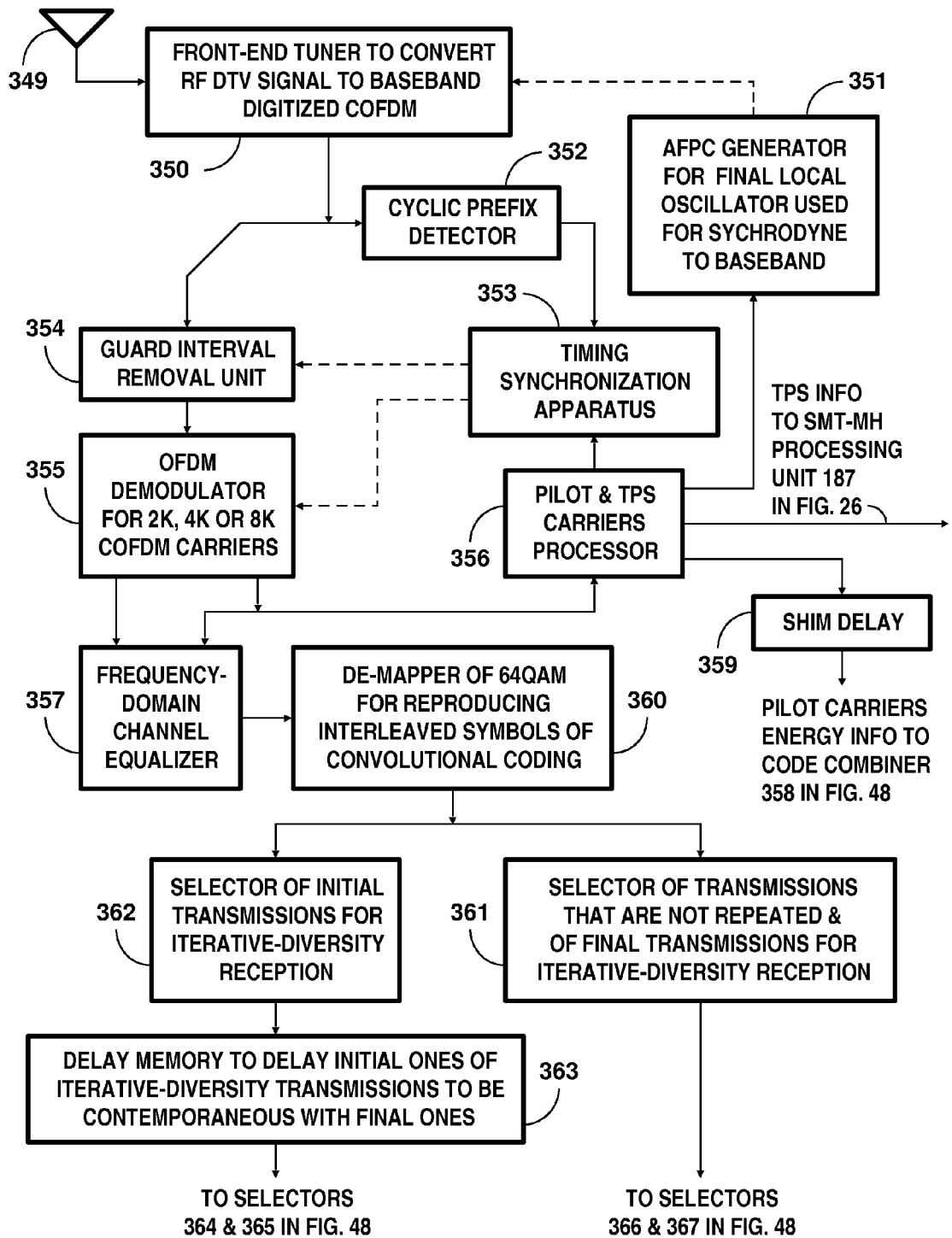
Figure 48:
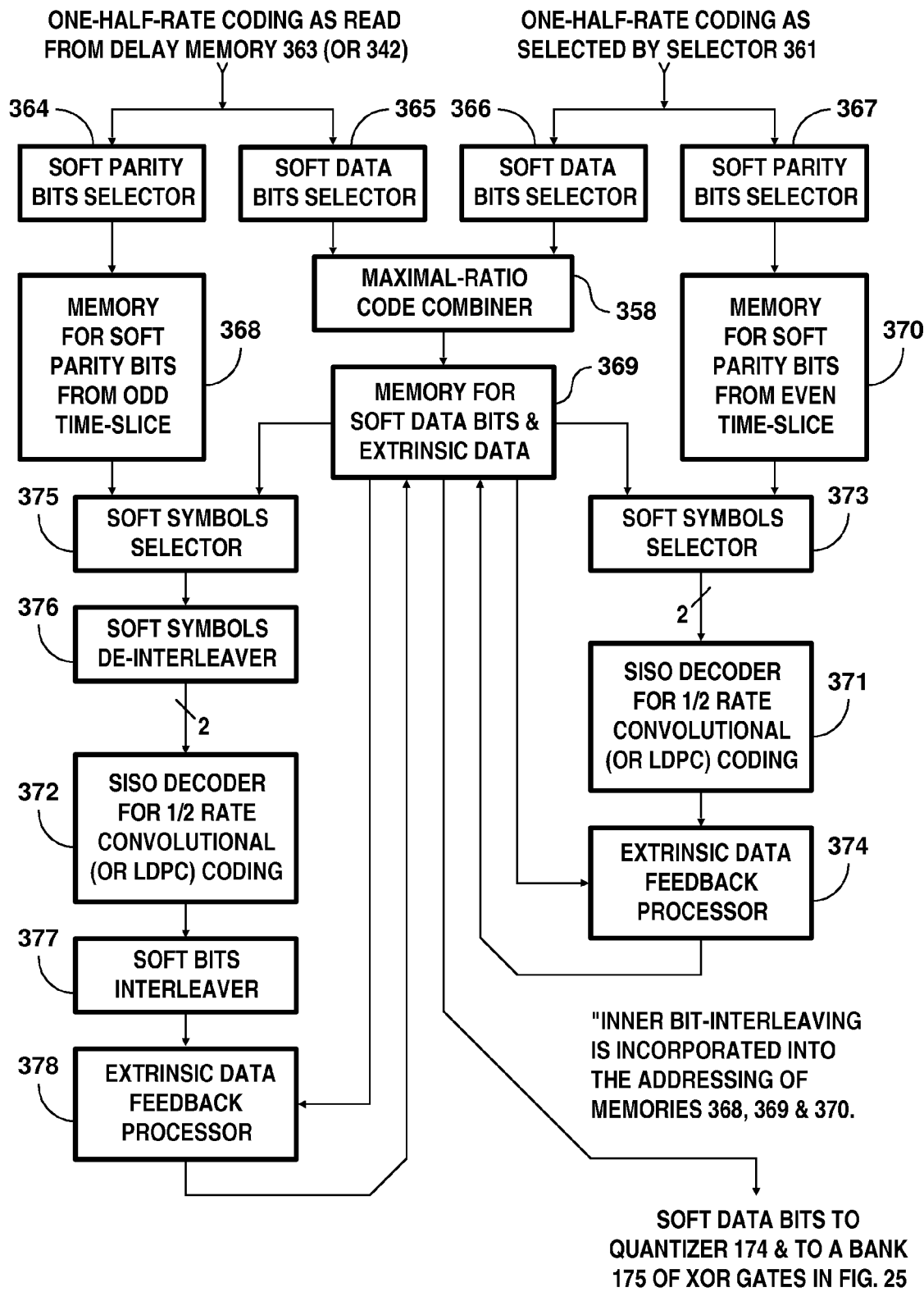

FIGS. 47 and 48 combine with FIGS. 25 and 26 to provide a generic schematic diagram of an M/H DTV receiver adapted for iterative-diversity reception of COFDM signals as transmitted by the portions of the DTV transmitter as depicted in FIGS. 3 and 35, which M/H DTV receiver is novel and embodies aspects of the invention.

Figure 49:
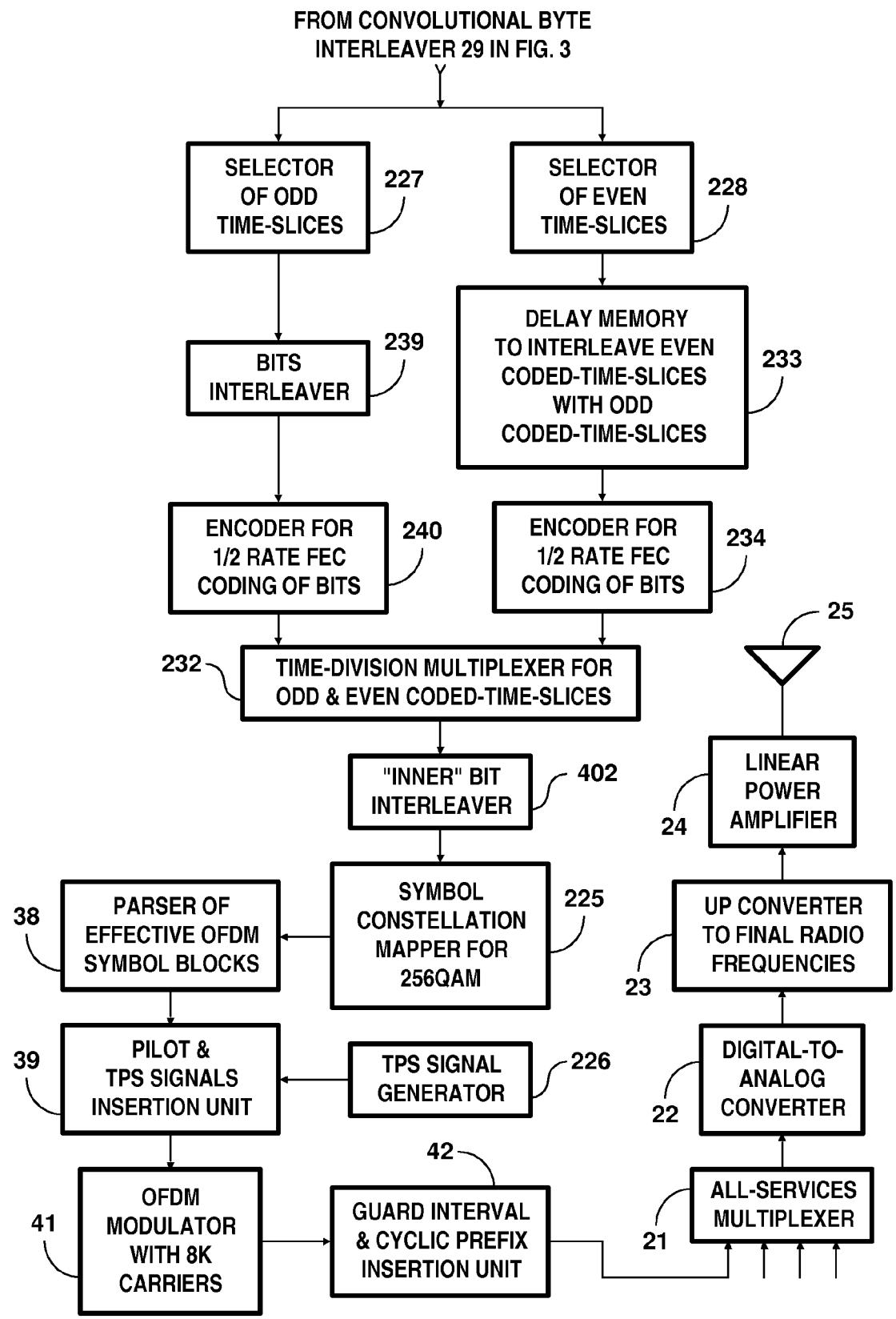

FIG. 49 is a schematic diagram of a further modification of the FIG. 39 modification of the FIG. 2 portion of a COFDM transmitter for a DTV system.

Figure 50:
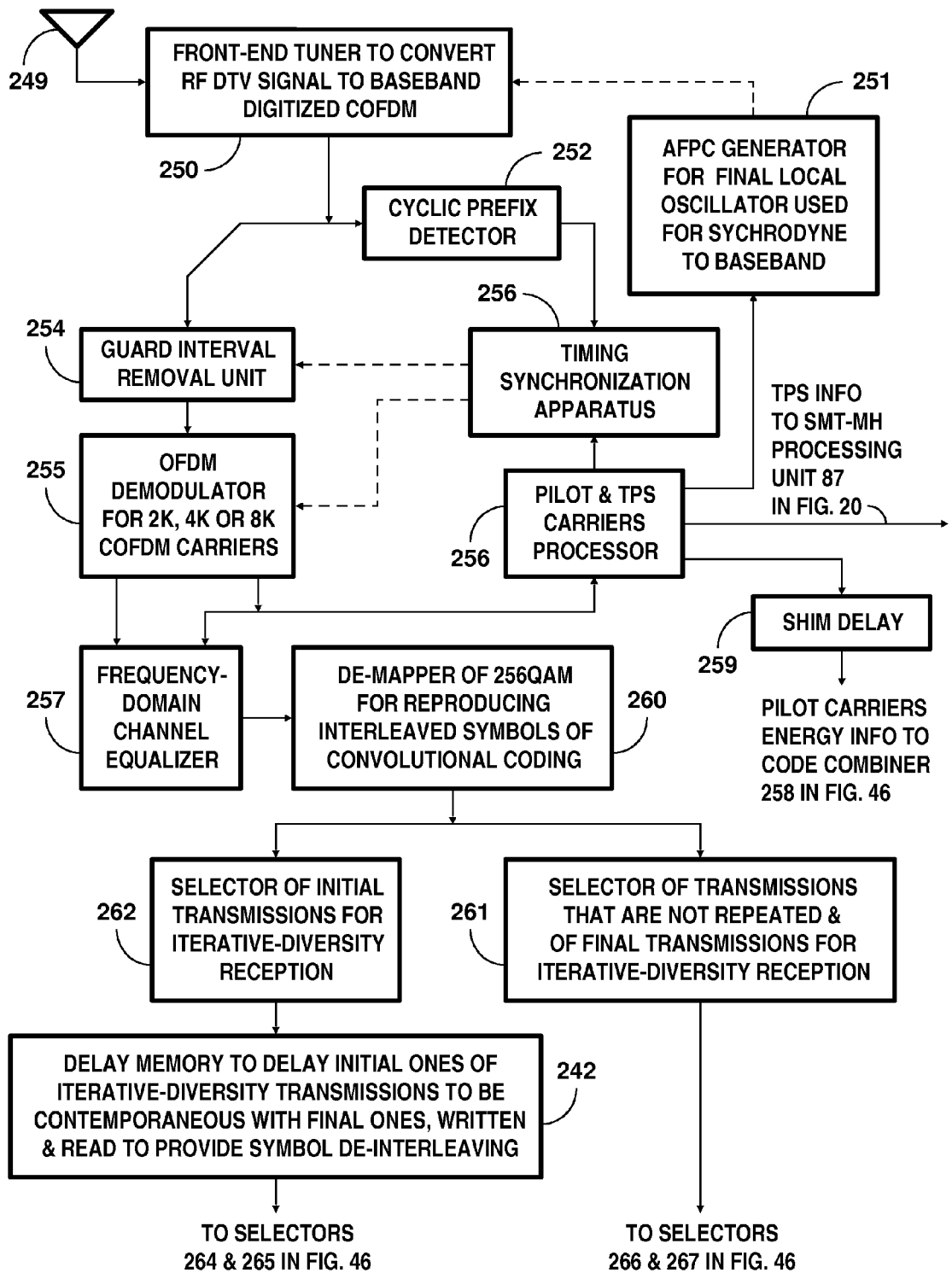

FIG. 50 combines with FIGS. 46 and 20 to provide a generic schematic diagram of a stationary DTV receiver adapted for iterative-diversity reception of COFDM signals as transmitted by the portions of the DTV transmitter as depicted in FIGS. 1 and 49, which DTV receiver is novel and embodies aspects of the invention.

Figure 51:
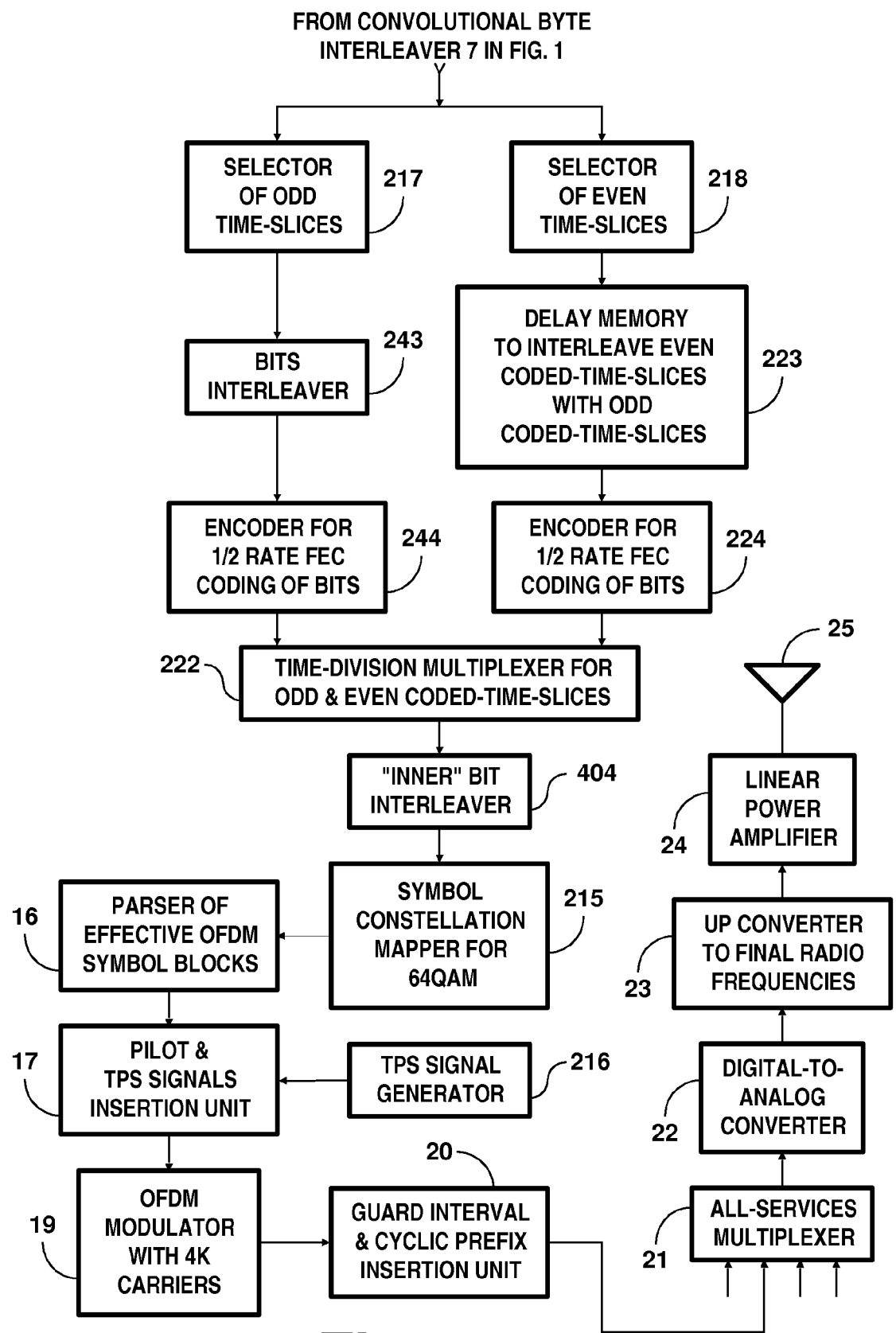

FIG. 51 is a schematic diagram of a further modification of the FIG. 35 modification of the FIG. 4 portion of a COFDM transmitter for a DTV system.

Figure 52:
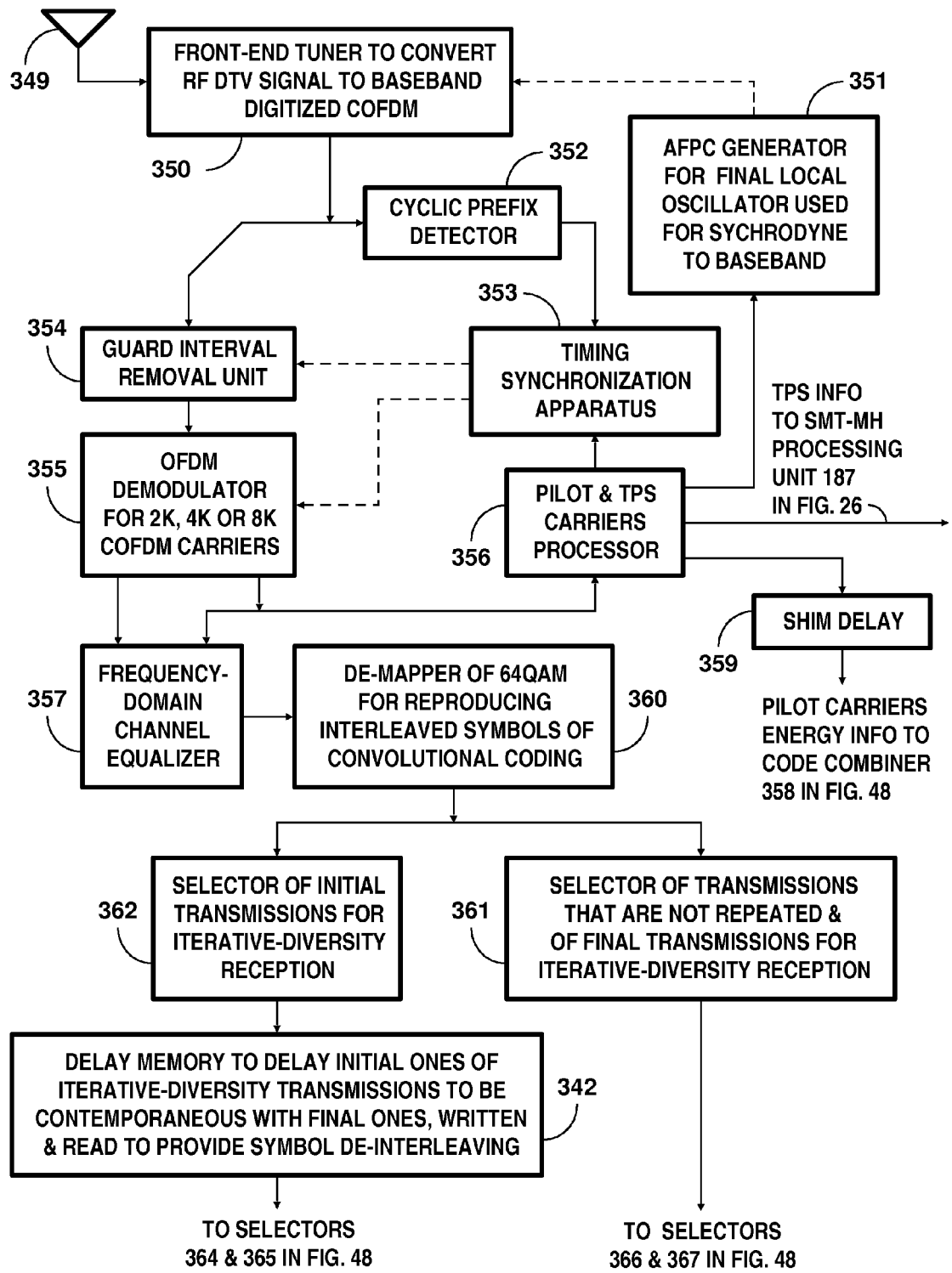

FIG. 52 combines with FIGS. 48, 25 and 26 to provide a generic schematic diagram of an M/H DTV receiver adapted for iterative-diversity reception of COFDM signals as transmitted by the portions of the DTV transmitter as depicted in FIGS. 3 and 51, which receiver is novel and embodies aspects of the invention.

FIG. 53 is a diagram showing the nature of the information in the eight bits of seven-eighths-rate turbo coding associated with each of the 256 lattice points in the 256QAM symbol constellation shown in FIGS. 40A, 40B, 40C and 40D.

FIG. 54 is a diagram showing the nature of the information in the eight bits of three-fourths-rate turbo coding associated with each of the 256 lattice points in the 256QAM symbol constellation shown in FIGS. 40A, 40B, 40C and 40D.

FIG. 55 is a diagram showing the nature of the information in the four bits of three-fourths-rate turbo coding associated with each of the 16 lattice points in a Gray-mapped 16QAM symbol constellation.

FIG. 56 is a diagram showing the nature of the information in the six bits of five-sixths-rate turbo coding associated with each of the 64 lattice points in the 64QAM symbol constellation shown in FIG. 9 or, alternatively, with each of the 64 lattice points in the 64QAM symbol constellation shown in FIG. 36.

FIG. 57 is a diagram showing the nature of the information in the six bits of two-thirds-rate turbo coding associated with each of the 64 lattice points in the 64QAM symbol constellation shown in FIG. 9.

DETAILED DESCRIPTION

FIGS. 1 and 2 together show a portion of a DTV transmitter generating COFDM signals for reception by stationary DTV receivers. FIG. 1 shows apparatus for processing frames of services to be broadcast to stationary DTV receivers, so as to generate convolutionally byte-interleaved (204, 188) Reed-Solomon codewords for iterative-diversity reception. FIG. 2 shows apparatus for further FEC-coding those RS codewords and generating subsequent COFDM signals.

A time-division multiplexer 1 for interleaving time-slices of services to be broadcast to stationary DTV receivers is depicted near the middle of FIG. 1. The time-division multiplexer 1 successively selects time-slices of these various services to be reproduced in its response, which is supplied from its output port. FIG. 1 shows the output port of the multiplexer 1 connected to the input port of an internet protocol encapsulator 2, the output port of which connects to the input port of a data randomizer 3. The internet protocol encapsulator 2 is used only if the services for reception by stationary DTV receivers use internet-protocol (IP) transport-stream (TS) packets, which packets have varying lengths. The original format for services broadcast for reception by stationary DTV receivers may be composed of successive MPEG-2 TS packets, rather than successive IP TS packets. In such case, the internet protocol encapsulator 2 is either selectively by-passed or is replaced by a direct connection from the output port of multiplexer 1 to the input port of the data randomizer 3.

An internet-protocol encapsulator (IPE) encapsulates incoming IP-datagrams within MPE (MultiProtocol Encapsulation) sections. In DVB-H the MPE sections are subsequently segmented to fit within the final 184 bytes of 188-byte MPEG-2 TS packets, as defined by the Motion Picture Experts Group (MPEG), which TS packets are referred to as IPE packets. The IPE further encapsulates the required PSI/SI (Program Specific Information/Service Information) signaling data that accompany each frame. The IPE also introduces signaling regarding the time-slicing transmissions of data in bursts, each burst including a respective FEC frame together with MPE timing information that let receivers know when to expect the next burst of data. The relative amount of time from the beginning of this MPE frame to the beginning of the next burst is indicated within a burst in the header of each MPE frame. This enables an M/H receiver to shut down between bursts, thereby minimizing power consumption and preserving battery life.

In transmissions made per the DVB-H standard, further signaling information in regard to time-slicing, such as burst duration, is included in the time_slice_fec_identifier_descriptor in the INT (IP/MAC Notification Table). Some of this information is also sent within Transmission Parameters Signaling (TPS) bits that are transported by dedicated carriers (TPS Pilots) in the COFDM (Coded Orthogonal Frequency Division Multiplexing) signal so as to be more quickly and easily available to receivers. This relieves a receiver of the need to decode MPEG2 and PSI/SI information. Such further time-slicing signaling information can be transmitted in tabular format prescribed in a standard developed for broadcasting in the United States of America, as well as some of this information being sent as TPS bits.

In a variant of DVB-H for use in the US, it is preferable that each IPE packet has a 5-byte header, rather than a 4-byte header, and that the MPE sections are subsequently segmented to fit within the final 183 bytes of the 188-byte IPE packet. In this preferred variant the final two bytes of an IPE packet header are used for conveying information that locates the respective starts of IP packets in MPE sections. A way to generate such information is described in detail in U.S. patent application Ser. No. 13/555,114 filed 21 Jul. 2012 for A. L. R. Limberg and titled "Receivers for COFDM digital television transmissions". The description refers to FIGS. 12, 13 and 14 of the drawing of that application. The headers of IPE packets for the initial and final transmissions of a service scheduled for iterative-diversity reception are preferably similar, which facilitates maximal-ratio code-combining of data bits from those initial and final transmissions during iterative-diversity reception procedures in the COFDM receivers of DTV broadcasts.

By way of illustration, the DTV transmitter is presumed to transmit successive super-frames of DTV signal, each of which super-frames is composed of four successive frames of DTV signal. The four frames are presumed to be of equal durations, and each may convey a separate service to be received by stationary DTV receivers. Alternatively, one (or more) of the four frames is used for broadcasting to mobile and handheld (M/H) DTV receivers. Each frame is presumed to be composed of eight successive time-slices of equal durations. In each of the frames used for broadcasting to M/H DTV receivers the respective eight successive time-slices can each convey a separate service to be received by those receivers.

There are various ways that the multiplexer 1 could time-division multiplex earlier and later transmissions of data scheduled for iterative-diversity reception by stationary DTV receivers. Time-division multiplexing could be done on a frame-by-frame basis, for example, as done in DVB-T practice. However, preferably, the multiplexer 1 is capable of performing the time-division multiplexing time-slice by time-slice—i.e., one-eighth frame by one-eighth frame. Such time-division multiplexing is preferred, partly because it can afford greater flexibility to the broadcasting system insofar as scheduling different services is concerned, provided that the nature of that multiplexing is signaled. The three frames scheduled for reception by stationary DTV receivers altogether contain twenty-four time-slices. By way of example, these twenty-four time-slices can be reapportioned among four services, each provided with only six time-slices per super-frame, rather than eight time-slices per super-frame. Alternatively, adjustments of the time-division multiplexing can be made to take into account whether high-definition or standard-definition DTV signals are transmitted. Remnant pairs of time-slices left over from the services scheduled for reception by stationary DTV receivers can be scheduled for reception by M/H receivers.

If selected frames of the super frames are to be used for broadcasting to stationary receivers for iterative diversity reception, preferably odd-numbered (e.g., first, third, fifth and seventh) time-slices in each of those selected frames are used for the earlier transmission of the data to be repeated. Even-numbered (e.g., second, fourth, sixth and eighth) time-slices in each of those selected frames are then used for the later transmission of the data repeated after a delay of one time-slice interval more than N frame intervals. If the frames for a service are adjusted to have an even number of time slices other than eight, half of this even number of time slices will be used for the earlier transmission of the data to be repeated, and the other half of this even number of time slices will be used for the for the later transmission of the data repeated after a little more than N frame intervals of delay. In less preferred variants of these practices, even-numbered time-slices in each of selected frames are used for the earlier transmission of the data to be repeated, and odd-numbered time-slices in each of those selected frames are then used for the later transmission of the data repeated after a delay of one time-slice interval less than N frame intervals.

Data concerning a first of the services to be transmitted for reception by stationary DTV receivers are written to a dual-port random-access memory 4 via a random-access port thereof. The RAM 4 is capable of temporarily storing a number at least N+1 of frames of the first service to be transmitted twice to enable iterative-diversity reception by stationary receivers, N being a positive integer. The dual-port RAM 4 has its serial output port connected for reading to a first input port of the multiplexer 1 of time-sliced services for iterative-diversity reception by stationary receivers. Successive time-slices of the first service for iterative-diversity reception by stationary receivers are read from the RAM 4 to the first input port of the multiplexer 1, up to four odd-numbered time-slices per super-frame, to support the initial transmissions of those time-slices. After a delay of one time-slice interval more than N super-frame intervals, the successive time-slices of the first service for reception by M/H receivers are read again from the RAM 4, up to four even-numbered time-slices per super-frame, to support the final transmissions of those time-slices.

Data concerning a second of the services to be transmitted for iterative-diversity reception by stationary DTV receivers are written to a dual-port random-access memory 5 via a random-access port thereof. The RAM 5 is capable of temporarily storing a number at least N+1 of frames of the second service to be transmitted twice to enable iterative-diversity reception by stationary receivers. The dual-port RAM 5 has its serial output port connected for reading to a second input port of the multiplexer 1 of time-sliced services for iterative-diversity reception by stationary receivers. Successive time-slices of the second service for iterative-diversity reception by stationary receivers are read from the RAM 5 to the second input port of the multiplexer 1, up to four odd-numbered time-slices per super-frame, to support the initial transmissions of those time-slices. After a delay of one time-slice interval more than N super-frame intervals, the successive time-slices of the second service for reception by M/H receivers are read again from the RAM 5, up to four even-numbered time-slices per super-frame, to support the final transmissions of those time-slices.

Data concerning a third of the services to be transmitted for iterative-diversity reception by stationary DTV receivers are written to a dual-port random-access memory 6 via a random-access port thereof. The RAM 8 is capable of temporarily storing a number at least N+1 of frames of the third service to be transmitted twice to enable iterative-diversity reception by stationary receivers. The dual-port RAM 6 has its serial output port connected for reading to a third input port of the multiplexer 1. Successive time-slices of the third service for iterative-diversity reception by stationary receivers are read from the RAM 6 to the third input port of the multiplexer 1, up to four odd-numbered time-slices per super-frame, to support the initial transmissions of those time-slices. After a delay of one time-slice interval more than N super-frame intervals, the successive time-slices of the third service for reception by M/H receivers are read again from the RAM 6, up to four even-numbered time-slices per super-frame, to support the final transmissions of those time-slices.

The respective time-slices from each of services for reception by M/H receivers that the time-division multiplexer 22 assembles are supplied from the output port of the multiplexer 1 to the input port of the IPE 2 or of the data randomizer 3. One skilled in the art will understand that the multiplexer 1 can be provided simply by tri-state buffering of the serial output ports of the RAMs 4, 5 and 6. The bits of the concluding 187-byte portion of each of the data packets supplied to the input port of the data randomizer 3 are exclusive-ORed with a prescribed repeating pseudo-random binary sequence (PRBS) in the data randomizer 3. However, initial synchronizing bytes accompanying the data packets are excluded from such data randomization procedure. By way of example, the PRBS can be the maximal-length 16-bit one prescribed in §§4.3.1 of the 1996 European Telecommunication Standard 300 744 titled "Digital Video Broadcasting (DVB); Framing Structure, Channel Coding and Modulation for Digital Terrestrial television (DVB-T)". Alternatively, the PRBS can be the maximal-length 16-bit one prescribed in §4.2.2 of the 1995 ATSC Digital Television Standard, Annex D. The 16-bit register used to generate the PRBS for data randomization is reset to initial condition at the beginning of each time-slice supplied from the multiplexer 1.

If the services broadcast for reception by stationary DTV receivers employ IP TS packets, the output port of the data randomizer 3 is connected for supplying data-randomized IPE packets to the input port of a byte de-interleaver 7. The output port of the byte de-interleaver 7 is then connected for supplying its byte-interleaved response to the input port of an LRS encoder 8 for (204, 188) Reed-Solomon (RS) forward-error-correction (FEC) coding. In this specification and its claims, the (204, 188) RS FEC coding is referred to as "lateral Reed-Solomon" FEC coding or "LRS" FEC coding to distinguish it from transverse RS FEC coding or "TRS" coding. The words "lateral" and "transverse" also refer to respective directions in which RS coding is done with respect to IPE packets. The output port of the LRS encoder 8 is connected for supplying serially generated (204, 188) LRS FEC codewords to the input port of a convolutional byte interleaver 9. The pattern of byte de-interleaving that the byte de-interleaver 7 employs is complementary to the pattern of byte interleaving employed by the subsequent convolutional byte interleaver 9. The byte de-interleaver 7 arranges for the convolutional byte interleaver 9 to provide "coded" or "implied" byte interleaving of (204, 188) LRS FEC codewords from the LRS encoder 8.

In a DTV receiver, the decoding of the (204, 188) LRS FEC codewords implements error correction, but is not used to validate the correctness of IP packets. The correctness of the IP packets is validated by cyclic-redundancy-check (CRC) coding within them. Some burst errors may exceed the error-correction capability of the decoder for the (204, 188) LRS FEC codewords. If the byte interleaving of (204, 188) LRS FEC codewords at the transmitter is not "coded", byte de-interleaving in the receiver disperses these burst errors that cannot be corrected among a greater number of IP packets than those affected by such burst error when initially received. With "coded" byte interleaving of the (204, 188) LRS FEC codewords, the DTV receiver can confine to fewer data-randomized IP packets those burst errors that cannot be corrected. The dispersal of burst errors that cannot be corrected that occurs in byte de-interleaving prior to decoding the (204, 188) LRS FEC codewords is counteracted in byte re-interleaving performed after such decoding and before decoding of bitwise FEC-coded IP packets.

If the original format for services broadcast for reception by stationary DTV receivers is composed of successive MPEG-2 TS packets, rather than successive IP TS packets, the byte de-interleaver 7 is either selectively by-passed or is replaced by a direct connection from the output port of the data randomizer 3 to the input port of the RS encoder 8. In the DTV receiver, the decoding of the (204, 188) LRS FEC codewords not only implements error correction, but is used directly to validate the correctness of the MPEG-2 TS packets. Accordingly, "coded" convolutional byte interleaving is not used when the original format for services broadcast for reception by stationary DTV receivers is composed of successive MPEG-2 TS packets.

Preferably, the pattern of byte interleaving for the convolutional byte interleaver 9 is one that wraps around from the conclusion of each time-slice to its beginning. Otherwise, the pattern of byte interleaving can be similar to that used in DVB-T and DVB-H. The convolutional byte interleaver 9 is preferably similar in construction and operation to the convolutional byte interleaver 35 described in more detail further on in this specification. This facilitates the design of stationary DTV receivers than can receive transmissions scheduled for reception by M/H receivers as well as transmissions scheduled for reception by stationary DTV receivers. Also, such a convolutional byte interleaver 9 exhibits reasonably low latent delay and avoids the pattern of byte interleaving extending beyond a single frame. The output port of the convolutional byte interleaver 9 is connected for supplying its response to apparatus for further FEC coding of individual bits of that response, which apparatus is shown in FIG. 2. The convolutional byte interleaver 9 is sometimes referred to as the "outer" interleaver to distinguish it from an "inner" interleaver further along in the processing of coded data, which "inner" interleaver is a bit interleaver used for spreading consecutive bits of FEC coding apart before their mapping to QAM symbol constellations. This is a known technique for reducing the effects of multipath reception by a COFDM receiver at some distance from a COFDM transmitter.

FIG. 2 shows an encoder 10 for one-third-rate FEC coding, the input port of which encoder 10 is connected for receiving the response from the output port of the convolutional byte interleaver 9. The output port of the encoder 10 is connected for supplying the one-third-code-rate coding generated by the encoder 10 to the input port of an inner bit interleaver 401. FIG. 2 shows the output port of the bit interleaver 401 connected to the input port of a QAM symbol constellation mapper 11 for cruciform 512QAM (or, alternatively, for square 64QAM). The response from the output port of the bit interleaver 401 spreads apart consecutive bits of FEC coding applied to its input port so that successive ones of them map to successive QAM symbol constellations used to convey a circular discrete Fourier transform (DFT) of the bit-interleaved FEC coding.

The output port of the QAM symbol constellation mapper 11 is connected to the input port of a parser 12 for effective OFDM symbol blocks. The block parser 12 parses a stream of complex samples supplied from the constellation mapper 11 into uniform-length sequences of complex samples, each of which sequences is associated with a respective effective OFDM symbol. The output port of the block parser 12 is connected to a first input port of a pilot and TPS signal insertion unit 13, a second input port of which unit 13 is connected to receive Transmission Parameters Signaling (TPS) bits from a TPS signal generator 14. The pilot and TPS signal insertion unit 13 inserts these TPS bits, which are to be transported by modulated dedicated carriers (TPS Pilots), into each effective OFDM symbol block. The pilot and TPS signal insertion unit 13 inserts other bits descriptive of unmodulated carriers of predetermined amplitude and predetermined phase into each effective OFDM symbol block. An output port of the pilot and TPS signal insertion unit 13 is connected for supplying the effective OFDM symbol blocks, with pilot carriers inserted therein, to the input port of an OFDM modulator 15. The OFDM modulator 15 has 8K carriers capability, suitable for transmissions to stationary DTV receivers.

A transmission signal in an OFDM system is transmitted by a unit of a symbol called an OFDM symbol. This OFDM symbol includes an effective symbol that is a signal period in which I-DFT is performed during transmission and a guard interval in which the waveform of a part of the latter half of this effective symbol is directly copied. This guard interval is provided in the former half of the OFDM symbol. In the OFDM system, such a guard interval is provided to improve performance during multi-path reception. Plural OFDM symbols are collected to form one OFDM transmission frame. For example, in the ISDB-T standard, ten OFDM transmission frames are formed by two hundred four OFDM symbols. Insertion positions of pilot signals are set with this unit of OFDM transmission frames as a reference.

The OFDM modulator 15 includes a serial-to-parallel converter for converting the serially generated complex digital samples of the effective OFDM symbols to parallel complex digital samples for inverse discrete Fourier transformation (I-DFT). The OFDM modulator 15 further includes a parallel-to-serial converter for converting the parallel complex digital samples of the I-DFT results to serial complex digital samples supplied from the output port of the OFDM modulator 15 to the input port of a guard-interval-and-cyclic-prefix-insertion unit 16. The output port of the guard-interval-and-cyclic-prefix-insertion unit 16 is connected for supplying successive complex digital samples of a COFDM signal to a first input port of an all-services multiplexer 17.

The output port of the all-services multiplexer 17 is connected to the input port of a digital-to-analog converter 18. FIG. 2 shows the output port of the DAC 18 connected for supplying its analog COFDM signal response to the input port of an up-converter 19 for converting baseband-frequency analog COFDM signal to very-high-frequency (VHF) or ultra-high-frequency (UHF) analog COFDM signal. The output port of the up-converter 19 is connected for supplying analog COFDM signal at radio frequencies to the input port of a linear power amplifier 20. FIG. 2 shows the output port of the linear power amplifier 20 connected for driving RF analog COFDM signal power to a transmission antenna 21. FIG. 2 omits showing certain customary details, such as band-shaping filters for the RF signals.

FIGS. 3 and 4 together show a further portion of the DTV transmitter generating COFDM signals for reception by M/H DTV receivers. FIG. 3 depicts apparatus for processing time-slices of the services to be transmitted for reception by M/H DTV receivers to generate (255, 191) transverse Reed-Solomon codewords. FIG. 4 shows apparatus for further FEC-coding those TRS codewords and generating subsequent COFDM signals.

A time-division multiplexer 22 to assemble time-sliced services for reception by M/H DTV receivers is shown somewhat above the middle of FIG. 3. Super-frames are customarily composed of four consecutive frames apiece, three frames respectively comprising data from each of the services for reception by stationary DTV receivers and a fourth frame comprising eight respective time-slices for reception by M/H receivers. Preferably, these eight time slices are apportioned in the following way among the services scheduled for iterative-diversity reception by M/H receivers. Initial and final transmissions of a first of the services scheduled for iterative-diversity reception by M/H receivers are transmitted in respective ones of the first and second of the time-slices in each fourth frame. Initial and final transmissions of a second of the services scheduled for iterative-diversity reception by M/H receivers are transmitted in respective ones of the third and fourth of the time-slices in each fourth frame. Initial and final transmissions of a third of the services scheduled for iterative-diversity reception by M/H receivers are transmitted in respective ones of the fifth and sixth of the time-slices in each fourth frame. Initial and final transmissions of a fourth of the services scheduled for iterative-diversity reception by M/H receivers are transmitted in respective ones of the seventh and eighth of the time-slices in each fourth frame. This protocol for apportioning time slices among the services scheduled for iterative-diversity reception is well suited for selectively energizing an M/H receiver only for receiving one of those services. This protocol permits the front-end tuner of the M/H receiver to be powered up just once in the fourth frame, rather than having to be powered up twice in the fourth frame. This reduces the time taken for settling of the front-end tuner before actively receiving the service selected for reception. If a service scheduled for iterative-diversity reception by M/H receivers requires more than two data slices within the fourth frame, arranging the data slices so as to be consecutive in time permits the front-end tuner of the M/H receiver still to be powered up just once in the fourth frame, rather than having to be powered up more times in the fourth frame.

Data concerning a first of the services to be transmitted for reception by M/H DTV receivers are written into storage locations within a dual-port random-access memory 23 via a random-access port thereof. The RAM 23 is capable of temporarily storing a number at least N+1 of time-slices of the first service to be transmitted twice to enable iterative-diversity reception by M/H receivers, N being a positive integer. The dual-port RAM 23 has its serial output port connected for reading to a first input port of the multiplexer 22 of time-sliced services for reception by M/H receivers. Successive time-slices of the first service for reception by M/H receivers are read from the RAM 23 to the first input port of the multiplexer 22, one odd-numbered time-slice per super-frame, to support the initial transmissions of those time-slices. After a delay of a little over N super-frame intervals, the successive time-slices of the first service for reception by M/H receivers are read again from the RAM 23, one even-numbered time-slice per super-frame, to support the final transmissions of those time-slices.

Data concerning a second of the services to be transmitted for reception by M/H DTV receivers are written into storage locations within a dual-port random-access memory 24 via a random-access port thereof. The RAM 24 is capable of temporarily storing a number at least N+1 of time-slices of the second service to be transmitted twice to enable iterative-diversity reception by M/H receivers. The dual-port RAM 24 has its serial output port connected for reading to a second input port of the multiplexer 22 of time-sliced services for reception by mobile receivers. Successive time-slices of the second service for reception by mobile receivers are read from the RAM 24 to the second input port of the multiplexer 22, one odd-numbered time-slice per super-frame, to support the initial transmissions of those time-slices. After a delay of a little over N super-frame intervals, the successive time-slices of the second service for reception by M/H receivers are read again from the RAM 24, one even-numbered time-slice per super-frame, to support the final transmissions of those time-slices.

Data concerning a third of the services to be transmitted for reception by M/H DTV receivers are written into storage locations within a dual-port random-access memory 25 via a random-access port thereof. The RAM 25 is capable of temporarily storing a number at least N+1 of time-slices of the third service to be transmitted twice to enable iterative-diversity reception by M/H receivers. The dual-port RAM 25 has its serial output port connected for reading to a third input port of the multiplexer 22 of time-sliced services for reception by M/H receivers. Successive time-slices of the third service for reception by M/H receivers are read from the RAM 25 to the third input port of the multiplexer 22, one odd-numbered time-slice per super-frame, to support the initial transmissions of those time-slices. After a delay of a little over N super-frame intervals, the successive time-slices of the third service for reception by M/H receivers are read again from the RAM 25, one even-numbered time-slice per super-frame, to support the final transmissions of those time-slices.

Data concerning a fourth of the services to be transmitted for reception by M/H DTV receivers are written into storage locations within a dual-port random-access memory 26 via a random-access port thereof. The RAM 26 is capable of temporarily storing a number at least N+1 of time-slices of the fourth service to be transmitted twice to enable iterative-diversity reception by M/H receivers. The dual-port RAM 26 has its serial output port connected for reading to a fourth input port of the multiplexer 22 of time-sliced services for reception by M/H receivers. Successive time-slices of the second service for reception by M/H receivers are read from the RAM 26 to the fourth input port of the multiplexer 22, one odd-numbered time-slice per super-frame, to support the initial transmissions of those time-slices. After a delay of a little over N super-frame intervals, the successive time-slices of the fourth service for reception by mobile receivers are read again from the RAM 26, one even-numbered time-slice per super-frame, to support the final transmissions of those time-slices.

The respective time-slices from each of services for reception by M/H receivers that the time-division multiplexer 22 assembles are supplied from the output port of the multiplexer 22 to the input port of an internet protocol encapsulator (or IPE) 27. One skilled in the art will understand that the multiplexer 22 can be provided simply by tri-state buffering of the serial read-output ports of the RAMs 23 24, 25 and 26. The standardized three-byte initial header for each of the IPE packets generated by the IPE 27 differs from the standardized three-byte initial header for each of the IPE packets generated by the IPE 2 shown in FIG. 1. This facilitates COFDM DTV receivers sorting IPE packets having additional TRS coding, provided from DTV transmitter apparatus as shown in FIGS. 3 and 4, from IPE packets that do not have additional TRS coding, provided from DTV transmitter apparatus as shown in FIGS. 1 and 2.

Except for using a different standardized three-byte initial header, the IPE 27 shown in FIG. 4 performs functions concerning transmissions for iterative reception by M/H receivers similar to those described supra as being performed by the IPE 2 concerning transmissions for iterative reception by stationary DTV receivers. The IPE 27 also introduces signaling regarding the time-slicing transmissions of data in bursts, each burst including a respective time-slice or small group of time-slices together with MPE timing information that let receivers know when to expect the next burst of data. The relative amount of time from the beginning of this MPE frame to the beginning of the next burst is indicated within a burst in the header of each MPE frame. This enables an M/H receiver to shut down between bursts, thereby minimizing power consumption and preserving battery life.

The output port of the IPE 27 is connected for supplying successive IPE packets to the input port of a data randomizer 28. The construction of the data randomizer 28 is similar to that of the data randomizer 2. FIG. 3 shows the output port of the data randomizer 28 connected to respective input ports of block de-interleavers 29 and 30 of matrix type, each employing a respective byte-organized random-access memory having 35,717m addressable byte-storage locations arranged in 187m columns and 191 rows, m being a small integer multiplier. The respective output ports of the block de-interleavers 29 and 30 rearrange bytes of the data randomizer 28 response for application to the input port of a TRS encoder 31 that encodes the rearranged bytes to generate (255, 191) transverse Reed-Solomon (TRS) codewords. FIG. 3 shows the output port of the TRS encoder 31 connected to respective input ports of block interleavers 32 and 33 of matrix type, each employing a respective byte-organized random-access memory having 47,685m addressable byte-storage locations arranged in 187m columns and 255 rows. The respective output ports of the block interleavers 32 and 33 rearrange bytes of the TRS encoder 31 response for application to the input port of a byte de-interleaver 34 shown in FIG. 4. The byte de-interleaving provided by the block de-interleavers 29 and 30 preceding the TRS encoder 31 complements the byte interleaving provided by the block interleavers 32 and 33 succeeding the TRS encoder 31. This arranges for the block interleavers 32 and 33 to provide "coded" or "implied" byte interleaving of (255, 191) TRS FEC codewords from the TRS encoder 31. Bytes of randomized data are restored to their original order for application to the input port of the byte de-interleaver 34 shown in FIG. 4.

Specifically, during odd-numbered time-slice intervals byte-storage locations in the RAM in the block de-interleaver 29 are written to row by row, while byte-storage locations in the RAM in the block de-interleaver 30 are read from column by column to the input port of the TRS encoder 31. The (255, 191) TRS FEC codewords supplied from the output port from the TRS encoder 31 are written to respective columns of byte-storage locations in the RAM in the block interleaver 32, while byte-storage locations in the RAM in the block interleaver 33 are read from row by row to the input port of the byte de-interleaver 34 shown in FIG. 4.

Byte-storage locations in the RAM in the block de-interleaver 30 are written to row by row during even-numbered time-slice intervals, while byte-storage locations in the RAM in the block de-interleaver 29 are read from column by column to the input port of the TRS encoder 31. The (255, 191) TRS FEC codewords supplied from the output port from the TRS encoder 31 are written to respective columns of byte-storage locations in the RAM in the block interleaver 33, while byte-storage locations in the RAM in the block interleaver 32 are read from row by row to the input port of the byte de-interleaver 34 shown in FIG. 4.

The codewords resulting from (255, 191) TRS coding of the initial three bytes of data-randomized IPE packets in a time-slice are the same for all time slices. So, a group or groups of three such codewords can be permanently stored in respective columns of byte-storage locations in the respective memories for bytes of time-slices in the block interleavers 32 and 33. That is, those byte-storage locations are not written to every time slice interval, but rather are read-only. This frees the TRS encoder 31 from having to code this group or these groups of three (255, 191) TRS codewords. Also, the block de-interleavers 29 and 30 for bytes of time-slices can omit actual byte-storage locations for the initial three bytes of data-randomized IPE packets. Since the parity bytes for (255, 191) TRS coding of the initial three bytes of data-randomized IPE packets in a time-slice are of no practical interest, it is preferable to replace them with a third type of initial three-byte headers for just those IPE packets containing TRS parity bytes. This facilitates COFDM DTV receivers further sorting IPE packets having additional TRS coding, provided from DTV transmitter apparatus as shown in FIGS. 3 and 4.

FIG. 4 shows the input port of a byte de-interleaver 34 connected for receiving data-randomized IPE packets and packets of TRS parity bytes from the block byte interleavers 32 and 33. FIG. 4 shows the output port of the byte de-interleaver 34 connected for supplying its response to the input port of an LRS encoder 35 for (204, 188) Reed-Solomon (RS) forward-error-correction (FEC) coding. The output signal from the LRS encoder 35 reproduces the 188-byte segments of the byte de-interleaver 34 response, but appends to each of those 188-byte segments a respective set of sixteen parity bytes for the (204, 188) LRS FEC coding, as calculated by the LRS encoder 35. The output port of the LRS encoder 35 is connected for supplying the resulting (204, 188) LRS codewords as input signal to the input port of a convolutional byte interleaver 36, which is preferably similar in construction and operation to the convolutional byte interleaver 9. The output port of the convolutional byte interleaver 36 is connected for supplying its response to apparatus for further FEC coding of individual bits of that response, which apparatus can as shown in FIG. 4 be an encoder 37 for one-third-rate FEC coding, for example.

The pattern of byte de-interleaving the byte de-interleaver 34 employs is complementary to the pattern of byte interleaving employed by the subsequent convolutional byte interleaver 36. The byte de-interleaver 34 arranges for the convolutional byte interleaver 36 to provide "coded" or "implied" byte interleaving of (204, 188) LRS FEC codewords from the RS encoder 35. Some burst errors may exceed the error-correction capability of decoding the (204, 188) LRS FEC codewords and may then also exceed the error-correction capability of decoding the (255, 191) TRS FEC codewords. If the byte interleaving of (204, 188) LRS FEC codewords and of (255, 191) TRS FEC codewords at the transmitter is not "coded", byte de-interleaving in the receiver disperses burst errors that cannot be corrected among a greater number of IP packets than those affected by such burst error when initially received. With "coded" byte interleaving of the (204, 188) LRS FEC codewords and of the (255, 191) TRS FEC codewords, the DTV receiver can confine to fewer data-randomized IP packets those burst errors that cannot be corrected.

In less preferred COFDM DTV broadcasting systems, byte interleaving of the (204, 188) LRS FEC codewords is not coded. In such case the byte de-interleaver 34 is replaced by direct connection from the output ports of the block interleavers 32 and 33 to the input port of the LRS encoder 35. If byte interleaving of the (204, 188) LRS FEC codewords is coded, the byte de-interleaver 34 is apt not to be an element separate from the block interleavers 32 and 33. The block de-interleaving previous to the LRS encoder 35 can instead be implemented by suitable read addressing of memories in the block interleavers 32 and 33.

The convolutional byte interleaver 36 provides interleaving such that sustained burst noise extending for as many as sixteen rows of the 204-byte-wide field of received data will cause no more than sixteen byte errors in any (204, 188) LRS codeword. If byte errors in a (204, 188) LRS codeword are located externally to the codeword, as many as sixteen byte errors in the codeword can be corrected during its decoding in the M/H receiver. The results of previous decoding of bit-wise FEC coding can be processed to locate byte-errors for decoding (204, 188) LRS codewords. If byte errors in a (204, 188) LRS codeword have to be located internally, within the codeword itself, only up to eight byte errors in the codeword can be corrected during its decoding in the M/H receiver. Sustained burst noise extending for as many as eight rows of the 204-byte-wide data field can still be corrected by a decoder for (204, 188) LRS codewords. If sustained burst noise exceeds the capability of the receiver to correct byte errors in (204, 188) LRS codewords, that sustained burst noise is left possibly to be corrected by a decoder for (255, 191) TRS codewords.

The block interleavers 32 and 33 provide byte interleaving such that sustained burst noise extending for as many as sixty-four rows of the 204-byte-wide field of received data will cause no more than sixty-four byte errors in any (255, 191) TRS codeword. If byte errors in a (255, 191) TRS codeword are located externally to the codeword, as many as sixty-four byte errors in the codeword can be corrected during its decoding in the M/H receiver. The results of previous decoding of bit-wise FEC coding can be processed to locate byte-errors for decoding (255, 191) TRS codewords. Alternatively, the results of decoding (204, 188) LRS codewords can be used to locate byte-errors for decoding (255, 191) TRS codewords. The results of decoding (204, 188) LRS codewords can also be used to refine the location of byte-errors for decoding (255, 191) TRS codewords, as determined by processing the results of previous decoding of bit-wise FEC coding. If byte errors in a (255, 191) TRS codeword have to be located internally, within the codeword itself, only up to thirty-two byte errors in the codeword can be corrected.

It is desirable that the convolutional byte interleaver 36 be designed to avoid the convolutional byte interleaving continuing from each time-slice to an ensuing time-slice or frame. This facilitates iterative-diversity reception of selected data bursts by DTV receivers when single-time transmissions are intermixed with the transmissions for iterative-diversity reception. The initial and final transmissions of the same time-slice will not be subject to being affected differently by respective foregoing transmissions of other coding. This facilitates maximal-ratio combining of those initial and final transmissions of same time-slices by a DTV receiver. So, the pattern of byte interleaving by the convolutional byte interleaver 36 is preferably one that wraps around from the conclusion of each successive pair of convolutional byte interleaving cycles to its beginning.

The pattern of byte interleaving by the convolutional byte interleaver 36 can be similar to that used by the Europeans in DVB-T and DVB-H. DVB-T and DVB-H use a 12-branch shift register configuration for Forney type convolutional byte interleaving that spaces bytes of a (204, 188) LRS codeword at 17-byte-epoch intervals. This permits any isolated burst error shorter than 136 byte epochs to be corrected by decoding successive (204, 188) Reed-Solomon codewords using an algorithm that locates, as well as corrects, byte errors. If the FEC coding results are analyzed to locate byte errors for (204, 188) Reed-Solomon codewords, isolated burst error not longer than 272 byte epochs can be corrected using erasure RS decoding.

If wrap-around of the pattern of byte interleaving from the conclusion of each successive time-slice to its beginning is not employed, the convolutional byte interleaving depth of seventeen 204-byte segments causes the combined latent delay in the transmitter byte interleaver and receiver byte de-interleaver to be slightly more than 2 milliseconds. If wrap-around of the pattern of byte interleaving from the conclusion of each successive time-slice to its beginning is employed, the transmitter introduces additional delay of slightly more than 2 milliseconds waiting for the results of initial byte interleaving without wrap-around followed by byte de-interleaving before final byte interleaving with wrap-around can proceed. I. e., knowledge of the concluding bytes of the pattern of convolutional byte interleaving is required in order to be able to insert those bytes as the wrap-around bytes near the beginning of the final byte interleaving.

FIG. 4 shows the output port of the convolutional byte interleaver 36 connected for supplying the response therefrom to the input port of an encoder 37 that generates one-third-code-rate FEC coding of individual bits of the byte interleaver 36 response. The encoder 37 supplies that bit-wise FEC coding from its output port to the input port of an inner bit interleaver 402. FIG. 4 shows the output port of the bit interleaver 402 connected to the input port of a QAM symbol constellation mapper 38 for square 64QAM. The response from the output port of the bit interleaver 402 spreads apart consecutive bits of FEC coding applied to its input port so that successive ones of them map to successive 64QAM symbol constellations used to convey a circular discrete Fourier transform (DFT) of the bit-interleaved FEC coding. The nature of square 64QAM symbol constellations preferred for transmitting one-third-code-rate FEC coding and the Gray mapping used in constellations are disclosed in detail further on in this specification, with reference to drawing FIG. 9.

The output port of the constellation mapper 38 is connected to the input port of a parser 39 for effective OFDM symbol blocks. The block parser 39 parses a stream of complex samples supplied from the constellation mapper 38 into uniform-length sequences of complex samples, each of which sequences is associated with a respective effective OFDM symbol. The output port of the block parser 39 is connected to a first input port of a pilot and TPS signal insertion unit 40, a second input port of which unit 40 is connected to receive Transmission Parameters Signaling (TPS) bits from a TPS signal generator 41. The pilot and TPS signal insertion unit 40 inserts these TPS bits, which are to be transported by dedicated carriers (TPS Pilots), into each effective OFDM symbol block. The pilot and TPS signal insertion unit 40 inserts other bits descriptive of unmodulated carriers of predetermined amplitude and predetermined phase into each effective OFDM symbol block. An output port of the pilot and TPS signal insertion unit 40 is connected for supplying the effective OFDM symbol blocks with pilot carriers inserted therein to the input port of an OFDM modulator 42. The OFDM modulator 42 has 4K carriers capability, suitable for transmissions to M/H DTV receivers.

The OFDM modulator 42 includes a serial-to-parallel converter for converting the serially generated complex digital samples of the effective OFDM symbols to parallel complex digital samples for inverse discrete Fourier transformation (I-DFT). The OFDM modulator 42 further includes a parallel-to-serial converter for converting the parallel complex digital samples of the I-DFT results to serial complex digital samples of the I-DFT results supplied from the output port of the OFDM modulator 42 to the input port of a guard-interval-and-cyclic-prefix-insertion unit 43. The output port of the guard-interval-and-cyclic-prefix-insertion unit 43 is connected for supplying successive complex digital samples of a COFDM signal to a second input port of the all-services multiplexer 17.

It is desirable that the inner bit interleavers 401 and 402 and any other inner bit interleavers used in COFDM DTV broadcasting in the United States be of similar design. This simplifies the design of DTV receivers that can receive DTV signals broadcast for reception by stationary receivers and DTV signals broadcast for reception by mobile receivers. The number of OFDM carriers in the 2K, 4K and 8K options are preferably evenly divisible by the spread that the bit interleavers 401 and 402 introduce between successive bits of FEC coding, since this facilitates wrap-around of the bit interleaving. In DVB the 2K, 4K and 8K options contain 1512, 3024 and 6048 COFDM carriers, respectively. Inner bit interleavers that spread successive bits of FEC coding to occur at 216-bit intervals allow the labeling of lattice points in 16 QAM, 64 QAM, 256QAM, 512QAM and 4096QAM symbol constellations so as not to contain any nearby bits from the FEC coding. Inner bit interleavers that spread successive bits of FEC coding to occur at 72-bit intervals provide similar capability, but the lesser spreading of successive bits of FEC coding probably offers less assistance in overcoming selective fading caused by multipath. Neither the spreading of successive bits of FEC coding to occur at 216-bit intervals nor the spreading of successive bits of FEC coding to occur at 72-bit intervals will disturb the sequencing of data bits and intervening parity bits, one should note.

Provisional U.S. Pat. App. Ser. No. 61/711,268 describes variations in the way that QAM symbol constellations are mapped into effective OFDM symbols that can be used in modifications of the FIG. 2 transmitter apparatus and in modifications in the FIG. 4 transmitter apparatus. These modifications rotate the circular DFTs defined by the QAM symbol constellations by one-half revolution as between earlier and later transmissions of similar FEC-coded and inner bit-interleaved data. This empowers COFDM receivers better to overcome the loss of information owing to selective fading caused by substantial cancellation of many close-in-frequency COFDM carriers. Receivers are apt to experience such selective fading at reception locations near to the COFDM DTV transmitter. Transmitter apparatuses modified in such way are alternative embodiments of aspects of the invention that will have practical utility if a standard for wireless transmission of COFDM DTV signals specifies rotation of the circular DFTs defined by the QAM symbol constellations by half a revolution as between earlier and later transmissions of similar FEC-coded and inner bit-interleaved data.

Figure 5:
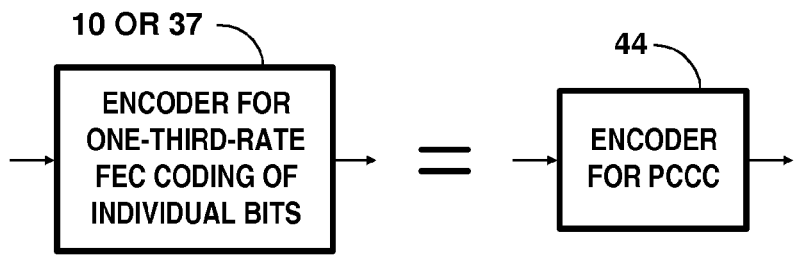
FIGS. 5, 6, 7 and 8 illustrate encoders for various species of turbo coding, any one of which sorts of encoders can be used in the FIG. 2 and FIG. 4 portions of a COFDM transmitter for a DTV system embodying aspects of the invention.
Figure 6:
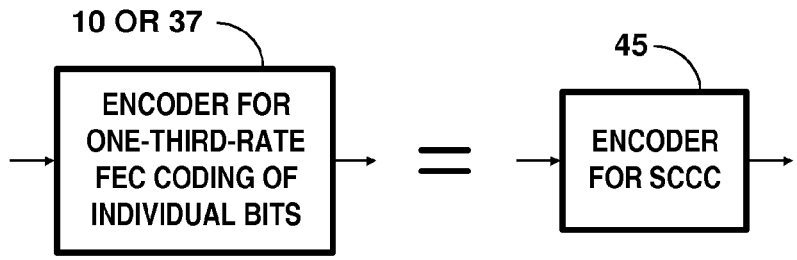

FIG. 5 illustrates an encoder 44 for parallel concatenated convolutional coding (PCCC) being usable as the FIG. 2 encoder 10 or the FIG. 4 encoder 37 for one-third-rate FEC coding of individual bits. FIG. 6 illustrates an encoder 45 for serially concatenated convolutional coding (SCCC) being usable as the FIG. 2 encoder 10 or the FIG. 4 encoder 37 for one-third-rate FEC coding of individual bits.

Figure 7:
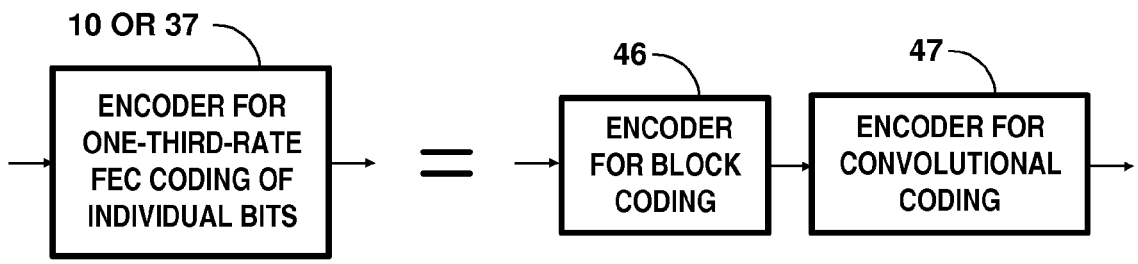

FIG. 7 depicts a cascade connection of an encoder 46 for block coding followed by an encoder 47 for convolutional coding. This cascade connection of the encoders 46 and 47 generates product coding. FIG. 7 illustrates that the cascade connection of encoders 46 and 47 is usable as the FIG. 2 encoder 10 or the FIG. 4 encoder 37 for one-third-rate FEC coding of individual bits.

Figure 8:
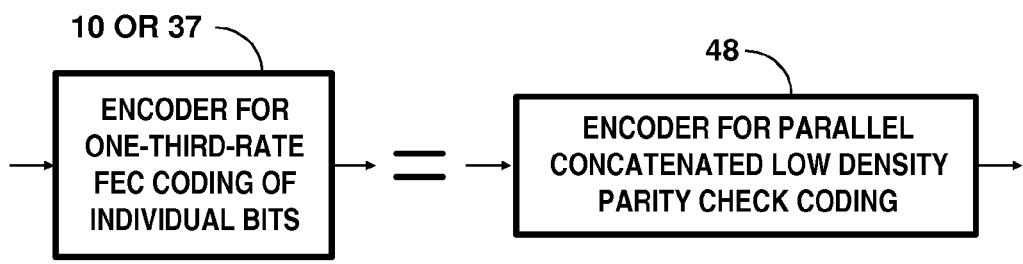

FIG. 8 illustrates an encoder 48 for parallel concatenated low-density-parity-check (LDPC) coding being usable as the FIG. 2 encoder 10 or the FIG. 4 encoder 37 for one-third-rate FEC coding of individual bits. Gyu-Bum Kyung, Hong-Sil Jeong and Jae-Yoel Kim described this sort of coding in U.S. Pat. No. 7,519,895 issued 14 Apr. 2009, titled "Channel encoding/decoding apparatus and method using a parallel concatenated low density parity check code" and assigned to Samsung Electronics Co., Ltd.

FIG. 9 shows a square 64QAM symbol constellation map that the constellation mapper 38 in the portion of a COFDM transmitter shown in FIG. 4 preferably uses for transmitting one-third-rate FEC coding. The constellation mapper 15 in the portion of a COFDM transmitter shown in FIG. 2 can use the square 64QAM symbol constellation map of FIG. 9, too, but a cruciform 512QAM symbol constellation map is preferred for broadcasting to stationary DTV receivers. The square symbol constellation map of FIG. 9 provides perfect Gray mapping. The set of six decision bits associated with any lattice point differs by only a single bit from the set of six decision bits associated with any one of the closest by lattice points in the square 64QAM symbol constellation.

The six decision bits associated with each lattice point are arranged in a certain way for application as input signal to a turbo decoder. The term "turbo coding" is used in this specification for generically describing various sorts of coding, one of which is generated by the complete encoders shown in FIGS. 5, 6, 7 and 8. The term "turbo decoder" refers to apparatus for iteratively decoding redundant coding including data bits and two sets of parity bits, one set of which parity bits is derived from interleaved data bits. The six decision bits associated with each lattice point in the FIG. 9 symbol constellation map are considered to be ordinally numbered first through sixth, counting from left to right—i.e., from earliest to latest in bit-serial response.

FIG. 10A shows the bit-map pattern for bits in the first bit-places of the 6-bit sequences respectively associated with the square array of sixty-four lattice points in the 64QAM symbol constellation map of FIG. 9. The vertical bands of ONEs are each two lattice points wide, and the vertical bands of ZEROes are each two lattice points wide except at left and right edges of the 64QAM symbol constellation map. FIG. 10B shows the bit-map pattern for bits in the second bit-places of the 6-bit sequences respectively associated with the square array of sixty-four lattice points in the 64QAM symbol constellation map of FIG. 9. The vertical band of ONEs is four lattice points wide, and the flanking vertical bands of ZEROes are each two lattice points wide. FIG. 10C shows the bit-map pattern for bits in the third bit-places of the 6-bit sequences respectively associated with the square array of sixty-four lattice points in the 64QAM symbol constellation map of FIG. 9. The vertical band of ONEs is four lattice points wide, and the vertical band of ZEROes is four lattice points wide.

FIG. 10D shows the bit-map pattern for bits in the fourth bit-places of the 6-bit sequences respectively associated with the square array of sixty-four lattice points in the 64QAM symbol constellation map of FIG. 9. The horizontal bands of ONEs are each two lattice points deep, and the horizontal bands of ZEROes are each two lattice points deep except at top and bottom edges of the 64QAM symbol constellation map. FIG. 10E shows the bit-map pattern for bits in the fifth bit-places of the 6-bit sequences respectively associated with the square array of sixty-four lattice points in the 64QAM symbol constellation map of FIG. 9. The horizontal band of ONEs is four lattice points deep, and the flanking horizontal bands of ZEROes are each two lattice points deep. FIG. 10F shows the bit-map pattern for bits in the sixth bit-places of the 6-bit sequences respectively associated with the square array of sixty-four lattice points in the 64QAM symbol constellation map of FIG. 9. The horizontal band of ONEs is four lattice points deep, and the horizontal band of ZEROes is four lattice points deep.

The decision bits in the first and fourth bit-places are more likely to have low confidence levels associated with them than the decision bits in the other bit-places. This is because the decision bits in the first and fourth bit-places are more likely to be from lattice points adjoining boundaries between ONEs and ZEROes, where confidence levels are reduced. So, as shown in FIG. 11, the first and fourth bit-places are used to convey earlier and later data bits of one-third-rate turbo coding. The second and fifth bit-places are used to convey earlier and later ones of a first set of parity bits of the one-third-rate turbo coding. The third and sixth bit-places are used to convey earlier and later ones of a second set of parity bits of the one-third-rate turbo coding. There is some preference for deriving the first set of parity bits from the data bits before their interleaving in connection with turbo coding, and for deriving the second set of parity bits from the data bits after their interleaving in connection with turbo coding. The integrated circuitry in receivers appears slightly simpler to implement.

However, other embodiments of the aspects of the invention involving 64QAM rely on a 64QAM symbol constellation map that differs from that depicted in FIG. 9, but uses the same set of two bit-maps to convey data bits of one-third-rate bit-wise FEC coding. In some of these alternative 64QAM symbol constellation maps, just the order of the bit-maps to convey data bits of one-third-rate bit-wise FEC coding is changed from what it is in the FIG. 9 symbol constellation map. In others of these alternative 64QAM symbol constellation maps, just the order of the bit-maps to convey parity bits of one-third-rate bit-wise FEC coding is changed from what it is in the FIG. 9 symbol constellation map. In yet others of these alternative 64QAM symbol constellation maps, the order of the bit-maps to convey data bits of one-third-rate bit-wise FEC coding is changed from what FIG. 9 depicts; and the order of the bit-maps to convey parity bits of one-third-rate bit-wise FEC coding is also changed from what FIG. 9 depicts. Still further 64QAM symbol constellation maps having the particular properties requisite to aspects of the invention involving one-third-rate bit-wise FEC coding are generated by any of the following manipulations of the already-described 64QAM symbol constellation maps or combinations of such manipulations: a 90-degree rotation in symbol space, a 180-degree rotation in symbol space, a 270-degree rotation in symbol space, a right-for-left horizontal flip in symbol space, or a top-for-bottom vertical flip in symbol space.

FIGS. 12A, 12B, 12C and 12D illustrate the four quadrants of a representative cruciform 512QAM symbol constellation map that the constellation mapper 37 in the portion of a COFDM transmitter shown in FIG. 4 preferably uses. The nine decision bits associated with each lattice point are considered to be ordinally numbered first through ninth, scanning from left to right—i.e., from earliest to latest in bit-serial response. As shown in FIG. 16, the first, fourth and seventh decision bits are used to convey successive data bits of one-third-rate turbo coding. The second, fifth and eighth decision bits are used to convey successive ones of a first set of parity bits of the one-third-rate turbo coding. The third, sixth and ninth decision bits are used to convey successive ones of a second set of parity bits of the one-third-rate turbo coding. The first and fourth decision bits are more likely than the other decision bits to have low confidence levels associated with them, which is the reason for using the first and fourth bit places for conveying data bits of one-third-rate turbo coding.

Figure 13:
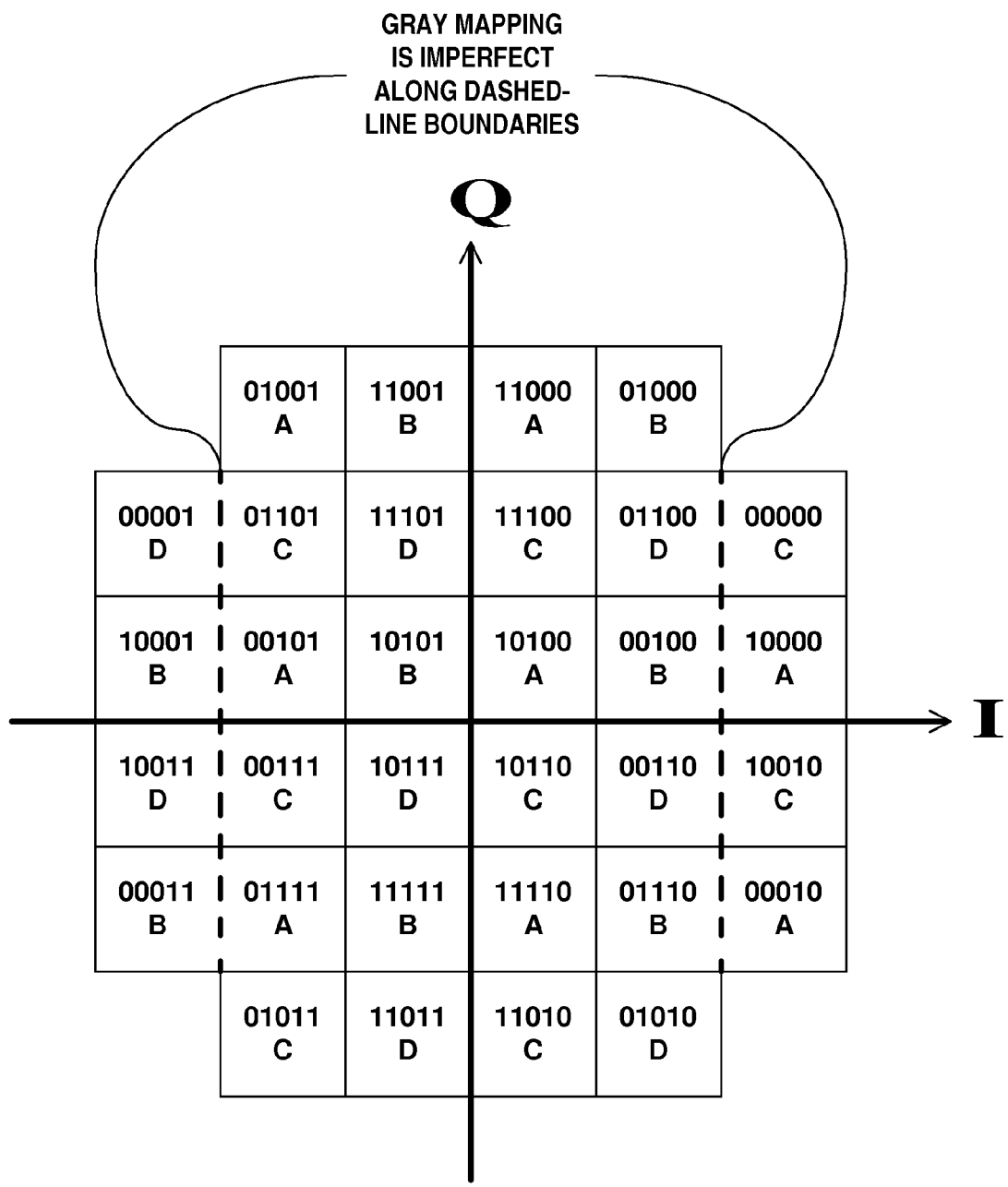
FIG. 13 is an assembly diagram for the 512QAM symbol constellation map quadrants shown in FIGS. 12A, 12B, 12C and 12D, which diagram maps the regions within the complete 512QAM symbol constellation wherein the 9-bit sequences of turbo coding associated with lattice points therein have similar third, sixth, seventh, eighth and ninth bits.

FIG. 13 is an assembly drawing, showing how each of the four quadrants of the cruciform 512QAM symbol constellation map is disposed relative to the others. The 512QAM symbol constellation map can be analyzed as being composed of thirty-two 16-point square arrays of lattice points. Each of these 16-point square arrays uses a unique set of third, sixth, seventh, eighth and ninth bits within the sequences of nine decision bits associated with respective lattice points within that 16-point square array. FIG. 13 identifies each of these thirty-two regions within the cruciform 512QAM symbol constellation map by the unique set of third, sixth, seventh, eighth and ninth bits associated with respective lattice points within that region.

The 5-bit number for each region is succeeded by a letter A, B, C or D. The letter A is an indication that first, second, fourth and fifth decision bits of 9-bit sequences of turbo coding map to the sixteen lattice points in that region per FIG. 14A. The letter B is an indication that first, second, fourth and fifth decision bits of 9-bit sequences of turbo coding map to the sixteen lattice points in that region per FIG. 14B. The letter C is an indication that first, second, fourth and fifth decision bits of 9-bit sequences of turbo coding map to the sixteen lattice points in that region per FIG. 14C. The letter D is an indication that first, second, fourth and fifth decision bits of 9-bit sequences of turbo coding map to the sixteen lattice points in that region per FIG. 14D.

The maintenance of Gray mapping in most of the cruciform 512QAM symbol constellation map is furthered by the tiling pattern in which regions per FIGS. 14A, 14B, 14C and 14D are arranged respective to each other. The tiling pattern is such that the first, second, fourth and fifth decision bits associated with a lattice point close to the edge of a region are the same as the first, second, fourth and fifth decision bits associated with the adjoining lattice point in the next region. So, the difference between the 9-bit sequences of turbo coding associated with such a pair of adjoining lattice points is determined by bits in the third, sixth, seventh, eighth and ninth bit-places.

Sixteen of the thirty-two regions are arrayed as a square central core of the cruciform 512QAM symbol constellation map. Another four of the thirty-two regions are arrayed in a rectangular tab adjoining the top edge of the square central core of the cruciform 512QAM symbol constellation map. Yet another four of the thirty-two regions are arrayed in a rectangular tab adjoining the bottom edge of the square central core of the cruciform 512QAM symbol constellation map. Gray mapping is maintained throughout these twenty-four contiguous regions. Four of the remaining eight regions are arrayed in a rectangular tab adjoining the left edge of the square central core of the cruciform 512QAM symbol constellation map to form a left arm thereof. The other four are arrayed in a rectangular tab adjoining the right edge of the square central core of the cruciform 512QAM symbol constellation map to form a right arm thereof. Gray mapping is maintained throughout the four regions arrayed in the rectangular tab that forms the left arm of the cruciform 512QAM symbol constellation map. Gray mapping is maintained throughout the four regions arrayed in the rectangular tab that forms a right arm of the cruciform 512QAM symbol constellation map. Adjoining lattice points, one of which is disposed within the square central core of the cruciform 512QAM symbol constellation map and the other of which is disposed within either the left or the right arm of the cruciform map, will differ in two bit places, rather than just one.

Perfect Gray mapping, in which every pair of adjoining lattice points differ in only a single bit place, appears impossible in a cruciform 512QAM symbol constellation map. Several cruciform 512QAM symbol constellation maps which depart from perfect Gray mapping only insofar as 32 pairs of adjoining lattice points differing in two bit places are possible, besides that shown in FIGS. 12A, 12B, 12C, 12D and 13. 512QAM symbol constellation maps which depart from perfect Gray mapping only insofar as 16 pairs of adjoining lattice points differing in three bit places are possible, too.

FIG. 15A shows the bit-map pattern exhibited by bits in the first bit-places of 9-bit sequences of turbo coding in each of the FIG. 14A, FIG. 14B, FIG. 14C and FIG. 14D maps of square arrays of sixteen lattice points. This bit-map pattern repeats in vertical bands of ONEs interleaved with vertical bands of ZEROes in the complete cruciform 512QAM symbol constellation map. The vertical bands of ONEs are each two lattice points wide, and the vertical bands of ZEROes are each two lattice points wide except at left and right edges of the complete 512QAM symbol constellation map. The relatively high frequency of change between ONEs and ZEROes in the vertical direction tends to reduce confidence levels of bits assigned to the first bit-places compared to confidence levels of bits assigned to the other bit-places except the fourth. For this reason, the data bits in the turbo decoding, which will be subjected to adjustment during turbo decoding procedures, are assigned in part to the first bit-places in the 9-bit sequences of turbo coding.

FIG. 15B shows the bit-map pattern exhibited by bits in the second bit-places of 9-bit sequences of turbo coding in each of the FIG. 14A, FIG. 14B, FIG. 14C and FIG. 14D maps of square arrays of sixteen lattice points. This bit-map pattern repeats in vertical bands of ONEs interleaved with vertical bands of ZEROes in the complete cruciform 512QAM symbol constellation map. The vertical bands of ONEs are each four lattice points wide, and the vertical bands of ZEROes are each four lattice points wide except at left and right edges of the complete 512QAM symbol constellation map. The frequency of change between ONEs and ZEROes in the vertical direction is half that for first-bit-place bits in the 9-bit sequences of turbo coding. This frequency of change between ONEs and ZEROes in the vertical direction is higher than for third-bit-place, sixth-bit-place, seventh-bit-place, eighth-bit-place and ninth-bit-place bits in the 9-bit sequences of turbo coding.

However, ones of the first set of parity bits of turbo coding are assigned to the second bit-places of 9-bit sequences of turbo coding. The bit-map pattern of ONEs and ZEROes in the second bit-places overlaps the bit-map pattern of ONEs and ZEROes in the first bit-places in such way that transitions between ONEs and ZEROes in the two bit-map patterns interleave. Accordingly, confidence levels in the first set of parity bits will be higher when confidence levels in the data bits are low, and vice versa. This is a desirable relationship as between the data bits and the first set of parity bits, presuming particularly that the second set of parity bits and not the first set are generated from the data bits as subjected to turbo-code interleaving.

FIG. 15C shows the bit-map pattern exhibited by bits in the third bit-places of 9-bit sequences of turbo coding in the complete cruciform 512QAM symbol constellation map. Ones of the second set of parity bits of turbo coding are assigned to the third bit-places of the 9-bit sequences of turbo coding. Boundaries between ONEs and ZEROes in these third bit-places are mostly vertical. When the confidence levels of bits in these third bit-places are low near such vertical boundaries, which are at the edges of square arrays of sixteen lattice points, the confidence levels of bits in the first and second bit-places is high. The confidence levels of bits in these third bit-places become high within these square arrays, where the confidence levels of bits in the first and second bit-places are apt to dip low.

FIG. 15D shows the bit-map pattern exhibited by bits in the fourth bit-places of 9-bit sequences of turbo coding in each of the FIG. 14A, FIG. 14B, FIG. 14C and FIG. 14D maps of square arrays of sixteen lattice points. This bit-map pattern repeats in horizontal bands of ONEs interleaved with horizontal bands of ZEROes in the complete cruciform 512QAM symbol constellation map. The horizontal bands of ONEs are each two lattice points tall, and the horizontal bands of ZEROes are each two lattice points tall except at top and bottom edges of the complete 512QAM symbol constellation map. The relatively high frequency of change between ONEs and ZEROes in the horizontal direction tends to reduce confidence levels of bits assigned to the fourth bit-places compared to confidence levels of bits assigned to the other bit-places except the first. For this reason, the data bits in the turbo decoding, which will be subjected to adjustment during turbo decoding procedures, are assigned in further part to the fourth bit-places in the 9-bit sequences of turbo coding.

FIG. 15E shows the bit-map pattern exhibited by bits in the fifth bit-places of 9-bit sequences of turbo coding in each of the FIG. 14A, FIG. 14B, FIG. 14C and FIG. 14D maps of square arrays of sixteen lattice points. This bit-map pattern repeats in horizontal bands of ONEs interleaved with horizontal bands of ZEROes in the complete cruciform 512QAM symbol constellation map. The horizontal bands of ONEs are each four lattice points tall, and the vertical bands of ZEROes are each four lattice points tall except at top and bottom edges of the complete 512QAM symbol constellation map. The frequency of change between ONEs and ZEROes in the horizontal direction is half that for fourth-bit-place bits in the 9-bit sequences of turbo coding. This frequency of change between ONEs and ZEROes in the vertical direction is higher than for third-bit-place, sixth-bit-place, seventh-bit-place, eighth-bit-place and ninth-bit-place bits in the 9-bit sequences of turbo coding.

However, ones of the first set of parity bits of turbo coding are assigned in further part to the fifth bit-places of 9-bit sequences of turbo coding. The bit-map pattern of ONEs and ZEROes in the fifth bit-places overlaps the bit-map pattern of ONEs and ZEROes in the fourth bit-places in such way that transitions between ONEs and ZEROes in the two patterns interleave. Accordingly, confidence levels in the first set of parity bits will be higher when confidence levels in the data bits are low, and vice versa. This is a desirable relationship as between the data bits and the first set of parity bits, presuming particularly that the second set of parity bits and not the first set are generated from the data bits as subjected to turbo-code interleaving.

FIG. 15F shows the bit-map pattern exhibited by bits in the sixth bit-places of 9-bit sequences of turbo coding in the complete cruciform 512QAM symbol constellation map. Further ones of the second set of parity bits of turbo coding are assigned to the sixth bit-places of the 9-bit sequences of turbo coding. Boundaries between ONEs and ZEROes in these sixth bit-places are mostly horizontal. When the confidence levels of bits in these sixth bit-places are low near such horizontal boundaries, which are at the edges of square arrays of sixteen lattice points, the confidence levels of bits in the fourth and fifth bit-places is high. The confidence levels of bits in these sixth bit-places become high within these square arrays, where the confidence levels of bits in the fourth and fifth bit-places are apt to dip low.

FIG. 15G shows the bit-map pattern exhibited by bits in the sixth bit-places of 9-bit sequences of turbo coding in the complete cruciform 512QAM symbol constellation map. The bits of this bit-map pattern were chosen to convey data, partly because this pattern of all the patterns depicted in FIGS. 15A, 15B, 15C, 15D, 15E, 15F, 15G, 15H and 15I is the only one not displaying a noticeable degree of symmetry with one of the other patterns. This bit-map pattern has two vertical boundaries between ONEs and ZEROes. It also has two horizontal boundaries between ONEs and ZEROes.

FIG. 15H shows the bit-map pattern exhibited by bits in the eighth bit-places of 9-bit sequences of turbo coding in the complete cruciform 512QAM symbol constellation map, which pattern has one horizontal boundary between ONEs and ZEROes. FIG. 15I shows the bit-map pattern exhibited by bits in the ninth bit-places of 9-bit sequences of turbo coding in the complete cruciform 512QAM symbol constellation map, which bit-map pattern has one vertical boundary between ONEs and ZEROes. Arbitrary choices were made to use the eighth bit-places of 9-bit sequences of turbo coding to convey ones of the first set of parity bits and to use the ninth bit-places of 9-bit sequences of turbo coding to convey ones of the second set of parity bits. The opposite choices would also result in an acceptable 512QAM symbol constellation map.

Other embodiments of the aspects of the invention involving 512QAM rely on a 512QAM symbol constellation map that differs from one of those described supra, but uses the same set of three bit-maps to convey data bits of one-third-rate bit-wise FEC coding. In some of these alternative 512QAM symbol constellation maps, just the order of the bit-maps to convey data bits of one-third-rate bit-wise FEC coding is changed from what it is in one of the 512QAM symbol constellation maps described supra. In others of these alternative 512QAM symbol constellation maps, just the order of the bit-maps to convey parity bits of one-third-rate bit-wise FEC coding is changed from what it is in one of the 512QAM symbol constellation maps described supra. In yet others of these alternative 512QAM symbol constellation maps, the order of the bit-maps to convey data bits of one-third-rate bit-wise FEC coding is changed from what it is in one of the 512QAM symbol constellation maps described supra; and the order of the bit-maps to convey parity bits of that bit-wise FEC coding is also changed from what it is in one of the 512QAM symbol constellation maps described supra. Still further cruciform 512QAM symbol constellation maps having the particular properties requisite to aspects of the invention involving one-half-rate bit-wise FEC coding are generated by any of the following manipulations of the already-described 512QAM symbol constellation maps or combinations of such manipulations: a 90-degree rotation in symbol space, a 180-degree rotation in symbol space, a 270-degree rotation in symbol space, a right-for-left horizontal flip in symbol space, or a top-for-bottom vertical flip in symbol space.

FIG. 18 shows the initial portion of a receiver designed for stationary iterative-diversity reception of COFDM signals as transmitted at VHF or UHF by a DTV transmitter, such as the one depicted in FIGS. 1 through 4. A reception antenna 49 captures the radio-frequency COFDM signal for application as input signal to a front-end tuner 50 of the receiver. The front-end tuner 50 can be of a double-conversion type composed of initial single-conversion super-heterodyne receiver circuitry for converting radio-frequency (RF) COFDM signal to intermediate-frequency (IF) COFDM signal followed by circuitry for performing a final conversion of the IF COFDM signal to baseband COFDM signal. The initial single-conversion receiver circuitry typically comprises a tunable RF amplifier for RF COFDM signal incoming from the reception antenna, a tunable first local oscillator, a first mixer for heterodyning amplified RF COFDM signal with local oscillations from the first local oscillator to obtain the IF COFDM signal, and an intermediate-frequency (IF) amplifier for the IF COFDM signal. Typically, the front-end tuner 50 further includes a synchronous demodulator for performing the final conversion from IF COFDM signal to baseband COFDM signal and an analog-to-digital converter for digitizing the baseband COFDM signal. Synchronous demodulation circuitry typically comprises a final local oscillator with automatic frequency and phase control (AFPC) of its oscillations, a second mixer for synchrodyning amplified IF COFDM signal with local oscillations from the final local oscillator to obtain the baseband COFDM signal, and a low-pass filter for suppressing image signal accompanying the baseband COFDM signal. In some designs of the front-end tuner 50, synchronous demodulation is performed in the analog regime before subsequent analog-to-digital conversion of the resulting complex baseband COFDM signal. In other designs of the front-end tuner 50 analog-to-digital conversion is performed before synchronous demodulation is performed in the digital regime.

Simply stated, the front-end tuner 50 converts radio-frequency COFDM signal received at its input port to digitized samples of baseband COFDM signal supplied from its output port. Typically, the digitized samples of the real component of the baseband COFDM signal are alternated with digitized samples of the imaginary component of the baseband COFDM signal for arranging the complex baseband COFDM signal in a single stream of digital samples. FIG. 18 shows an AFPC generator 51 for generating the automatic frequency and phase control (AFPC) signal for controlling the final local oscillator within the front-end tuner 50.

The output port of the front-end tuner 50 is connected for supplying digitized samples of baseband COFDM signal to the input port of a cyclic prefix detector 52. The cyclic prefix detector 52 differentially combines the digitized samples of baseband COFDM signal with those samples as delayed by the duration of an effective COFDM symbol. Nulls in the difference signal so generated should occur, marking the guard intervals of the baseband COFDM signal. The nulls are processed to reduce any corruption caused by noise and to generate better-defined indications of the phasing of COFDM symbols. The output port of the cyclic prefix detector 52 is connected to supply these indications to a first of two input ports of timing synchronization apparatus 53.

A first of two output ports of the timing synchronization apparatus 53 is connected for supplying gating control signal to the control input port of a guard-interval-removal unit 54, the signal input port of which is connected for receiving digitized samples of baseband COFDM signal from the output port of the front-end tuner 50. The output port of the guard-interval-removal unit 54 is connected for supplying the input port of an OFDM demodulator 55 with windowed portions of the baseband COFDM signal that contain effective COFDM samples. A second of the output ports of the timing synchronization apparatus 53 is connected for supplying the OFDM demodulator 55 with synchronizing information concerning the effective COFDM samples. OFDM demodulators are customarily designed to be capable of generating complex coordinates of the discrete Fourier transform (DFT) of 2K, 4K or 8K COFDM carriers.

The indications concerning the phasing of COFDM symbols that the cyclic prefix detector 52 supplies to the timing synchronization apparatus 53 is sufficiently accurate for initial windowing of a baseband COFDM signal that the guard-interval-removal unit 54 supplies to the OFDM demodulator 55. A first output port of the OFDM demodulator 55 is connected for supplying demodulated pilot carrier information to the input port of a pilot and TPS carriers processor 56. The information concerning unmodulated pilot carriers is processed in the processor 56 to support more accurate windowing of the baseband COFDM signal that the guard-interval-removal unit 54 supplies to the OFDM demodulator 55. Such processing can be done similarly to the way described by Nicole Alcouffe in US-20030148060-A1 published 24 Jul. 2003 with the title "COFDM demodulator with an optimal FFT analysis window positioning", for example. A first of four output ports of the pilot and TPS carriers processor 56 is connected for supplying more accurate window positioning information to the second input port of the timing synchronization apparatus 53.

The pilot and TPS carriers processor 56 demodulates the TPS information conveyed by modulated pilot signals. The second output port of the pilot and TPS carriers processor 56 is connected for supplying the TPS information to an SMT-MH processing unit 87 shown in FIG. 20.

The third output port of the pilot and TPS carriers processor 56 is connected for forwarding unmodulated pilot carriers to the input port of the AFPC generator 51. The real components of the unmodulated pilot carriers are multiplied by their respective imaginary components in the AFPC generator 51. The resulting products are summed and low-pass filtered to develop the AFPC signal that the AFPC generator 51 supplies to the front-end tuner 50 for controlling the final local oscillator therein. Other ways of developing AFPC signals for the final local oscillator in the front-end tuner 50 are also known, which can replace or supplement the method described above. One such other way is described in U.S. Pat. No. 5,687,165 titled "Transmission system and receiver for orthogonal frequency-division multiplexing signals, having a frequency-synchronization circuit", which was granted to Flavio Daffara and Ottavio Adami on 11 Nov. 1997. Complex digital samples from the tail of each OFDM symbol are multiplied by the conjugates of corresponding digital samples from the cyclic prefix of the OFDM symbol. The resulting products are summed and low-pass filtered to develop the AFPC signal that the AFPC generator 51 supplies to the front-end tuner 50 for controlling the final local oscillator therein.

The fourth output port of the pilot and TPS carriers processor 56 is connected for supplying information concerning the respective energies of unmodulated pilot carriers. This information is supplied to a maximal-ratio QAM combiner 60 shown at the foot of FIG. 18 and in more detail in FIG. 19. The QAM combiner 60 is more fully described further on in this specification. Although not explicitly shown in FIG. 18, the pilot and TPS carriers processor 56 is connected for supplying the OFDM demodulator 55 with control signal for selecting whether to generate complex coordinates of the DFT of 2K, 4K or 8K COFDM carriers, which control signal is generated responsive to TPS information. Ordinarily, the TPS information specifies the DFT with 8K carriers for transmissions intended for reception by stationary DTV receivers.

A second output port of the OFDM demodulator 55 is connected to supply demodulated complex digital samples of 512QAM or 64QAM to a first input port of a frequency-domain channel equalizer 57. FIG. 18 shows the frequency-domain channel equalizer 57 having a second input port connected for receiving pilot carriers supplied from the first input port of the OFDM demodulator 55. A simple form of frequency-domain channel equalizer 57 measures the amplitude of the unmodulated pilot carriers to determine basic weighting coefficients for various portions of the frequency spectrum. The demodulated carriers descriptive of complex coordinates of successive QAM constellations are then multiplied by respective weighting coefficients determined by interpolation among the basic weighting coefficients determined by measuring the amplitudes of the unmodulated pilot carriers. Various alternative types of frequency-domain channel equalizer are also known.

As thusfar described, the FIG. 18 initial portion of a COFDM receiver is similar to the initial portions of COFDM receivers used for DVB in Europe. However, in a departure from customary practice, the response of the frequency-domain channel equalizer 57 is not supplied directly to a de-mapper for the successive QAM constellations. Instead, the maximal-ratio QAM combiner 60 combines delayed QAM constellations from earlier transmissions of time-slices with QAM constellations from later transmissions of the same time-slices. The combining is done in ratio determined by the relative root-mean-square (RMS) energies of the unmodulated pilot carriers that respectively accompany the earlier transmissions of the QAM constellations and the later transmissions of the same QAM constellations. The maximal-ratio QAM combiner 60 is presumably a novel configuration, differing from the ordinary maximal-ratio code combiner used to combine coding recovered from separate receivers of COFDM signals. The ordinary maximal-ratio code combiner combines one-dimensional, real-only codes obtained from separately de-mapping paired QAM constellation maps. The maximal-ratio QAM combiner 60 is a special type of code combiner, which combines the two-dimensional complex coordinates of paired QAM constellation maps to synthesize respective single QAM constellation maps for de-mapping. When both the earlier transmissions of the QAM constellations and the later transmissions of the same QAM constellations are received in strength, the maximal-ratio combining of the two-dimensional coordinates of paired QAM constellation maps permits improvement of coordinates estimation in the presence of additive white Gaussian noise (AWGN). This is because the coordinates of the paired QAM constellation maps should be correlated, while the AWGN is uncorrelated. Accordingly, errors in de-mapping are less likely to occur, as well as gaps in reception tending to be filled. Maximal-ratio code combining after de-mapping QAM symbol constellations tends to fill gaps in reception, but does not improve coordinates estimation of the paired QAM constellation maps in the presence of AWGN. FIG. 19 depicts the maximal-ratio QAM combiner 60 in more detail, as comprising elements 61-69.

FIG. 18 shows how the two-dimensional coordinates of paired QAM constellation maps are supplied to the maximal-ratio QAM combiner 60 as input signals thereto. The output port of the frequency-domain channel equalizer 57 is connected for supplying complex QAM symbol map coordinates to the input port of a selector 58. The selector 58 selectively reproduces at its output port complex 512QAM or 64QAM symbol map coordinates just for those transmissions that are not repeated and the final ones of those transmissions that are repeated for iterative-diversity reception. The output port of the channel equalizer 57 is further connected for supplying complex 512QAM or 64QAM symbol map coordinates to the input port of a selector 59. The selector 59 selectively reproduces at its output port complex 512QAM or 64QAM symbol map coordinates just for the initial ones of those transmissions subsequently repeated for iterative-diversity reception. The output port of the selector 59 is connected for writing to the input port of a delay memory 70 that delays the FEC coding of individual bits of the initial transmissions subsequently once-repeated for iterative-diversity reception. The delay can be prescribed fixed delay or, alternatively, can be programmable responsive to delay specified by bits of TPS coding. In either case, the delay is such that the output port of the delay memory 70 supplies complex symbol map coordinates in the transmissions subsequently repeated for iterative-diversity reception concurrently with the complex symbol map coordinates in the corresponding final transmissions supplied from the output port of the selector 58. The output ports of the selector 58 and the delay memory 70 are connected for supplying final transmissions and delayed initial transmissions of complex QAM symbol map coordinates to be combined by the maximal-ratio QAM combiner 60.

The QAM combiner 60 is connected for receiving pilot-carrier-energy information from the pilot and TPS carriers processor 56 shown in FIG. 18. The pilot and TPS carriers processor 56 squares the real and imaginary terms of each unmodulated pilot carrier, sums the resulting squares and square-roots the sum to determine the root-mean-square (RMS) energy of that unmodulated pilot carrier. This procedure can be carried out for each unmodulated pilot carrier using read-only memory addressed by the real and imaginary terms of each successively considered unmodulated pilot carrier. The RMS energies of the unmodulated pilot carriers are then summed by an accumulator, which determines the total RMS energy of the unmodulated pilot carriers for each OFDM symbol epoch.

FIG. 19 depicts the maximal-ratio QAM combiner 60 in greater detail. The value of the total RMS energy supplied from the pilot and TPS carriers processor 56 is applied to the respective input ports of selectors 61 and 62 in the maximal-ratio QAM combiner 60 as depicted in FIG. 19. The selector 61 selectively reproduces at its output port the total energy of the unmodulated pilot carriers during those transmissions that are not repeated and the final ones of those transmissions repeated for iterative-diversity reception. The selector 62 selectively reproduces at its output port the total energy of the unmodulated pilot carriers during the initial ones of those transmissions repeated for iterative-diversity reception. These operations of the selectors 61 and 62 are controlled responsive to indications conveyed in the TPS carriers. These operations support the complex coordinates of QAM symbols from transmissions that are not repeated, which are supplied to a first of the two input ports of the QAM combiner 60, being reproduced without modification from its output port.

A delay memory 63 is connected for delaying the selector 62 response to supply a delayed selector 62 response that is concurrent with the selector 61 response. The length of delay afforded by the delay memory 63 is essentially the same as the length of delay afforded by the delay memory 70.

A digital adder 64 is connected for adding the selector 61 response and the delayed selector 62 response read from the delay memory 63. The sum output response from the adder 64 combines the total energies of the initial and final transmissions for iterative-diversity reception, to be used for normalizing the weighting of the selector 58 response and the weighting of the delayed selector 59 response read from the delay memory 70. A read-only memory 65 is connected for multiplying soft complex QAM coordinates in the response from the selector 58 by the total energy of a final transmission for iterative-diversity reception. A read-only memory 66 is connected for multiplying the soft complex QAM coordinates read from the delay memory 70 by the total energy of the corresponding initial transmission for iterative-diversity reception.

The soft complex product from the ROM 65 is a weighted response to soft complex QAM coordinates in transmissions that are not repeated and in the final ones of those transmissions repeated for iterative-diversity reception. A read-only memory 67 is connected for normalizing this weighted response with respect to the total energies of the initial and final transmissions for iterative-diversity reception, by dividing the complex product from the ROM 65 by the sum output response from the adder 64.

The soft complex product from the ROM 66 is a weighted response to soft complex QAM coordinates in the initial ones of those transmissions subsequently repeated for iterative-diversity reception. A read-only memory 68 is connected for normalizing this weighted response with respect to the total energies of the initial and final transmissions for iterative-diversity reception, by dividing the complex product from the ROM 66 by the sum output response from the adder 64.

A digital complex adder 69 is connected for summing the respective complex quotients from the ROMs 67 and 68 to synthesize soft complex QAM coordinates that are the maximal-ratio QAM combiner 60 response. One skilled in digital design is apt to perceive that, alternatively, normalization of the coefficients for weighting of the selector 58 response and for weighting of the delayed selector 59 response read from the delay memory 70 can be performed before such weighting, rather than after. A single read-only memory can be designed to perform the combined functions of the ROMs 65 and 67; and a single read-only memory can be designed to perform the combined functions of the ROMs 66 and 68. Alternatively, the ROMs 65, 66, 67 and 68 could be combined with the complex adder 69 in a very large ROM. The computations can be performed by digital circuitry other than ROMs, but problems with proper timing are considerably more difficult.

The operation of the maximal-ratio QAM combiner 60 following a change in RF channel or sub-channel is of interest. Following such a change, a DTV receiver as described supra will not have foregoing initial transmissions for iterative-diversity reception stored in its delay memory 70. Accordingly, the DTV receiver erases the contents of the delay memory 70 in bulk. The pilot and TPS carriers processor 56 will not have supplied the maximal-ratio QAM combiner 60 with information concerning the RMS-energy of pilot carriers accompanying the foregoing initial transmissions for iterative-diversity reception. Accordingly, the DTV receiver erases the contents of delay memory within the maximal-ratio QAM combiner 60 that stores such information. This erasure conditions the maximal-ratio QAM combiner 60 for single-transmission reception until the delay memory 63 therein refills with information concerning the RMS-energy of pilot carriers accompanying the foregoing initial transmissions for iterative-diversity reception. During this delay in the maximal-ratio QAM combiner 60 beginning iterative-diversity reception, the delay memory 70 fills with initial transmissions for iterative-diversity reception, to be supplied with delay to the QAM combiner 60 when iterative-diversity reception begins.

FIG. 19 shows the sum output port of this digital adder 69 connected for supplying the maximal-ratio QAM combiner 60 response to the input port of the de-mapper 71 for successive 512QAM constellations or, alternatively, for successive 64QAM constellations. The de-mapper 71 responds to the soft complex QAM coordinates descriptive of successive 512QAM constellations to recover nine soft bits of bit-interleaved FEC coding from each symbol constellation. Alternatively, the de-mapper 71 responds to the soft complex QAM coordinates descriptive of successive 64QAM constellations to recover six soft bits of bit-interleaved FEC coding from each symbol constellation. In either case, the de-mapper 71 supplies the soft bits of bit-interleaved FEC coding from its output port to the input port of a de-interleaver 403 for the inner bit interleaving introduced in the COFDM transmitter of FIGS. 1 and 2 by the bit interleaver 401 shown in FIG. 2. The output port of the de-interleaver 403 is connected for supplying de-interleaved FEC coding to the input port of a soft-input/soft-output turbo decoder 72. The SISO turbo decoder 72 is operable for decoding the one-third-rate FEC coding of data bits—e.g., as introduced by the encoder 10 in the FIG. 2 portion of the DTV transmitter.

FIG. 19 shows the output port of the turbo decoder 72 connected for supplying the soft data bits of its decoding results to the input port of a de-interleaver 73 for de-interleaving the convolutional byte interleaving of 8-bit bytes introduced at the DTV transmitter—e.g., as introduced by the convolutional byte interleaver 7 shown in FIG. 1. The output port of the byte de-interleaver 73 is connected for supplying soft data bits without byte interleaving to the input port of a quantizer 74 shown in FIG. 20. These soft data bits are also supplied to a bank 75 of exclusive-OR gates shown in FIG. 20. The byte de-interleaver 73 processes soft data bits, so its memory requirements are apparently quite large. However, the turbo decoder 72 usually includes memory for the soft bits in an entire time-slice, which memory supports iterative-decoding procedures. In actual practice, appropriate addressing of this memory within the turbo decoder 72 is apt to perform the byte de-interleaving function that FIG. 19 shows the separate byte de-interleaver 73 for performing.

In the prior art DTV receivers of COFDM signals, the RS decoders for (204, 188) Reed-Solomon coding used decoding algorithms that located byte errors, besides subsequently correcting them. These decoding algorithms are capable of correcting no more than eight byte errors. If an RS decoder for (204, 188) Reed-Solomon coding is supplied the locations of byte errors by external means, it can employ a decoding algorithm that is capable of correcting up to sixteen byte errors. The soft data bits supplied from the cascaded turbo decoder 72 and byte de-interleaver 73 shown in FIG. 19 contain confidence-level information that can be analyzed to locate byte errors for RS decoding. The bank 75 of exclusive-OR gates shown in FIG. 20 exclusively-ORs the hard data bit of each soft data bit with the remaining bits of that soft bit expressive of the level of confidence that the hard data bit is correct. The result of this operation is the generation of a plurality of bits expressing in absolute terms the level of lack of confidence that the hard data bit is correct. A selector 76 selects the largest level of lack of confidence in the bits of each successive 8-bit byte, to express the lack of confidence in the correctness of the byte considered as a whole. An adaptive threshold detector 77 compares the levels of lack of confidence for each byte in each successive (204, 188) Reed-Solomon codeword to a threshold value to generate a byte error indication for each byte having a level of lack of confidence that exceeds the threshold value. The adaptive threshold detector 77 adjusts the threshold value for each (204, 188) Reed-Solomon codeword individually, when necessary, so the number of byte errors in the codeword is no more than sixteen. The adaptive threshold detector 77 then supplies an LRS decoder 79 with indications of the locations of the byte errors in the (204, 188) lateral Reed-Solomon (LRS) codeword that is to be corrected next. The above-referenced U.S. patent application Ser. No. 13/13/555,114 filed 21 Jul. 2012 includes a detailed description of representative structure for such an adaptive threshold detector, as depicted in FIG. 18 of its drawing.

FIG. 20 shows the output port of the quantizer 74 connected for supplying hard decisions concerning de-interleaved soft data bits to the input port of an 8-bit byte former 78. The output port of the 8-bit byte former 78 is connected for supplying the input port of the LRS decoder 79 with 8-bit bytes formed from these hard decisions. The quantizer 74 can generate the hard decisions simply, by just discarding bits descriptive of levels of confidence that the hard data bit component of each soft data bit is correct. FIG. 20 shows the output port of the LRS decoder 79 is connected for supplying the input port of a convolutional byte interleaver 791 with (204, 188) LRS codewords that the LRS decoder 79 has corrected insofar as it can. FIG. 20 also shows the output port of the convolutional byte interleaver 791 connected for supplying data-randomized IPE packets to the input port of a data de-randomizer 80. The data de-randomizer 80 de-randomizes the final 187 bytes of each of those packets to recover a succession of IPE packets.

However, if the convolutional byte interleaving performed at the transmitter is not coded byte interleaving, the convolutional byte interleaver 791 is replaced by direct connection of the output port of the LRS decoder 79 to the input port of a data de-randomizer 80. The LRS decoder 79 supplies the data de-randomizer 80 with data-randomized MPEG-2 transport-stream packets extracted from (204, 188) LRS codewords that the LRS decoder 79 has corrected insofar as it can. The data de-randomizer 80 de-randomizes the final 187 bytes of each of those packets to recover a succession of MPEG-2 transport-stream packets.

The data de-randomizer 80 is connected to supply IPE packets or other MPEG-2 transport-stream packets to a detector 81 of a "well-known" SMT-MH address and to a delay unit 82. The delay unit 82 delays the MPEG-2 transport-stream (TS) packets supplied to a packet selector 83 for selecting SMT-MH packets from other TS packets. The delay unit 82 provides delay of a part of a TS-packet header interval, which delay is long enough for the detector 81 to ascertain whether or not the "well-known" SMT-MH address is detected.

If the detector 81 does not detect the "well-known" SMT-MH address in the TS packet, the detector 81 output response conditions the packet selector 83 to reproduce the TS packet for application to a packet sorter 84 as input signal thereto. The packet sorter 84 sorts out each TS packet in which the transport-error-indication (TEI) bit is ZERO-valued for writing to a cache memory 85 for TS packets. A ZERO-valued TEI bit in the header of each TS packet header will have been toggled to a ONE if it was not successfully decoded by the RS decoder 79. The cache memory 85 temporarily stores those TS packets in which the TEI bit is ZERO-valued, for possible future reading to the later stages 86 of the receiver.

If the detector 81 does detect the "well-known" SMT-MH address in the TS packet, establishing it as an SMT-MH packet, the detector 81 output response conditions the packet selector 83 to reproduce the SMT-MH packet for application to an SMT-MH processing unit 87, which includes circuitry for generating control signals for the later stages 86 of the M/H receiver. FIG. 20 shows the SMT-MH processing unit 87 connected for receiving Fast Information Channel (FIC) information from the TPS carriers processor 56 in FIG. 18. The SMT-MH processing unit 87 integrates this FIC information with information from SMT-MH packets during the generation of Service Map Data. The Service Map Data generated by the SMT-MH processing unit 87 is written into memory 88 for temporary storage therein and subsequent application to the later stages 86 of the M/H receiver. The SMT-MH processing unit 87 relays those SMT-MH packets that have ZERO-valued TEI bits to a user interface 89, which typically includes an Electronic Service Guide (ESG) and apparatus for selectively displaying the ESG on the viewing screen of the M/H receiver. A patent application filed for A. L. R. Limberg, published 11 Mar. 2010 as US-2010-0061465-A1, and titled "Sub-channel Acquisition in a Digital Television Receiver Designed to Receive Mobile/Handheld Signals" provides more detailed descriptions of the operations of the portion of an M/H receiver as shown in FIG. 20. The description with reference to the drawing FIGS. 12, 13 and 14 of that application describe operations relying on the SMT-MH tables available in A/153.

FIG. 21 shows details of one way to construct the species of the FIG. 19 de-mapper 71 used for de-mapping square 64QAM symbol constellations. This species of the de-mapper 71 comprises elements 90-103. The element 90 is read-only memory storing 6-bit sequences of hard-decisions regarding the mapping of square 64QAM symbol constellations. The elements 91, 92, 93, 94, 94, 95 and 96 are read-only memories storing log-likelihood ratio (LLR) metrics for respective ones of six soft-decision bits, each of which soft-decision bits includes a respective one of the six hard-decision bits read from the ROM 90. The element 97 is a set of registers for converting sets of six soft-decision bits from the ROMs 91, 92, 93, 94, 94, 95 and 96 to serial 3-bit symbols of bit-interleaved turbo coding, for application to the input port of the de-interleaver 403 for inner bit interleaving.

The element 98 is an 8-bin data-slicer connected to respond to the I-axis coordinates of the 64QAM symbol constellations supplied as the real part of the complex sum output signal from the digital adder 69 in the maximal-ratio QAM combiner 60. Responsive to these I-axis coordinates, the data-slicer 98 generates a first set of 3-bit partial addresses for the ROM 90. The element 99 is an 8-bin data-slicer connected to respond to the Q-axis coordinates of the 64QAM symbol constellations supplied as the imaginary part of the complex sum output signal from the digital adder 69 in the maximal-ratio QAM combiner 60. Responsive to these Q-axis coordinates, the data-slicer 99 generates a second set of 3-bit partial addresses for the ROM 90. The respective 3-bit partial addresses concurrently generated by the data-slicer 98 and by the data-slicer 99 together supply the ROM 90 with complete 6-bit addresses for de-mapping successive 64QAM symbol constellations. These 64QAM symbol constellations are mapped according to FIG. 9, by way of example.

The LLR metrics stored in the ROMs 91, 92, 93, 94, 95 and 96 exhibit quadrantal symmetry in a QAM symbol constellation. Therefore, the partial addressing of the ROMs 91, 92, 93, 94, 95 and 96 for specifying the LLR metrics can be determined from the absolute values of the I-axis and Q-axis coordinates of a point within the QAM symbol constellation. These distances from the I and Q axes indirectly specify the distances of that point to boundaries within the constellation where changes occur in each of the bit-places of the information coded within regions of the constellation.

The element 100 is an absolute-value former for exclusive-ORing the sign bit of the I-axis coordinate of the QAM symbol constellation with the remaining bits of that coordinate. This generates an indication of how far the real component of the complex sum from the adder 69 extends into a quadrant of that constellation. The element 101 is a 32-bin data-slicer connected to respond to the absolute-value former 100 response to generate 5-bit normalized absolute-value I-axis coordinates that are applied as partial addresses to the ROMs 91, 92 and 93. The 5-bit normalized absolute-value I-axis coordinates are not applied as partial addressing to the ROMs 94, 95 and 96 since the fourth bit, the fifth bit and the sixth bit of the information coded within regions of the constellation do not change with change in the I-axis coordinate.

The element 102 is an absolute-value former for exclusive-ORing the sign bit of the Q-axis coordinate of the QAM symbol constellation with the remaining bits of that coordinate. This generates an indication of how far the imaginary component of the complex sum from the adder 69 extends into a quadrant of that constellation. The element 103 is a 32-bin data-slicer connected to respond to the absolute-value former 102 response to generate 5-bit normalized absolute-value Q-axis coordinates that are applied as partial addresses to the ROMs 94, 95 and 96. The 5-bit normalized absolute-value Q-axis coordinates are not applied as partial addressing to the ROMs 91, 92 and 93 since the first bit, the second bit and the third bit of the information coded within regions of the constellation do not change with change in the Q-axis coordinate.

The ROMs 91, 92 and 93 can be portions of a single read-only memory addressed by three bits from the ROM 90 and 5-bit normalized absolute-value I-axis coordinates from the 32-bin data-slicer 101. The ROMs 94, 95 and 96 can be portions of a single read-only memory addressed by three bits from the ROM 90 and 5-bit normalized absolute-value Q-axis coordinates from the 32-bin data-slicer 103. In another alternative construction, a single read-only memory replaces the ROMs 90, 91, 92, 93, 94, 95 and 96. Methods for computing the soft-decision metrics stored in the ROMS are known in the art. E. g., see Pat. App. US-2009/0323846-A1 published 31 Dec. 2009 for N. Sindhushayana and titled "Method and apparatus for computing soft decision input metrics to a turbo decoder".

FIG. 22 shows details of one way to construct the species of the FIG. 19 de-mapper 71 used for de-mapping cruciform 512QAM symbol constellations. This species of the de-mapper 71 comprises elements 104-120. The element 110 is read-only memory storing 9-bit sequences of hard-decisions regarding the mapping of square 512QAM symbol constellations. The elements 111, 112, 113, 114, 115, 116, 117, 118 and 119 are read-only memories storing log-likelihood ratio (LLR) metrics for respective ones of nine soft-decision bits, each of which soft-decision bits includes a respective one of the nine hard-decision bits read from the ROM 110. The element 120 is a set of registers for converting sets of nine soft-decision bits from the ROMs 111, 112, 113, 114, 115, 116, 117, 118 and 119 to serial symbols of bit-interleaved turbo coding, for application to the input port of the deinterleaver 403 for inner bit interleaving.

The element 104 is a 24-bin data-slicer connected to respond to the I-axis coordinates of the 512QAM symbol constellations supplied as the real part of the complex sum output signal from the digital adder 169 in the maximal-ratio QAM combiner 160. Responsive to these I-axis coordinates, the data-slicer 104 generates a first set of 5-bit partial addresses for the ROM 110. The element 105 is a 24-bin data-slicer connected to respond to the Q-axis coordinates of the 512QAM symbol constellations supplied as the imaginary part of the complex sum output signal from the digital adder 169 in the maximal-ratio QAM combiner 160. Responsive to these Q-axis coordinates, the data-slicer 105 generates a second set of 5-bit partial addresses for the ROM 110. The 5-bit partial addresses concurrently generated by the data-slicer 104 and by the data-slicer 105 together supply the ROM 110 with complete 10-bit addresses for de-mapping successive 512QAM symbol constellations. These 512QAM symbol constellations are mapped according to FIGS. 14A, 14B, 14C, 14D and 13, by way of example.

The LLR metrics regarding respective bits of the 3-bit suffixes that the ROMs 113, 116 and 117 store vary both with changing I-axis coordinates and with changing Q-axis coordinates. So, each of the ROMs 113, 116 and 117 has two additional partial addresses supplied to it besides a respective bit from the ROM 110. The LLR metrics regarding respective bits of the 3-bit suffixes that the ROMs 111, 112 and 119 store vary with changing I-axis coordinates, but not with changing Q-axis coordinates. The LLR metrics regarding respective bits of the 3-bit suffixes that the ROMs 114, 115 and 118 store vary with changing Q-axis coordinates, but not with changing I-axis coordinates. So, each of the ROMs 111, 112, 114, 115, 118 and 119 has a single additional partial address supplied to it besides a respective bit from the ROM 110. The LLR metrics stored in the ROMs 111, 112, 113, 114, 115, 116, 117, 118 and 119 all exhibit quadrantal symmetry in regard to the cruciform 512QAM symbol constellation shown in FIGS. 12A, 12B, 12C and 12D.

The LLR metrics stored in the ROMs 111, 112, 113, 116, 117 and 119 all exhibit symmetry for −I and +I halves of the cruciform 512QAM symbol constellation. Therefore, partial addressing of these ROMs can be determined from the absolute values of the I-axis coordinates of a point within the 512QAM symbol constellation. The distance from the Q axis indirectly specifies the distances of that point to boundaries within the constellation where changes occur in each of the first, second, third, sixth, seventh and ninth bit-places of the information coded within regions of the constellation. The element 106 is an absolute-value former for exclusive-ORing the sign bit of the I-axis coordinate of the QAM symbol constellation with the remaining bits of that coordinate. This generates an indication of how far the real component of the complex sum from the adder 69 extends into a quadrant of that constellation. The element 107 is a 96-bin data-slicer connected to respond to the absolute-value former 106 response to generate 7-bit normalized absolute-value Q-axis coordinates that are applied as partial addresses to the ROMs 111, 112, 113, 116, 117 and 119. Since the fourth, fifth and the eighth bits of the information coded within regions of the constellation do not change with change in the I-axis coordinate, the 7-bit normalized absolute-value I-axis coordinates are not applied as partial addressing to the ROMs 114, 115 and 118.

The LLR metrics stored in the ROMs 113, 114, 115, 116, 117 and 118 exhibit symmetry for −Q and +Q halves of the cruciform 512QAM symbol constellation. Therefore, partial addressing of these ROMs can be determined from the absolute values of the Q-axis coordinates of a point within the 512QAM symbol constellation. The distance from the I axis indirectly specifies the distances of that point to boundaries within the constellation where changes occur in each of the third, fourth, fifth, sixth, seventh and eighth bit-places of the information coded within regions of the constellation. The element 108 is an absolute-value former for exclusive-ORing the sign bit of the Q-axis coordinate of the QAM symbol constellation with the remaining bits of that coordinate. This generates an indication of how far the imaginary component of the complex sum from the adder 69 extends into a quadrant of that constellation. The element 109 is a 96-bin data-slicer connected to respond to the absolute-value former 108 response to generate 7-bit normalized absolute-value Q-axis coordinates that are applied as partial addresses to the ROMs 113, 114, 115, 116, 117 and 118. Since the first, second and ninth bits of the information coded within regions of the constellation do not change with change in the Q-axis coordinate, the 7-bit normalized absolute-value Q-axis coordinates are not applied as partial addressing to the ROMs 111, 112 and 119.

The ROMs 113, 116 and 117 can be portions of a single read-only memory addressed by five bits from the ROM 110, the 7-bit normalized absolute-value I-axis coordinates from the 96-bin data-slicer 107, and the 7-bit normalized absolute-value Q-axis coordinates from the 96-bin data-slicer 109. The ROMs 111, 112 and 119 can be portions of a single read-only memory addressed by two bits from the ROM 110 and the 7-bit normalized absolute-value I-axis coordinates from the 96-bin data-slicer 107. The ROMs 114, 115 and 118 can be portions of a single read-only memory addressed by two bits from the ROM 110 and the 7-bit normalized absolute-value Q-axis coordinates from the 96-bin data-slicer 107. In another alternative construction, a single read-only memory replaces the ROMs 110, 111, 112, 113, 114, 115, 116, 117, 118 and 119.

FIGS. 23, 24, 25 and 26 together provide a generic schematic diagram of an M/H DTV receiver adapted for iterative-diversity reception of COFDM signals as transmitted at VHF or UHF by a DTV transmitter, such as the one depicted in FIGS. 1 through 4. COFDM transmissions to M/H DTV receivers are presumed to employ 64QAM symbol constellations, rather than the 512QAM symbol constellations used in transmissions to stationary DTV receivers. Rather than the 8000 or so carrier waves in the COFDM used in transmissions to stationary DTV receivers, the COFDM used in transmissions to M/H DTV receivers only uses 4000 or so carrier waves. The portion of the M/H DTV receiver shown in FIG. 23 differs from the portion of the stationary DTV receiver shown in FIG. 18 insofar as needed to take these differences into account. Elements 150, 151, 152, 153, 154, 155, 156, 157 and 159 shown in FIG. 23 correspond in general function to elements 50, 51, 52, 53, 54, 55, 56, 57 and 59, respectively, shown in FIG. 18.

FIG. 23 shows the initial portion of an M/H DTV receiver designed for iterative-diversity reception of COFDM signals as transmitted at VHF or UHF by a DTV transmitter, such as the one depicted in FIGS. 1 through 4. A reception antenna 149 captures the radio-frequency COFDM signal for application as input signal to a front-end tuner 150 of the receiver. The reception antenna 149 for an M/H DTV receiver usually differs in its structure from the antenna 49 for a stationary DTV receiver and is apt to be incorporated into the structure of a vehicle. In FIG. 23 the output port of the front-end tuner 150 is connected for supplying digitized samples of baseband COFDM signal to the input port of a cyclic prefix detector 152. The output port of the cyclic prefix detector 152 is connected to supply indications of the phasing of COFDM symbols to a first of two input ports of timing synchronization apparatus 153. A first of two output ports of the timing synchronization apparatus 153 is connected for supplying gating control signal to the control input port of a guard-interval-removal unit 154. The signal input port of the guard-interval-removal unit 154 is connected for receiving digitized samples of baseband COFDM signal from the output port of the front-end tuner 150. The output port of the guard-interval-removal unit 154 is connected for supplying the input port of an OFDM demodulator 155 with windowed portions of the baseband COFDM signal that contain effective COFDM samples. A second of the output ports of the timing synchronization apparatus 153 is connected for supplying the OFDM demodulator 155 with synchronizing information concerning the effective COFDM samples.

A first output port of the OFDM demodulator 155 is connected for supplying demodulated pilot carrier information to the input port of a pilot and TPS carriers processor 156. A first of four output ports of the pilot and TPS carriers processor 156 is connected for supplying more accurate window positioning information to the second input port of the timing synchronization apparatus 153. The second output port of the pilot and TPS carriers processor 156 is connected for supplying the TPS information to an SMT-MH processing unit 187 shown in FIG. 26. The third output port of the pilot and TPS carriers processor 156 is connected for forwarding unmodulated pilot carriers to the input port of an AFPC generator 151 that supplies AFPC signal to the front-end tuner 150 for controlling the final local oscillator therein. The fourth output port of the pilot and TPS carriers processor 156 is connected for supplying information concerning the respective energies of unmodulated pilot carriers to a maximal-ratio QAM combiner 160. The maximal-ratio QAM combiner 160 is shown in more detail in FIG. 24 as comprising elements 161-169. Although not explicitly shown in FIG. 23, the pilot and TPS carriers processor 156 is connected for supplying the OFDM demodulator 155 with control signal for selecting whether to generate complex coordinates of the DFT of 2K, 4K or 8K COFDM carriers, which control signal is generated responsive to TPS information. Ordinarily, the TPS information specifies the DFT with 4K carriers for transmissions intended for reception by M/H DTV receivers.

A second output port of the OFDM demodulator 155 is connected to supply demodulated complex digital samples of 64QAM to a first input port of a frequency-domain channel equalizer 157. FIG. 23 shows the frequency-domain channel equalizer 157 having a second input port connected for receiving pilot carriers supplied from the first input port of the OFDM demodulator 155. The output port of the channel equalizer 157 is connected for supplying equalized demodulated carriers conveying the complex coordinates of successive 64QAM constellations, which will be processed by the maximal-ratio QAM combiner 160 to synthesize a reduced number of successive 64QAM symbol constellations. The 64QAM symbol constellations synthesized by the QAM combiner 160 are supplied to the input port of a de-mapper 171 for such symbol constellations. The de-mapper 171 which is depicted in FIG. 23, is operable for reproducing at an output port thereof the FEC coding of individual bits supplied as response from the encoder 37 in the FIG. 4 portion of the DTV transmitter.

The FIG. 24 portion of the M/H DTV receiver is similar to the FIG. 19 portion of the stationary DTV receiver. The operation of the maximal-ratio QAM combiner 160 is similar to that of the maximal-ratio QAM combiner 60. The structure of the QAM combiner 160 is similar to that of the QAM combiner 60, as constructed to supply complex coordinates of 64QAM symbol constellations to the de-mapper 71 with six bits or more resolution. The calculations performed by the elements 165, 166, 167, 168 and 169 in the maximal-ratio QAM combiner 160 are each complex in nature, involving imaginary as well as real components. Elements 165, 166, 167, 168 and 169 of the QAM combiner 160 are apt to offer two bits less resolution than the elements 65, 66, 67, 68 and 69 of the QAM combiner 60, as constructed to supply complex coordinates of 512QAM symbol constellations to the de-mapper 71.

The QAM combiner 160 is connected for receiving pilot-carrier-energy information from the pilot and TPS carriers processor 156 shown in FIG. 23. The pilot and TPS carriers processor 156 squares the real and imaginary terms of each unmodulated pilot carrier, sums the resulting squares and square-roots the sum to determine the root-mean-square (RMS) energy of that unmodulated pilot carrier. This procedure can be carried out for each unmodulated pilot carrier using read-only memory addressed by the real and imaginary terms of each successively considered unmodulated pilot carrier. The RMS energies of the unmodulated pilot carriers are then summed by an accumulator, which determines the total RMS energy of the unmodulated pilot carriers for each OFDM symbol epoch.

The value of the total RMS energy supplied from the pilot and TPS carriers processor 156 is applied to the respective input ports of selectors 161 and 162 in the QAM combiner 160 as shown in FIG. 24. The selector 161 selectively reproduces at its output port the total energy of the unmodulated pilot carriers during those transmissions that are not repeated and during the final ones of those transmissions repeated for iterative-diversity reception. At all other times, the selector 161 supplies a zero value at its output port. The selector 162 selectively reproduces at its output port the total energy of the unmodulated pilot carriers during the initial ones of those transmissions repeated for iterative-diversity reception. At all other times, the selector 162 supplies a zero value at its output port. These operations of the selectors 161 and 162 are controlled responsive to indications conveyed in the TPS carriers. These operations support generation of complex coordinates of QAM symbols in the transmissions that are not repeated, which are supplied to a first of the two input ports of the QAM combiner 160, being reproduced without modification from its output port.

A delay memory 163 is connected for delaying the selector 162 response to supply a delayed selector 162 response that is concurrent with the selector 161 response. The length of delay that the delay memory 163 affords is essentially the same as that afforded by the delay memory 170.

A digital adder 164 is connected for adding the selector 161 response and the delayed selector 162 response read from the delay memory 163. The sum output response from the adder 164 combines the total energies of the initial and final transmissions for iterative-diversity reception, to be used for normalizing the weighting of the selector 158 response and the weighting of the delayed selector 159 response read from the delay memory 170. A read-only memory 165 is connected for multiplying soft complex QAM coordinates in the response from the selector 158 by the total energy of a final transmission for iterative-diversity reception. A read-only memory 166 is connected for multiplying the soft complex QAM coordinates read from the delay memory 170 by the total energy of the corresponding initial transmission for iterative-diversity reception.

The soft complex product from the ROM 165 is a weighted response to soft complex QAM coordinates in transmissions that are not repeated and in the final ones of those transmissions repeated for iterative-diversity reception. A read-only memory 167 is connected for normalizing this weighted response with respect to the total energies of the initial and final transmissions for iterative-diversity reception, by dividing the complex product from the ROM 165 by the sum output response from the adder 164.

The soft complex product from the ROM 166 is a weighted response to soft complex QAM coordinates in the initial ones of those transmissions subsequently repeated for iterative-diversity reception. A read-only memory 168 is connected for normalizing this weighted response with respect to the total energies of the initial and final transmissions for iterative-diversity reception, by dividing the complex product from the ROM 166 by the sum output response from the adder 164.

A digital complex adder 169 is connected for summing the respective complex quotients from the ROMs 167 and 168 to synthesize soft complex QAM coordinates that are the maximal-ratio QAM combiner 160 response, which is supplied to the input port of the de-mapper 171 for successive 64QAM constellations. The de-mapper 171 responds to the soft complex QAM coordinates descriptive of successive 64QAM constellations to recover six soft bits of bit-interleaved FEC coding from each constellation, supplied from its output port to the input port of a de-interleaver 404 for the inner bit interleaving of FEC coding. The output port of the de-interleaver 404 is connected for supplying soft bits of de-interleaved FEC coding to the input port of a soft-input/soft-output decoder 172 depicted in FIG. 24. One skilled in digital design is apt to perceive that, alternatively, normalization of the coefficients for weighting of the selector 158 response and for weighting of the delayed selector 159 response read from the delay memory 170 can be performed before such weighting, rather than after. A single read-only memory can be designed to perform the combined functions of the ROMs 165 and 167; and a single read-only memory can be designed to perform the combined functions of the ROMs 166 and 168. Alternatively, the ROMs 165, 166, 167 and 168 could be combined with the complex adder 169 in a very large ROM. The computations can be performed by digital circuitry other than ROMs, but problems with proper timing are considerably more difficult.

FIG. 24 shows the output port of the turbo decoder 172 connected for supplying the soft data bits of its decoding results to the input port of the de-interleaver 173 for de-interleaving the convolutional byte interleaving of 8-bit bytes introduced at the DTV transmitter—e.g., as introduced by the convolutional byte interleaver 7 shown in FIG. 1. The output port of the byte de-interleaver 173 is connected for supplying soft data bits without byte interleaving to the input port of the quantizer 174 shown in FIG. 25. These soft data bits are also supplied to the bank 175 of exclusive-OR gates shown in FIG. 25. In actual practice, appropriate addressing of memory within the turbo decoder 172 is apt to perform the byte de-interleaving function that FIG. 24 shows the byte de-interleaver 173 for performing.

FIG. 25 shows an 8-bit-byte former 178 connected for forming the serial-bit response of the quantizer 174 into eight-bit bytes. An extended-byte former 177 is connected for receiving the 8-bit bytes formed by the 8-bit-byte former 178 and appending to each of those bytes a number of bits indicative of the likelihood that that byte is in error. These bits indicative of the level of lack of confidence that a byte is correct are generated in the following way. The bank 175 of exclusive-OR gates is connected for exclusive-ORing the hard bit of each successive soft data bit supplied from the cascaded turbo decoder 172 and byte de-interleaver 173 with each of the soft bits descriptive of the level of confidence that hard bit is correct. The bank 175 of XOR gates thus generates a respective set of bits indicative of the level of lack of confidence that each successive hard bit is correct. A selector 176 selects the largest of the successive lack-of-confidence levels regarding the eight bits in each 8-bit-byte, to determine a level of lack of confidence that the byte is correct. The selector 176 provides an extended-byte former 177 with bits indicative of the level of lack of confidence that the byte is correct, which bits are appended to the byte to generate an extended-byte. Typically, there are four to eight bits in the byte extensions. The output port of the extended-byte former 177 is connected for supplying successive extended-bytes to the input port of an LRS decoder 179 for (204, 188) lateral Reed-Solomon (LRS) coding.

The LRS decoder 179 is of the type that uses a decoding algorithm for correcting up to sixteen byte errors in each (204, 188) Reed-Solomon codeword, but requires that byte errors be located by means other than that decoding algorithm. Accordingly, the LRS decoder 179 can include a threshold detector that compares the levels of lack of confidence for each byte in each successive (204, 188) LRS codeword to a threshold value. This threshold detector generates a byte error indication for each byte having a level of lack of confidence that exceeds the threshold value. The threshold detector then provides the LRS decoder 179 with indications of the locations of the byte errors in the (204, 188) LRS codeword next to be corrected. The LRS decoder 179 is unusual also in that it is provided capability for adjusting the extension of each byte in the 188-byte IPE packets in the decoding results therefrom.

FIG. 25 shows the output port of the LRS decoder 179, which supplies (204, 188) LRS codewords that are corrected insofar as the LRS decoder 179 can, connected to the input port of a convolutional byte interleaver 792. Each byte supplied from the LRS decoder 179 is accompanied by a byte extension indicative of the level of lack of confidence in that byte being correct. If the RS decoder 179 was capable of correcting a (204, 188) LRS codeword, its byte extensions are zero-valued, indicating no lack of confidence in its bytes being correct. If the RS decoder 179 was incapable of correcting a (204, 188) LRS codeword, its byte extensions retain the values they had upon entry into the LRS decoder 179. The convolutional byte interleaver 792 preserves these byte extensions during byte interleaving, so they still accompany respective bytes in response from the convolutional byte interleaver 792. FIG. 25 shows the output port of the convolutional byte interleaver 792 connected for supplying the extended bytes of this response to an input port of a random-access memory 121. This input port is a random-access write-input port through which extended bytes are written to respective extended-byte storage locations within the extended-byte-organized RAM 121. If the convolutional byte interleaving performed at the transmitter is not coded byte interleaving, the convolutional byte interleaver 792 is replaced by direct connection from the output port of the LRS decoder 179 to this write-input port of the RAM 121. In either of these alternatives the write-input port of the RAM 121 is supplied successive 184-byte groups of randomized data from respective IPE packets. FIG. 25 shows the convolutional byte interleaver 792 as an aid for understanding the operation of writing extended bytes to rows of respective extended-byte storage locations within the extended-byte-organized RAM 121, columns of which extended-byte storage locations are subsequently read from to a TRS decoder 122 for (255, 191)

outer RS codewords in the MPE-FEC frame. In actual practice the convolutional byte interleaving subsequent to the LRS decoder 179 is performed simply by suitable addressing of the RAM 121 during the writing of its extended-byte storage locations.

In DVB-H the number of (255, 191) outer RS codewords in the MPE-FEC frame is signaled in the service information (SI) and may take any of the values 256, 512, 768, or 1024. In a newly developed system using COFDM for DTV broadcasting in the United States of America, it will be preferable if the number of (255, 191) outer RS codewords in the MPE-FEC frame were to be multiples of 187, rather than multiples of 256. The reason is that this makes it much, much simpler to perform 2-dimensional decoding of the cross-interleaved RS coding (CIRC) in a DTV receiver. The extended bytes that result from "soft" decoding the inner convolutional coding or other bit-wise FEC coding, when written to rows of extended-byte storage locations in a framestore memory, can then be aligned so that parity bytes of the inner RS coding are confined to columns of extended-byte storage locations separate from those containing the (255, 191) codewords of the outer RS coding. This considerably simplifies the addressing of such framestore memory during its writing and reading operations.

Presuming that the number of (255, 191) outer RS codewords in the MPE-FEC frame is a multiple of 187, the extended bytes of each IPE packet are written into a successive respective row of extended-byte storage locations in the random-access memory 121, which is operated to perform the matrix-type block de-interleaving procedure that is a first step of the TRS decoding routine. The RAM 121 is subsequently read one column of extended bytes at a time to the TRS decoder 122 of (255, 191) transverse Reed-Solomon (TRS) coding. The extension bits accompanying the 8-bit bytes of the TRS coding are used to help locate byte errors for the TRS coding, as will be described in further detail infra with reference to FIG. 27. Such previous location of byte errors facilitates successful use of a Reed-Solomon erasure decoding algorithm capable of correcting more byte errors than an algorithm that must locate byte errors as well as correct them. The 8-bit data bytes that have been corrected insofar as possible by the TRS decoder 122 are written, column by column, into respective columns of byte-storage locations of a byte-organized random-access memory 123. In further steps of the TRS decoding routine, the RAM 123 is operated to perform the matrix-type block re-interleaving procedure for data. In a final step of the TRS decoding routine, the byte-storage locations in the RAM 123 are read from row by row for supplying reproduced randomized M/H data to the input port of a data de-randomizer 124 in the FIG. 26 portion of the M/H receiver.

Referring now to FIG. 26, the data de-randomizer 124 is connected for receiving the output signal read from the byte-organized RAM 123 in FIG. 25. The data de-randomizer 124 de-randomizes the bytes of that signal by converting them to serial-bit form and exclusive-ORing the bits with the pseudo-random binary sequence (PRBS) prescribed for data randomization. The data de-randomizer 124 then converts the de-randomized bits into successive bytes of IP data. From this point on, the receiver resembles a mobile/handheld (M/H) receiver for M/H transmissions made using 8VSB specified by the standard directed to broadcasting digital television and digital data to M/H receivers adopted by ATSC on 15 Oct. 2009. The IP data essentially correspond to the IP data an M/H receiver recovers from M/H transmissions using 8VSB.

The input port of a parsing unit 125 for parsing the data stream into internet-protocol (IP) packets is connected for receiving bytes of IP data from the output port of the data de-randomizer 124. The IP-packet parsing unit 125 performs this parsing responsive to two-byte row headers respectively transmitted at the beginning of each row of IP data in the FEC frame. Each such row header indicates where the earliest start of an IP packet occurs within the row of IP data bytes from the FEC frame. If a short IP packet is completely contained within a row of bytes within the FEC frame, the IP-packet parsing unit 125 calculates the start of a later IP packet. This calculation proceeds from the packet length information contained in the earlier IP packet from that same row of bytes within the FEC frame.

The IP-packet parsing unit 125 is connected for supplying IP packets to a decoder 126 for cyclic-redundancy-check (CRC) coding in IP packets. Each IP packet begins with a nine-byte header and concludes with a four-byte, 32-bit checksum for CRC coding that IP packet. The decoder 126 is constructed to preface each IP packet that it reproduces with a prefix bit indicating whether or not error has been detected in that IP packet. The decoder 126 is connected to supply these IP packets as so prefaced to a detector 181 of a "well-known" SMT-MH address and to a delay unit 182. The delay unit 182 delays the IP packets supplied to a packet selector 183 for selecting SMT-MH packets from other IP packets. The delay unit 182 provides delay of a part of an IP packet header interval, which delay is long enough for the detector 181 to ascertain whether or not the "well-known" SMT-MH address is detected.

If the detector 181 does not detect the "well-known" SMT-MH address in the IP packet, the detector 181 output response conditions the packet selector 183 to reproduce the IP packet for application to a packet sorter 184 as input signal thereto. The packet sorter 184 sorts out those IP packets in which the preface provides no indication of CRC coding error for writing to a cache memory 185 for IP packets. The prefatory prefix bit before each of the IP packets that indicates whether there is CRC code error in its respective bytes is omitted when writing the cache memory 185. The cache memory 185 temporarily stores at least those IP packets not determined to contain CRC code error for possible future reading to the later stages 186 of the receiver.

If the detector 181 does detect the "well-known" SMT-MH address in the IP packet, establishing it as an SMT-MH packet, the detector 181 output response conditions the packet selector 183 to reproduce the SMT-MH packet for application to an SMT-MH processing unit 187, which includes circuitry for generating control signals for the later stages 186 of the M/H receiver. FIG. 26 shows the SMT-MH processing unit 187 connected for receiving FIC information from the TPS carriers processor 156 in FIG. 23. The SMT-MH processing unit 187 integrates this FIC information with information from SMT-MH packets during the generation of Service Map Data. The Service Map Data generated by the SMT-MH processing unit 187 is written into memory 188 for temporary storage therein and subsequent application to the later stages 186 of the M/H receiver. The SMT-MH processing unit 187 relays those SMT-MH packets that have bit prefixes that do not indicate error in the packets to a user interface 189, which includes an Electronic Service Guide (ESG) and apparatus for selectively displaying the ESG on the viewing screen of the M/H receiver.

FIG. 27 shows in detail an arrangement 130 of elements 131-138 that locates byte errors for the decoder 122 for (255, 191) transverse Reed-Solomon coding, which decoder 122 appears in FIG. 25 of the overall schematic diagram for an M/H receiver. Also, FIG. 27 explicitly shows a TRS decoding controller 129 that controls the procedures for decoding (255, 191) transverse Reed-Solomon coding in the M/H receiver shown in FIGS. 23, 24, 25 and 26. FIG. 27 does not explicitly show the connections of the TRS decoding controller 129 to the RAMS 121 and 123 for controlling their respective writing and reading operations. FIG. 27 does not explicitly show the connections of the TRS decoding controller 129 to the decoder 122 for controlling its decoding of (255, 191) TRS coding.

Initially, the decoder 122 is operated so as to attempt to correct the TRS codeword using a byte-error-location-and-correction decoding algorithm. If the TRS codeword has too many byte errors to be corrected by this algorithm, the decoder 122 then resorts to a byte-error-correction-only decoding algorithm. The extension bits accompanying each successive 8-bit byte of a TRS codeword from the RAM 121 are supplied to a comparator 131 used as a threshold detector. The extension bits indicate the likelihood that the 8-bit byte is in error, and comparator 131 compares them to an error threshold. If the likelihood that the 8-bit byte is in error exceeds the error threshold, the comparator 131 responds with a logic ONE indicative that the byte is presumably in error. Otherwise, the comparator 131 responds with a logic ZERO indicative that the byte is presumably correct.

FIG. 27 shows the sum output signal from a clocked digital adder 132 supplied to the comparator 131 as the error threshold. The value of the error threshold is initialized in the following way at the outset of each TRS codeword being read from the RAM 121. A two-input multiplexer 133 is connected to supply its response as a first of two summand signals supplied to the adder 132, the second summand signal being arithmetic one. The sum output signal from the clocked adder 132 is applied as one of two input signals to the multiplexer 133, and an initial error threshold value less one is applied as the other input signal to the multiplexer 133. Just before each TRS codeword is read from the RAM 121 a respective pulsed logic ONE is generated by TRS decoding controller 129. The pulsed logic ONE is applied as control signal to the multiplexer 133, conditioning it to reproduce the initial error threshold value less one in its response supplied to the adder 132 as a summand input signal. The clocked adder 132 receives its clock signal from an OR gate 134 connected to receive the pulsed logic ONE at one of its input connections. The OR gate 134 reproduces the pulsed logic ONE in its response, which clocks an addition by the adder 132. The adder 132 adds its arithmetic one summand input signal to the initial error threshold value less one summand input signal received from the multiplexer 133, generating the initial error threshold value as its sum output signal supplied to the comparator 131.

The pulsed logic ONE also resets to arithmetic zero the output count from a byte-error counter 135 that is connected for counting the number of logic ONEs that the comparator 131 generates during each TRS codeword. This output count is applied as subtrahend input signal to a digital subtractor 136. A read-only memory 137 supplies the binary number 100 0000, equal to the number of parity bytes in each of the (255, 191) TRS codewords, which number is supplied as minuend input signal to the digital subtractor 136. Alternatively, the minuend input signal is simply a "hard-wired" binary number 100 0000. A minus-sign-bit detector 138 generates a logic ONE if and when the number of byte errors in a TRS codeword counted by the counter 135 exceeds the number of parity bytes in a TRS codeword. This logic ONE is supplied to the TRS decoding controller 129 as an indication that the current TRS codeword is to be read out from the RAM 121 again. This logic ONE is supplied to the OR gate 134 as an input signal thereto. The OR gate 134 responds with a logic ONE that resets the counter 135 to zero output count and that clocks the clocked digital adder 132. Normally, the multiplexer 133 reproduces the error threshold supplied as sum output from the adder 132. This reproduced error threshold is applied to the adder 132 as a summand input signal, connecting the clocked adder 132 for clocked accumulation of arithmetic ones in addition to the previous error threshold. The logic ONE from the OR gate 134 causes the error threshold supplied as sum output from the adder 132 to be incremented by arithmetic one, which tends to reduce the number of erroneous bytes located within the TRS codeword upon its being read again from the RAM 121.

If and when the number of erroneous bytes located in the TRS codeword is fewer than the number of parity bytes that the ROM 137 indicates that the TRS codeword should have, the TRS decoding controller 129 will cause the next TRS codeword in the RS Frame to be processed if there is such. The TRS decoding controller 129 will initiate reading such next TRS codeword from the RAM 121 to the RS decoder 122 and writing the RS decoding results from the just previous RS codeword into the RAM 123.

FIGS. 28 and 29 are modifications of FIGS. 18 and 19 that combine with FIG. 20 to provide a generic schematic diagram of a stationary DTV receiver adapted for iterative-diversity reception of COFDM signals as transmitted by the portions of the DTV transmitter as depicted in FIGS. 1 and 2. A stationary DTV receiver as shown in FIGS. 28, 29 and 20 uses maximal-ratio code combining of the FEC coding that the de-mapper 71 of 512QAM constellations recovers from repeated time-slices, rather than using maximal-ratio QAM combining of 512QAM constellations before the de-mapper 71. FIG. 28 shows the input port of the de-mapper 71 connected for receiving the complex coordinates of successive 512QAM constellations directly from the output port of the frequency-domain channel equalizer 57. The de-mapper 71 is operable for reproducing at an output port thereof the FEC coding of individual bits supplied as response from the encoder 10 in the FIG. 2 portion of the DTV transmitter.

FIG. 28 shows the output port of the de-mapper 71 connected for supplying the FEC coding of individual bits to the input ports of selectors 190 and 191. The selector 190 reproduces at its output port FEC coding from just those transmissions that are not repeated and from the final ones of those transmissions that are repeated for iterative-diversity reception. The selector 191 reproduces at its output port FEC coding from just the initial ones of those transmissions subsequently repeated for iterative-diversity reception. The output port of the selector 191 is connected for writing to the input port of a delay memory 192. The delay memory 192 delays the FEC coding from the initial transmissions subsequently once-repeated for iterative-diversity reception. The delay can be prescribed fixed delay or, alternatively, can be programmable responsive to delay specified by bits of TPS coding. In either case, the delay is such that the FEC coding from the transmissions subsequently repeated for iterative-diversity reception is supplied from the output port of the delay memory 192 concurrently with the corresponding FEC coding from final transmissions that is supplied from the output port of the selector 190. The output ports of the selector 190 and the delay memory 192 are connected for supplying final transmissions and delayed initial transmissions of the FEC coding of individual bits to be code-combined by a maximal-ratio code combiner 200 shown in FIG. 29. The value of the total RMS energy supplied from the pilot and TPS carriers processor 56 is delayed by shim delay 193 for application to the maximal-ratio code combiner 200 shown in FIG. 29.

FIG. 29 shows the maximal-ratio code combiner 200 as comprising interconnected elements 201, 202, 203, 204, 205, 206, 207, 208 and 209. The calculations performed by the elements 204, 205, 206, 207, 208 and 209 are all real-only in nature. When used with the front-end receiver circuitry shown in FIG. 28, the code combiner 200 is connected for receiving pilot-carrier-energy information from the pilot and TPS carriers processor 56. The respective input ports of selectors 201 and 202 are connected to receive the value of the total RMS energy supplied from the pilot and TPS carriers processor 56 and delayed by the shim delay 193. The selector 201 reproduces at its output port the total energy of the unmodulated pilot carriers during those transmissions that are not repeated and the final ones of the transmissions repeated for iterative-diversity reception. At all other times, the selector 201 supplies a zero value at its output port. The selector 202 reproduces at its output port the total energy of the unmodulated pilot carriers during the initial ones of those transmissions repeated for iterative-diversity reception. At all other times, the selector 202 supplies a zero value at its output port. These operations of the selectors 201 and 202 are controlled responsive to indications conveyed in the TPS carriers. These operations support the FEC coding from transmissions that are not repeated, which are supplied to a first of the two input ports of the code combiner 200, being reproduced without modification from its output port.

A delay memory 203 is connected for delaying the selector 202 response to supply a delayed selector 202 response that is concurrent with the selector 201 response. The length of delay afforded by the delay memory 203 is essentially the same as the length of delay afforded by the delay memory 192. The latent delay of the pilot and TPS carriers processor 56 in generating the total energy of the unmodulated pilot carriers is supposedly shorter than the combined latent delays through the channel equalizer 57 and the de-mapper 71. The shim delay 193 compensates for this. The latent delay of the pilot and TPS carriers processor 56 in generating the total energy of the unmodulated pilot carriers may instead be longer than the combined latent delays through the channel equalizer 57 and the de-mapper 71. If so, the shim delay 193 is replaced by direct connection from the pilot and TPS carriers processor 56 to the selectors 201 and 202. Shim delay is instead introduced between the output port of the de-mapper 71 and the input ports of the selectors 90 and 91, or further on before each of the first and second input ports of the code combiner 200.

A digital adder 204 is connected for adding the selector 201 response and the delayed selector 202 response read from the delay memory 203. The sum output response from the adder 204 combines the total energies of the initial and final transmissions for iterative-diversity reception, to be used for normalizing the weighting of the selector 190 response and the weighting of the delayed selector 191 response read from the delay memory 192. A read-only memory 205 is connected for multiplying soft data bits in the response from the selector 190 by the total energy of a final transmission for iterative-diversity reception. A read-only memory 206 is connected for multiplying the read-out from the delay memory 192 by the total energy of the corresponding initial transmission for iterative-diversity reception.

The product from the ROM 205 is a weighted response to turbo coding from transmissions that are not repeated and from the final ones of those transmissions repeated for iterative-diversity reception. A read-only memory 207 is connected for normalizing this weighted response with respect to the total energies of the initial and final transmissions for iterative-diversity reception, by dividing the product from the ROM 205 by the sum output response from the adder 204.

The product from the ROM 206 is a weighted response to turbo coding from the initial ones of those transmissions subsequently repeated for iterative-diversity reception. A read-only memory 208 is connected for normalizing this weighted response with respect to the total energies of the initial and final transmissions for iterative-diversity reception, by dividing the product from the ROM 206 by the sum output response from the adder 204.

A digital adder 209 is connected for summing the respective quotients from the ROMs 207 and 208 to generate soft bits of the maximal-ratio code combiner 200 response, which are supplied to the input port of a de-interleaver 403 for the inner bit-interleaving of FEC coding. The output port of the de-interleaver 403 is connected for supplying soft bits of de-interleaved FEC coding to the input port of the turbo decoder 72. One skilled in digital design is apt to perceive that, alternatively, normalization of the coefficients for weighting of the selector 190 response and for weighting of the delayed selector 191 response read from the delay memory 70 can be performed before such weighting, rather than after. A single read-only memory can be designed to perform the combined functions of the ROMs 205 and 207; and a single read-only memory can be designed to perform the combined functions of the ROMs 206 and 208. Alternatively, the elements 204, 205, 206, 207, 208 and 209 can be replaced by a single large read-only memory designed to perform all of the computations by the elements it replaces. The computations can be performed by digital circuitry other than ROMs, but problems with proper timing are considerably more difficult.

FIG. 30 is a modification of FIG. 23 that combines with FIGS. 29, 25 and 26 to provide a generic schematic diagram of an M/H DTV receiver adapted for iterative-diversity reception of COFDM signals as transmitted by the portions of the DTV transmitter depicted in FIGS. 3 and 4. An M/H DTV receiver as shown in FIGS. 30, 29, 25 and 26 uses maximal-ratio code combining of the FEC coding that the de-mapper 171 of 64QAM constellations recovers from repeated time-slices, rather than using maximal-ratio QAM combining of 64QAM constellations before the de-mapper 171. FIG. 30 shows the input port of the de-mapper 171 connected for receiving the complex coordinates of successive 64QAM constellations directly from the output port of the frequency-domain channel equalizer 157. The de-mapper 171 is operable for reproducing at an output port thereof the FEC coding of individual bits supplied as response from the encoder 37 in the FIG. 4 portion of the DTV transmitter.

FIG. 30 shows the output port of the de-mapper 171 connected for supplying the FEC coding of individual bits to the input ports of selectors 194 and 195. The selector 194 reproduces at its output port just the FEC coding from those transmissions that are not repeated and from the final ones of those transmissions that are repeated for iterative-diversity reception. The selector 195 reproduces at its output port just the FEC coding from the initial ones of those transmissions subsequently repeated for iterative-diversity reception. The output port of the selector 195 is connected for writing to the input port of a delay memory 196. The delay memory 196 delays the FEC coding of individual bits of initial transmissions subsequently once-repeated for iterative-diversity reception. The delay can be prescribed fixed delay or can be programmable responsive to delay specified by bits of TPS coding. In either case, the delay is such that the FEC coding from transmissions subsequently repeated for iterative-diversity reception is supplied from the output port of the delay memory 196 concurrently with the corresponding FEC coding from final transmissions that is supplied from the output port of the selector 194. The output ports of the selector 194 and the delay memory 196 are connected for supplying final transmissions and delayed initial transmissions of the FEC coding of individual bits to be code-combined by the maximal-ratio code combiner 200 shown in FIG. 29. The value of the total RMS energy supplied from the pilot and TPS carriers processor 156 is delayed by shim delay 197 for application to the maximal-ratio code combiner 200 shown in FIG. 29.

The maximal-ratio code combiner 200 shown in FIG. 29 differs somewhat when connected within an M/H DTV receiver, rather than being connected within a stationary DTV receiver. In the M/H DTV receiver the maximal-ratio code combiner 200 is connected after the portion of that receiver shown in FIG. 30 and before the portions of that receiver shown in FIGS. 25 and 26. The respective input ports of the selectors 201 and 202 are connected to receive the value of the total RMS energy supplied from the pilot and TPS carriers processor 156 and delayed by the shim delay 197. The shim delay 197 compensates for the latent delay of the pilot and TPS carriers processor 156 in generating the total energy of the unmodulated pilot carriers is supposedly shorter than the combined latent delays through the channel equalizer 157 and the de-mapper 171. The length of delay afforded by the delay memory 203 is essentially the same as the length of delay afforded by the delay memory 196. The sum output response from the adder 204 combines the total energies of the initial and final transmissions for iterative-diversity reception, to be used for normalizing the weighting of the selector 194 response and the weighting of the delayed selector 195 response read from the delay memory 196. The elements 201, 202, 203 and 204 in the code combiner 200 are structurally and operationally the same in the M/H DTV receiver as in the stationary DTV receiver.

The calculations performed by the elements 204, 205, 206, 207, 208 and 209 are all real-only in nature in the M/H DTV receiver, as well as in the stationary DTV receiver. In the M/H DTV receiver the read-only memory 205 is connected for multiplying soft data bits in the response from the selector 194 by the total energy of a final transmission for iterative-diversity reception. The read-only memory 206 is connected for multiplying soft data bits read from the delay memory 196 by the total energy of the corresponding initial transmission for iterative-diversity reception. The digital adder 209 is connected for summing the respective quotients from the ROMs 207 and 208 to generate soft bits of the maximal-ratio code combiner 200 response, which are supplied to the input port of the de-interleaver 404 for inner bit interleaving of FEC coding. The output port of the de-interleaver 404 is connected for supplying soft bits of de-interleaved FEC coding to the input port of the turbo decoder 172. The turbo decoder 172 is connected for supplying its decoding results to the byte de-interleaver 173, presuming that byte de-interleaving is not performed within the turbo decoder 172. The turbo decoder 172 decoding results, as subjected to byte de-interleaving, are supplied to the quantizer 174 and the bank 175 of XOR gates in the FIG. 25 portion of the M/H DTV receiver.

Another variant of the circuitry shown in FIGS. 18 and 19 uses two de-mappers for QAM symbol constellations, rather than one, and the maximal-ratio code combiner 200, rather than the maximal-ratio QAM combiner 60. One of the two de-mappers de-maps QAM symbol constellations as defined by complex QAM coordinates in the response from the selector 58. The other of the two de-mappers de-maps QAM symbol constellations as defined by complex QAM coordinates in the delayed selector 59 response read from the delay memory 70. The maximal-ratio code combiner 200 combines the turbo coding from the two de-mappers to generate input signal for the de-interleaver 403.

Another variant of the circuitry shown in FIGS. 23 and 24 uses two de-mappers for QAM symbol constellations, rather than one, and the maximal-ratio code combiner 200, rather than the maximal-ratio QAM combiner 160. One of the two de-mappers de-maps QAM symbol constellations as defined by complex QAM coordinates in the response from the selector 158. The other of the two de-mappers de-maps QAM symbol constellations as defined by complex QAM coordinates in the delayed selector 159 response read from the delay memory 170. The maximal-ratio code combiner 200 combines the turbo coding from the two de-mappers to generate input signal for the de-interleaver 404.

Figure 31:
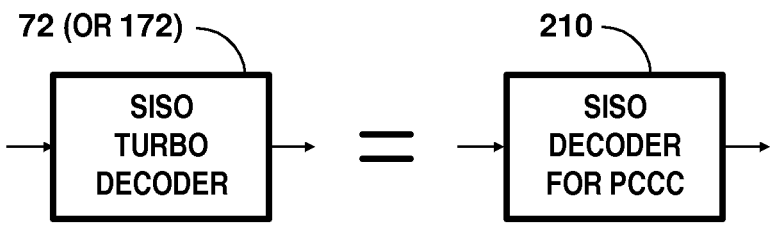

FIG. 31 shows a soft-input/soft-output decoder 210 for parallel concatenated convolutional coding (PCCC), which can be used as the SISO turbo decoder 72 in the portion of a stationary DTV receiver shown in FIG. 19 or FIG. 29. The decoder 210 for PCCC can also be used in the SISO turbo decoder 172 in the portion of an M/H DTV receiver shown in FIG. 24 or FIG. 29. The SISO decoder 210 is used as the SISO turbo decoder 72 when the encoder 37 for FEC coding of individual bits in the FIG. 4 portion of the DTV transmitter is the FIG. 5 encoder 44 for PCCC. The SISO decoder 210 is used as the SISO turbo decoder 172 when the encoder 10 for FEC coding of individual bits in the FIG. 2 portion of the DTV transmitter is the FIG. 5 encoder 44 for PCCC.

FIG. 32 shows a soft-input/soft-output decoder 211 for serial concatenated convolutional coding (SCCC), which can be used as the SISO turbo decoder 72 in the portion of a stationary DTV receiver shown in FIG. 19 or FIG. 29. The decoder 211 for SCCC can also be used in the SISO turbo decoder 172 in the portion of an M/H DTV receiver shown in FIG. 24 or FIG. 31. The SISO decoder 211 is used as the SISO turbo decoder 72 when the encoder 37 for FEC coding of individual bits in the FIG. 4 portion of the DTV transmitter is the FIG. 6 encoder 45 for SCCC. The SISO decoder 210 is used as the SISO turbo decoder 172 when the encoder 10 for FEC coding of individual bits in the FIG. 2 portion of the DTV transmitter is the FIG. 6 encoder 44 for SCCC.

Figure 33:
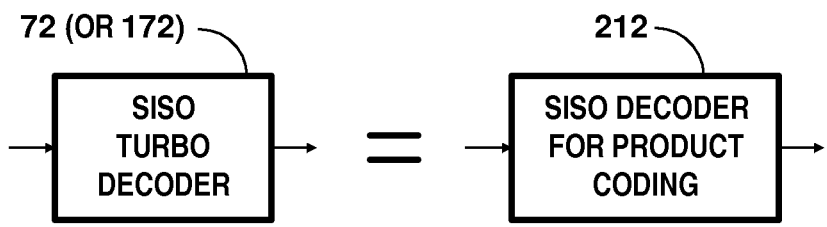

FIG. 33 shows a soft-input/soft-output decoder 212 for product coding, which can be used as the SISO turbo decoder 72 in the portion of a stationary DTV receiver shown in FIG. 19 or FIG. 29. The decoder 212 for product coding can also be used in the SISO turbo decoder 172 in the portion of an M/H DTV receiver shown in FIG. 24 or FIG. 29. The SISO decoder 212 is used as the SISO turbo decoder 72 when the encoder 37 for FEC coding of individual bits in the FIG. 4 portion of the DTV transmitter comprises the cascaded encoder 46 for block coding and the encoder 47 for convolutional coding shown in FIG. 7. The SISO decoder 212 is used as the SISO turbo decoder 172 when the encoder 10 for FEC coding of individual bits in the FIG. 2 portion of the DTV transmitter comprises the cascaded encoders 46 and 47 shown in FIG. 7.

Figure 34:
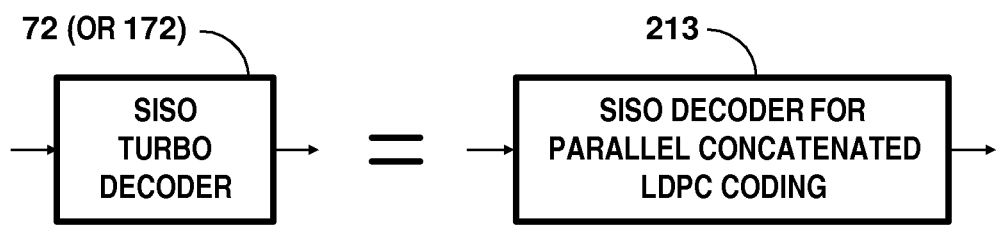

FIG. 34 shows a soft-input/soft-output decoder 213 for parallel concatenated low-density parity-check coding, which can be used as the SISO turbo decoder 72 in the portion of a stationary DTV receiver shown in FIG. 19 or FIG. 29. The decoder 213 for parallel concatenated LDPC coding can also be used in the SISO turbo decoder 172 in the portion of an M/H DTV receiver shown in FIG. 24 or FIG. 29. The SISO decoder 213 is used as the SISO turbo decoder 72 when the encoder 37 for FEC coding of individual bits in the FIG. 4 portion of the DTV transmitter comprises the encoder 48 for parallel concatenated LDPC coding shown in FIG. 8. The SISO decoder 213 is used as the SISO turbo decoder 172 when the encoder 10 for FEC coding of individual bits in the FIG. 2 portion of the DTV transmitter comprises the encoder 48 for parallel concatenated LDPC coding shown in FIG. 8.

The transmissions of turbo coding for iterative-diversity reception described supra entail sending complete turbo coding twice, final transmission being made some seconds after the initial transmission. Variants of these procedures transmit the data bits and just a first set of parity bits in the initial transmission and then transmit in the final transmission a repeat of the data bits and just a second set of parity bits different than the first. The receiver performs maximal-ratio combining of the data bits and their repeats, then performs turbo decoding on the combined data bits and the two sets of parity bits. Turbo decoding is employed in these variants, and data bits are adjusted during the iterative decoding procedures. In accordance with the teaching herein, it is preferable that data bits be disposed in the bit-places of the Gray labeling of lattice points in the QAM symbol constellations most likely to have low confidence levels associated therewith.

FIG. 35 shows modifications made to the portion of the DTV transmitter apparatus shown in FIG. 4 to implement a variant transmission as described in the immediately preceding paragraph. The 64QAM symbol constellation mapper 15 of FIG. 4 mapping in accordance with FIG. 9 is replaced in FIG. 35 with a 64QAM symbol constellation mapper 215 mapping in accordance with FIG. 36. The TPS generator 41 of FIG. 4 is replaced in FIG. 35 by a TPS signal generator 216 that generates Transmission Parameters Signaling (TPS) bits that identify the different kind of transmissions being made. The FIG. 4 encoder 37 for encoding individual bits at one-third code rate is replaced in FIG. 35 by encoding apparatus for encoding individual bits at one-half code rate. This encoding apparatus for encoding individual bits at one-half code rate comprises elements 217-224. Selectors 217 and 218 have input ports connected for receiving the response of the convolutional byte interleaver 36 per the FIG. 4 portion of the DTV transmitter. The portions of the DTV transmitter apparatus depicted in FIGS. 3 and 4 are modified in regard to clocking rates to accommodate the FIG. 4 encoder 37 for encoding individual bits at one-third code rate being replaced in FIG. 35 by encoding apparatus for encoding individual bits at one-half code rate. The selector 217 selectively responds to the convolutionally byte-interleaved (204, 188) LRS codewords of odd-numbered time-slices supplied to its input port, reproducing them in bit-serial form at its output port. The selector 218 selectively responds to the convolutionally byte-interleaved (204, 188) LRS codewords of even-numbered time-slices supplied to its input port, reproducing them in bit-serial form at its output port.

The bit-serial, convolutionally byte-interleaved (204, 188) LRS codewords of odd-numbered time-slices supplied from the output port of the selector 217 are supplied to the input port of a bits de-interleaver 219. The output port of the bits de-interleaver 219 is connected for supplying bit de-interleaved response to the input port of an encoder 220 for one-half-rate forward-error-correction (FEC) coding. The output port of the encoder 220 is connected for supplying one-half-rate FEC coding to the input port of a symbols interleaver 221. The bits de-interleaver 219 and the symbols interleaver 221 cooperate to provide coded (or "implied") interleaving of the data bits and parity bits of the FEC coding from the output port of the symbols interleaver 221. The symbols interleaver 221 interleaves half-nibble symbols in a way complementary to the way that the bits de-interleaver 219 de-interleaved data bits supplied to the encoder 220 for one-half-rate FEC coding. Accordingly, data bits appear in their original order in the symbol-interleaved one-half-rate FEC coding supplied from the output port of the symbol interleaver 221 to a first of two input ports of a time-division multiplexer 222 for odd-numbered and even-numbered coded-time-slices.

The bit-serial, convolutionally byte-interleaved (204, 188) LRS codewords of even-numbered time-slices supplied from the output port of the selector 218 are supplied to the input port of a delay memory 223. After a delay that compensates for the latent delays in the bits de-interleaver 219 and the symbols interleaver 221, the delay memory 223 reproduces at its output port the LRS codewords of even-numbered time-slices supplied to its input port. These delayed LRS codewords of even-numbered time-slices are applied to the input port of an encoder 224 for one-half-rate forward-error-correction (FEC) coding. The FEC encoder 224 is similar in construction and operation to the FEC encoder 220, presuming that parallel concatenated one-half-rate convolutional or LDPC coding is employed. The output port of the FEC encoder 224 is connected for supplying one-half-rate FEC coding to the second input port of the time-division multiplexer 222 for odd-numbered and even-numbered coded-time-slices. Owing to the delay provided by the delay memory 223, the even-numbered coded-time-slices supplied from the output port of the FEC encoder 224 and applied to the second input port of the time-division multiplexer 222 interleave in time with the odd-numbered coded-time-slices that the symbols interleaver 221 supplies to the first input port of the time-division multiplexer 222. FIG. 35 shows the output port of the time-division multiplexer 222 connected for supplying the time-division-multiplexed odd-numbered and even-numbered coded-time-slices to the input port of the inner bit interleaver 402. FIG. 35 shows the output port of the bit interleaver 402 connected to the input port of the constellation mapper 215 for 64QAM.

FIG. 37A shows the bit-map pattern exhibited by bits in the first bit-places of the 6-bit sequences respectively associated with the square array of sixty-four lattice points in the 64QAM symbol constellation map of FIG. 36. The vertical bands of ONEs are each two lattice points wide, and the vertical bands of ZEROes are each two lattice points wide except at left and right edges of the 64QAM symbol constellation map. FIG. 37B shows the bit-map pattern exhibited by bits in the second bit-places of the 6-bit sequences respectively associated with the square array of sixty-four lattice points in the 64QAM symbol constellation map of FIG. 36. The vertical band of ONEs is four lattice points wide, and the flanking vertical bands of ZEROes are each two lattice points wide. Decision bits in the first bit-places are more likely to be from lattice points adjoining boundaries between ONEs and ZEROes, where confidence levels are reduced, than decision bits in the second bit-places are. So, as shown in FIG. 38, the first and second bit-places are used to convey data bits and parity bits, respectively, of the one-half-rate FEC coding of individual bits.

FIG. 37C shows the bit-pattern exhibited by bits in the third bit-places of the 6-bit sequences respectively associated with the square array of sixty-four lattice points in the 64QAM symbol constellation map of FIG. 36. The horizontal bands of ONEs are each two lattice points deep, and the horizontal bands of ZEROes are each two lattice points deep except at top and bottom edges of the 64QAM symbol constellation map. FIG. 37D shows the bit-map pattern exhibited by bits in the fourth bit-places of the 6-bit sequences respectively associated with the square array of sixty-four lattice points in the 64QAM symbol constellation map of FIG. 36. The horizontal band of ONEs is four lattice points deep, and the flanking horizontal bands of ZEROes are each two lattice points deep. Decision bits in the third bit-places are more likely to be from lattice points adjoining boundaries between ONEs and ZEROes, where confidence levels are reduced, than decision bits in the fourth bit-places are. So, as shown in FIG. 38, the third and fourth bit-places are used to convey data bits and parity bits, respectively, of the one-half-rate FEC coding of individual bits.

FIG. 37E shows the bit-map pattern exhibited by bits in the fifth bit-places of the 6-bit sequences respectively associated with the square array of sixty-four lattice points in the 64QAM symbol constellation map of FIG. 36. In this bit-map pattern a vertical band of ONEs is four lattice points wide, and a vertical band of ZEROes is four lattice points wide. FIG. 37F shows the bit-map pattern exhibited by bits in the sixth bit-places of the 6-bit sequences respectively associated with the square array of sixty-four lattice points in the 64QAM symbol constellation map of FIG. 36. In this bit-map pattern a horizontal band of ONEs is four lattice points deep, and a horizontal band of ZEROes is four lattice points deep. FIG. 38 shows that the fifth and sixth bit-places are used to convey data bits and parity bits, respectively, of the one-half-rate FEC coding of individual bits. The selection is arbitrary, and a 64QAM symbol constellation map in which the bits associated with the fifth and sixth bit places are interchanged is an alternative as good as that shown in FIG. 36.

However, other embodiments of the aspects of the invention involving one-half-rate bit-wise FEC coding rely on a 64QAM symbol constellation map that differs from one of those described supra, but uses the same set of three bit-maps to convey data bits of that bit-wise FEC coding. In some of these alternative 64QAM symbol constellation maps, just the order of the bit-maps to convey data bits of one-third-rate bit-wise FEC coding is changed from what is described supra. In others of these alternative 64QAM symbol constellation maps, just the order of the bit-maps to convey parity bits of one-third-rate bit-wise FEC coding is changed from what it is described supra. In yet others of these alternative 64QAM symbol constellation maps, the order of the bit-maps to convey data bits of one-third-rate bit-wise FEC coding is changed from what is described supra; and the order of the bit-maps to convey parity bits of one-third-rate bit-wise FEC coding is also changed from what is described supra. Still further 64QAM symbol constellation maps having the particular properties requisite to aspects of the invention involving one-half-rate bit-wise FEC coding are generated by any of the following manipulations of the already-described 64QAM symbol constellation maps or combinations of such manipulations: a 90-degree rotation in symbol space, a 180-degree rotation in symbol space, a 270-degree rotation in symbol space, a right-for-left horizontal flip in symbol space, or a top-for-bottom vertical flip in symbol space.

FIG. 39 shows modifications of the portion of the DTV transmitter apparatus shown in FIG. 2. The 512QAM (or 64QAM) symbol constellation mapper 11 of FIG. 2 is replaced in FIG. 39 with a 256QAM symbol constellation mapper 225. The TPS generator 14 of FIG. 2 is replaced in FIG. 39 by a TPS signal generator 226 that generates Transmission Parameters Signaling (TPS) bits that identify the kind of transmissions being made. The FIG. 2 encoder 10 for encoding individual bits at one-third code rate is replaced in FIG. 39 by encoding apparatus for encoding individual bits at one-half code rate. This encoding apparatus for encoding individual bits at one-half code rate comprises elements 227-234. Selectors 227 and 228 have input ports connected for receiving the response of the convolutional byte interleaver 29 in the FIG. 3 portion of the DTV transmitter. The FIG. 1 portion of the DTV transmitter apparatus is modified in regard to clocking rates to accommodate the FIG. 2 encoder 10 for encoding individual bits at one-third code rate being replaced in FIG. 39 by encoding apparatus for encoding individual bits at one-half code rate. The selector 227 selectively responds to the convolutionally byte-interleaved (204, 188) LRS codewords of even-numbered time-slices supplied to its input port, reproducing them in bit-serial form at its output port. The selector 228 selectively responds to the convolutionally byte-interleaved (204, 188) LRS codewords of odd-numbered time-slices supplied to its input port, reproducing them in bit-serial form at its output port.

The bit-serial, convolutionally byte-interleaved (204, 188) LRS codewords of odd-numbered time-slices supplied from the output port of the selector 227 are supplied to the input port of a bits de-interleaver 229. The output port of the bits de-interleaver 229 is connected for supplying bit de-interleaved response to the input port of an encoder 230 for one-half-rate forward-error-correction (FEC) coding. The output port of the encoder 230 is connected for supplying one-half-rate FEC coding to the input port of a symbols interleaver 231. The bits de-interleaver 229 and the symbols interleaver 231 cooperate to provide coded (or "implied") interleaving of the data bits and parity bits of the FEC coding from the output port of the symbols interleaver 231. The symbols interleaver 231 interleaves half-nibble symbols in a way complementary to the way that the bits de-interleaver 229 de-interleaved data bits supplied to the encoder 230 for one-half-rate FEC coding. Accordingly, data bits appear in their original order in the symbol-interleaved one-half-rate FEC coding supplied from the output port of the symbol interleaver 231 to a first of two input ports of a time-division multiplexer 232 for even-numbered and odd-numbered coded-time-slices.

The bit-serial, convolutionally byte-interleaved (204, 188) LRS codewords of even-numbered time-slices supplied from the output port of the selector 228 are supplied to the input port of a delay memory 233. After a delay that compensates for the latent delays in the bits de-interleaver 229 and the symbols interleaver 231, the delay memory 233 reproduces at its output port the LRS codewords of even-numbered time-slices supplied to its input port. These delayed LRS codewords of even-numbered time-slices are applied to the input port of an encoder 234 for one-half-rate forward-error-correction (FEC) coding. The FEC encoder 234 is similar in construction and operation to the FEC encoder 230, presuming that parallel concatenated one-half-rate convolutional or LDPC coding is employed. The output port of the FEC encoder 234 is connected for supplying one-half-rate FEC coding to the second input port of the time-division multiplexer 232 for odd-numbered and even-numbered coded-time-slices. Owing to the delay provided by the delay memory 233, the even-numbered coded-time-slices supplied from the output port of the FEC encoder 234 and applied to the second input port of the time-division multiplexer 232 interleave in time with the odd-numbered coded-time-slices that the symbols interleaver 231 supplies to the first input port of the time-division multiplexer 232. FIG. 39 shows the output port of the time-division multiplexer 232 connected for supplying the time-division-multiplexed odd-numbered and even-numbered coded-time-slices to the input port of the inner bit interleaver 401. FIG. 39 shows the output port of the bit interleaver 401 connected to the input port of the constellation mapper 225 for 256QAM.

FIGS. 40A, 40B, 40C and 40D illustrate the four quadrants of representative 256QAM symbol constellation maps preferably used by the constellation mapper in the portion of a COFDM transmitter shown in FIG. 39. The square symbol constellation map of FIGS. 40A, 40B, 40C and 40D provides perfect Gray mapping. The set of eight decision bits associated with any lattice point differs by only a single bit from the set of eight decision bits associated with any one of the closest by lattice points in the square 256QAM symbol constellation. FIGS. 41A, 41B, 41C, 41D, 41E, 41F, 41G and 41H are diagrams showing patterns of the first, second, third, fourth, fifth, sixth, seventh and eighth bits within the 256QAM symbol constellation. The eight decision bits associated with each lattice point are considered to be ordinally numbered first through eighth, scanning from left to right—i.e., from earliest to latest in bit-serial response. As shown in FIG. 42, the first, third, fifth and seventh decision bits are used to convey successive data bits of one-half-rate bit-wise FEC coding. As further shown in FIG. 42, the second, fourth, sixth and eighth decision bits are used to convey successive parity bits of one-half-rate bit-wise FEC coding.

Figures 41A, 41B:
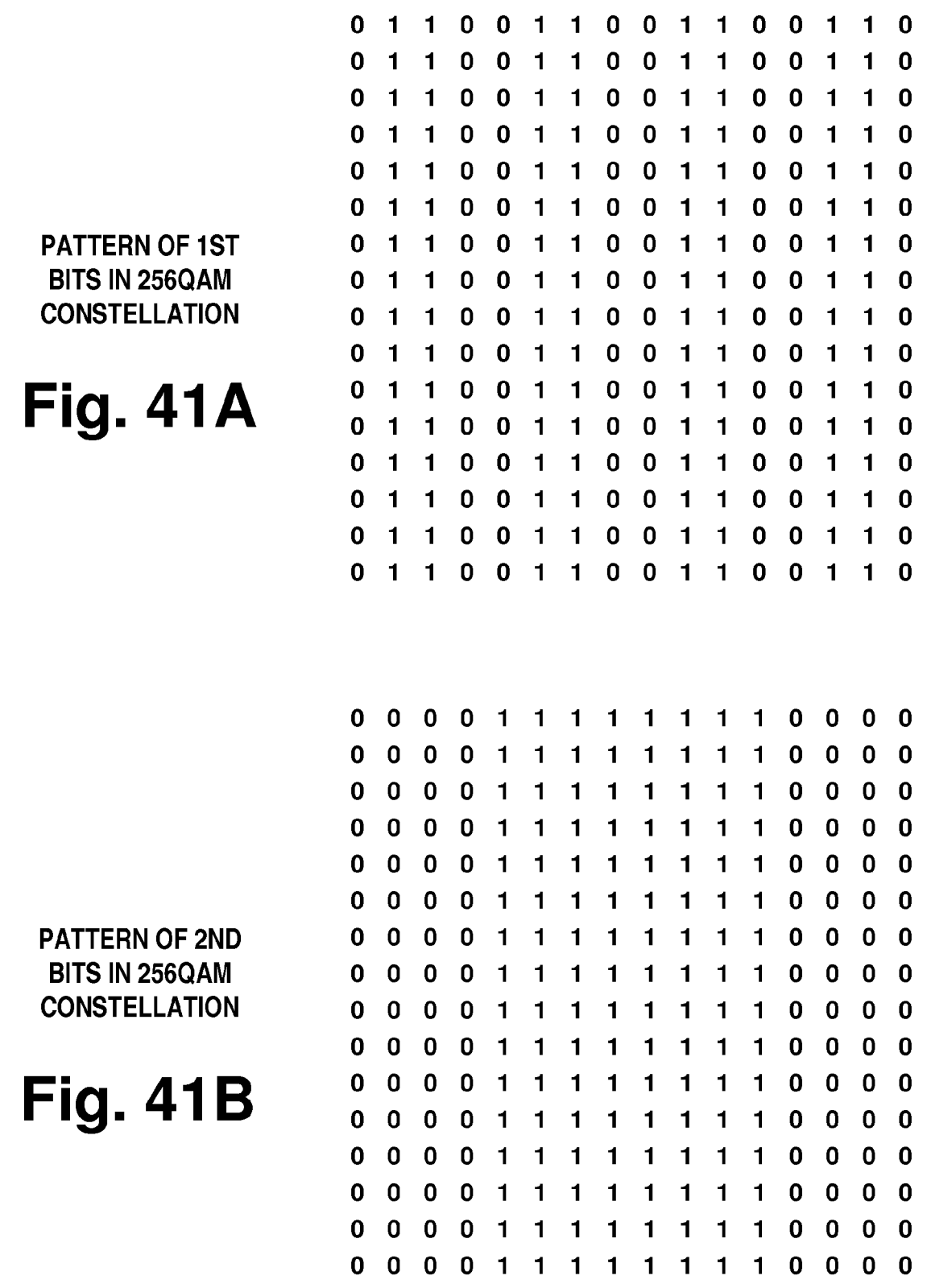
Figures 41C, 41D:
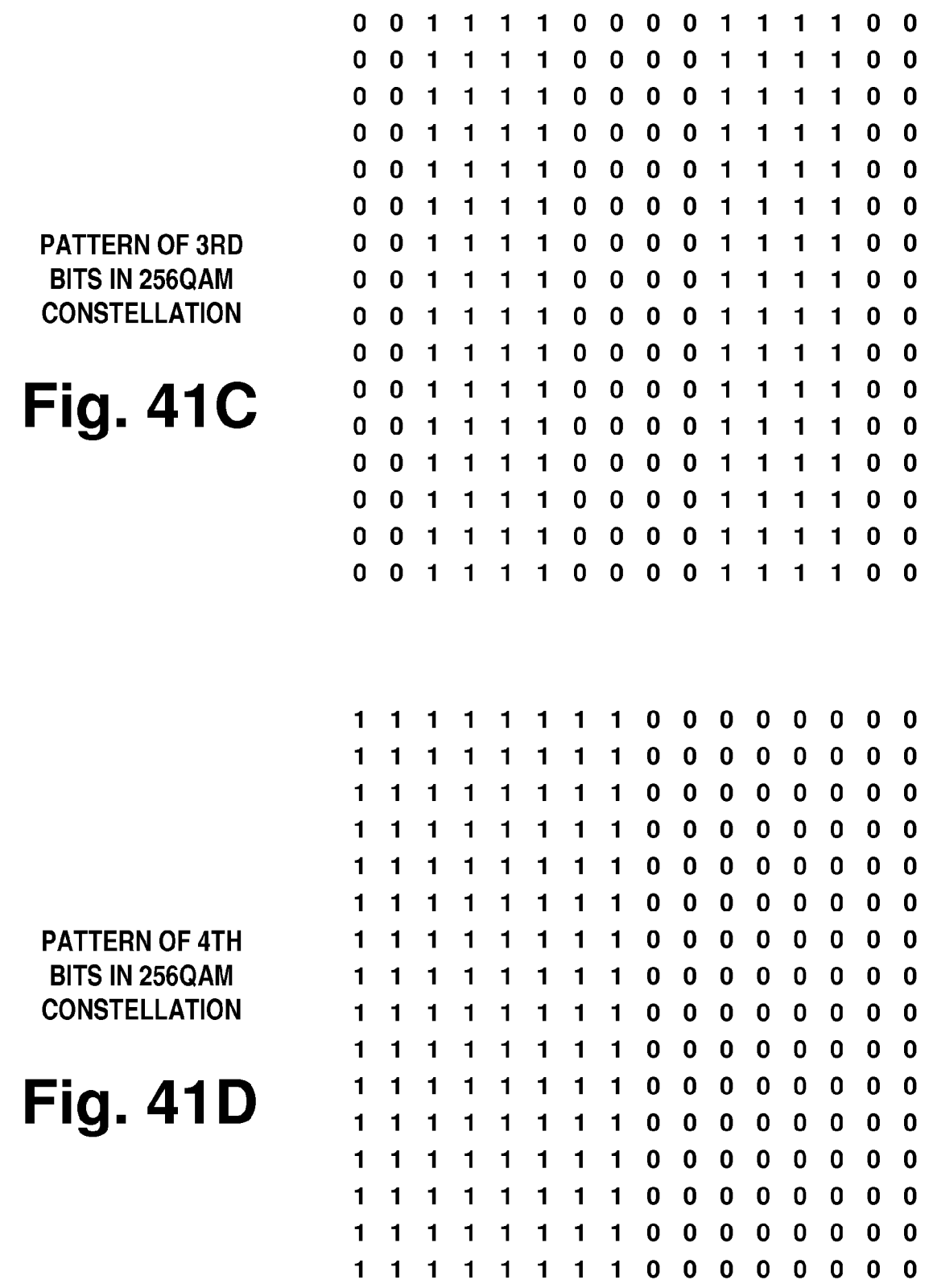

FIG. 41A shows the bit-map pattern exhibited by bits in the first bit-places of the 8-bit sequences respectively associated with the square array of lattice points in the 256QAM symbol constellation map of FIGS. 40A, 40B, 40C and 40D. The vertical bands of ONEs are each two lattice points wide, and the vertical bands of ZEROes are each two lattice points wide except at left and right edges of the 256QAM symbol constellation map. FIG. 41B shows the bit-map pattern exhibited by bits in the second bit-places of the 8-bit sequences respectively associated with the square array of lattice points in the 256QAM symbol constellation of FIGS. 40A, 40B, 40C and 40D. The vertical band of ONEs is eight lattice points wide, and the left- and right-flanking vertical bands of ZEROes are each four lattice points wide. FIG. 41C shows the bit-map pattern exhibited by bits in the third bit-places of the 8-bit sequences respectively associated with the square array of lattice points in the 256QAM symbol constellation map of FIGS. 40A, 40B, 40C and 40D. A central vertical band of ZEROes is four lattice points wide and is flanked left and right by vertical bands of ONEs each four lattice points wide, each vertical band of ONEs being flanked on its further side by a respective further vertical band of ZEROes two lattice points wide. FIG. 41D shows the bit-map pattern exhibited by bits in the fourth bit-places of the 8-bit sequences respectively associated with the square array of lattice points in the 256QAM symbol constellation map of FIGS. 40A, 40B, 40C and 40D. The vertical band of ONEs is eight lattice points wide, and the vertical band of ZEROes is eight lattice points wide.

FIG. 41E shows the bit-map pattern exhibited by bits in the fifth bit-places of the 8-bit sequences respectively associated with the square array of lattice points in the 256QAM symbol constellation map of FIGS. 40A, 40B, 40C and 40D. The horizontal bands of ONEs are each two lattice points tall, and the horizontal bands of ZEROes are each two lattice points tall except at top and bottom edges of the 2564QAM symbol constellation map. FIG. 41F shows the bit-map pattern exhibited by bits in the sixth bit-places of the 8-bit sequences respectively associated with the square array of lattice points in the 256QAM symbol constellation of FIGS. 40A, 40B, 40C and 40D. The horizontal band of ONEs is eight lattice points tall, and the top- and bottom-flanking horizontal bands of ZEROes are each four lattice points tall. FIG. 41G shows the bit-map pattern exhibited by bits in the seventh bit-places of the 8-bit sequences respectively associated with the square array of lattice points in the 256QAM symbol constellation map of FIGS. 40A, 40B, 40C and 40D. A central horizontal band of ZEROes is four lattice points tall and is flanked top and bottom by horizontal bands of ONEs each four lattice points tall, each horizontal band of ONEs being flanked on its further side by a respective further horizontal band of ZEROes two lattice points tall. FIG. 41H shows the bit-map pattern exhibited by bits in the fourth bit-places of the 8-bit sequences respectively associated with the square array of lattice points in the 256QAM symbol constellation map of FIGS. 40A, 40B, 40C and 40D. The horizontal band of ONEs is eight lattice points tall, and the horizontal band of ZEROes is eight lattice points tall.

The decision bits in the first and fifth bit-places are more likely to have low confidence levels associated with them than the decision bits in the other bit-places. This is because the decision bits in the first and fifth bit-places are more likely to be from lattice points adjoining boundaries between ONEs and ZEROes, where confidence levels are reduced. So, as shown in FIG. 42, the first and fifth bit-places are used to convey data bits of one-half-rate bit-wise FEC coding. Following the same line of reasoning in regard to the other bit-places, the decision bits in the third and seventh bit places are more likely to have low confidence levels associated with them than the decision bits in the even-numbered bit-places. So, as further shown in FIG. 42, the third and seventh bit-places are also used to convey data bits of one-half-rate bit-wise FEC coding.

Other embodiments of the aspects of the invention involving 256QAM rely on a 256QAM symbol constellation map that differs from one of those described supra, but uses the same set of four bit-maps to convey data bits of one-half-rate bit-wise FEC coding. In some of these alternative 256QAM symbol constellation maps, just the order of the bit-maps to convey data bits of one-half-rate bit-wise FEC coding is changed from what it is in the 256QAM symbol constellation map depicted in FIGS. 40A, 40B, 40C and 40D. In others of these alternative 256QAM symbol constellation maps, just the order of the bit-maps to convey parity bits of one-half-rate bit-wise FEC coding is changed from what it is in the 256QAM symbol constellation map depicted in FIGS. 40A, 40B, 40C and 40D. In yet others of these alternative 256QAM symbol constellation maps, the order of the bit-maps to convey data bits of one-half-rate bit-wise FEC coding is changed from what FIGS. 40A, 40B, 40C and 40D depict; and the order of the bit-maps to convey parity bits of one-half-rate bit-wise FEC coding is also changed from what FIGS. 40A, 40B, 40C and 40D depict. Still further 256QAM symbol constellation maps having the particular properties requisite to aspects of the invention involving one-half-rate bit-wise FEC coding are generated by any of the following manipulations of the already-described 256QAM symbol constellation maps or combinations of such manipulations: a 90-degree rotation in symbol space, a 180-degree rotation in symbol space, a 270-degree rotation in symbol space, a right-for-left horizontal flip in symbol space, or a top-for-bottom vertical flip in symbol space.

FIG. 43 illustrates an encoder 235 for one-half-rate convolutional coding being usable as the FIG. 35 encoder 220 or as the FIG. 39 encoder 230. The encoder 235 is also usable as the FIG. 49 encoder 240 or as the FIG. 51 encoder 244. FIG. 43 further illustrates an encoder 236 for one-half-rate convolutional coding being usable as the encoder 224, shown in FIGS. 35 and 51, and as the encoder 234, shown in FIGS. 39 and 49.

FIG. 44 illustrates an encoder 237 for one-half-rate low-density parity-check (LDPC) coding being usable as the FIG. 35 encoder 220 and as the FIG. 39 encoder 230. The encoder 237 is also usable as the FIG. 49 encoder 240 and as the FIG. 51 encoder 244. FIG. 44 further illustrates an encoder 238 for one-half-rate LDPC coding being usable as the encoder 224, shown in FIGS. 35 and 51, and as the encoder 234, shown in FIGS. 39 and 49.

FIG. 45 shows the initial portion of a receiver designed for iterative-diversity stationary reception of COFDM signals as transmitted at VHF or UHF by a DTV transmitter such as the one depicted in FIGS. 1 and 39. Elements 249, 250, 251, 252, 253, 254, 255, 256 and 257 shown in FIG. 42 are structurally and operationally similar to elements 49, 50, 51, 52, 53, 54, 55, 56 and 57, respectively, shown in FIGS. 18 and 28.

A reception antenna 249 captures the radio-frequency COFDM signal for application as input signal to a front-end tuner 250 of the receiver. FIG. 45 shows an AFPC generator 251 for generating the automatic frequency and phase control (AFPC) signal for controlling the final local oscillator within the front-end tuner 250. The output port of the front-end tuner 250 is connected for supplying digitized samples of baseband COFDM signal to the input port of a cyclic prefix detector 252. The output port of the cyclic prefix detector 252 is connected to supply indications of the phasing of COFDM symbols to a first of two input ports of timing synchronization apparatus 253. A first of two output ports of the timing synchronization apparatus 253 is connected for supplying gating control signal to the control input port of a guard-interval-removal unit 254, the signal input port of which is connected for receiving digitized samples of baseband COFDM signal from the output port of the front-end tuner 250. The output port of the guard-interval-removal unit 254 is connected for supplying the input port of an OFDM demodulator 255 with windowed portions of the baseband COFDM signal that contain effective COFDM samples. A second of the output ports of the timing synchronization apparatus 253 is connected for supplying the OFDM demodulator 255 with synchronizing information concerning the effective COFDM samples.

A first output port of the OFDM demodulator 255 is connected for supplying demodulated pilot carrier information to the input port of a pilot and TPS carriers processor 256. A first of four output ports of the pilot and TPS carriers processor 256 is connected for supplying more accurate window positioning information to the second input port of the timing synchronization apparatus 253. The pilot and TPS carriers processor 256 demodulates the TPS information conveyed by modulated pilot signals. The second output port of the pilot and TPS carriers processor 256 is connected for supplying the TPS information to the SMT-MH processing unit 87 shown in FIG. 20. The third output port of the pilot and TPS carriers processor 256 is connected for forwarding unmodulated pilot carriers to the input port of the AFPC generator 251. The fourth output port of the pilot and TPS carriers processor 256 is connected for supplying information concerning the respective energies of unmodulated pilot carriers to a maximal-ratio code combiner 258 shown in the FIG. 46 portion of the receiver. The value of the total RMS energy supplied from the pilot and TPS carriers processor 256 is delayed by shim delay 259 for its application to the maximal-ratio code combiner 258.

A second output port of the OFDM demodulator 255 is connected to supply demodulated complex digital samples of 256QAM to a first input port of a frequency-domain channel equalizer 257. FIG. 45 shows the frequency-domain channel equalizer 257 having a second input port connected for receiving pilot carriers supplied from the first input port of the OFDM demodulator 255. The output port of the channel equalizer 257 is connected for supplying equalized carriers conveying convolutional coding in QAM format to the input port of a de-mapper 260 for 256QAM symbol constellations. The de-mapper 260 is operable for reproducing at an output port thereof the one-half-rate FEC coding supplied as response from the time-division multiplexer 232 in the FIG. 39 portion of the DTV transmitter.

The output port of the de-mapper 260 is connected for supplying one-half-rate FEC coding to the input port of a selector 261 for reproducing at its output port just those transmissions that are not repeated and the final ones of those transmissions that are repeated for iterative-diversity reception. The output port of the de-mapper 260 is further connected for supplying one-half-rate FEC coding to the input port of a selector 262 for reproducing at its output port just the initial ones of those transmissions subsequently repeated for iterative-diversity reception. The output port of the selector 262 is connected for writing to the input port of a delay memory 263 that delays the one-half-rate FEC coding of the initial transmissions subsequently once-repeated for iterative-diversity reception. The delay can be prescribed fixed delay or, alternatively, can be programmable responsive to delay specified by bits of TPS coding. In either case, the delay is such that the transmissions subsequently repeated for iterative-diversity reception are supplied from the output port of the delay memory 263 concurrently with the corresponding final transmissions as repeated for iterative-diversity reception that are supplied from the output port of the selector 261. The output port of the delay memory 263 connects to the input ports of selectors 264 and 265 shown in FIG. 46. The output port of the selector 261 connects to the input ports of selectors 266 and 267 shown in FIG. 46.

FIG. 46 shows the selector 264 connected for selectively reproducing at its output port just the soft parity bits from the one-half-rate FEC coding supplied to its input port from the delay memory 263. The output port of the soft-parity-bits selector 264 is connected to supply these selectively reproduced soft parity bits as write input signal to a memory 268 for temporarily storing the soft parity bits of the one-half-rate FEC coding for each successive even-numbered time-slice in transmissions for iterative-diversity reception.

FIG. 46 shows the selector 265 connected for selectively reproducing at its output port just the soft data bits from the one-half-rate FEC coding read to its input port from the delay memory 263. FIG. 46 shows the selector 266 connected for selectively reproducing at its output port just the soft data bits from the one-half-rate FEC coding supplied to its input port from the selector 261. A maximal-ratio code combiner 258 is connected for receiving at a first of its two input ports the soft data bits selectively reproduced at the output port of the soft-data-bits selector 265. The second input port of the maximal-ratio code combiner 258 is connected for receiving the soft data bits selectively reproduced at the output port of the soft-data-bits selector 266. The output port of the maximal-ratio code combiner 258 is connected for supplying best soft estimates of the data bits of the one-half-rate FEC coding as write input signal to a memory 269, which temporarily stores those soft data bits.

The addressing of the memories 268, 269 and 270 during their being written to by the soft parity bits selector 264, the code combiner 258 and the soft parity bits selector 267, respectively, differs from their addressing when being read from. This implements the de-interleaving of the inner bit-interleaved FEC coding written to the memories 268, 269 and 270.

Besides temporarily storing soft data bits supplied from the maximal-ratio code combiner 258, the memory 269 also temporarily stores soft extrinsic data bits determined during the subsequent turbo decoding procedures. Soft data bits are read from the memory 269 without being combined with corresponding soft extrinsic data bits during the initial half cycle of an iterative turbo decoding procedure. Thereafter, when soft data bits are read from the memory 269 during subsequent half cycles of the iterative turbo decoding procedure, the soft data bits have respectively corresponding soft extrinsic data bits additively combined therewith. The soft extrinsic data bits temporarily stored in the memory 269 are updated responsive to the results of decoding FEC coding each half cycle of the iterative turbo decoding procedure.

FIG. 46 shows the selector 267 connected for selectively reproducing at its output port just the soft parity bits from the one-half-rate FEC coding supplied to its input port from the selector 261. The output port of the soft-parity-bits selector 267 is connected to supply these selectively reproduced soft parity bits as write input signal to a memory 270 for temporarily storing the soft parity bits of the one-half-rate FEC coding for each successive odd-numbered time-slice in transmissions for iterative-diversity reception.

The memories 268, 269 and 270 together temporarily store all the components of the PCCC (or, alternatively, of the parallel concatenated LDPC coding) for a given service to be received by the stationary DTV receiver depicted in FIGS. 45, 46 and 20. The PCCC (or parallel concatenated LDPC coding) is turbo decoded by soft-input/soft-output decoders 271 and 272 in FIG. 43, which preferably employ the sliding-window log-MAP algorithm. The term "log-MAP" is short for "logarithmic maximum a posteriori". During the initial half of each cycle of turbo decoding, the SISO decoder 271 decodes one-half-rate FEC coding that includes soft parity bits from an even-numbered time-slice of the service being received. During the final half of each cycle of turbo decoding, the SISO decoder 272 decodes one-half-rate FEC coding that includes soft parity bits from an odd-numbered time-slice of the service being received. The soft data bits that the SISO decoders 271 and 272 supply from their respective output ports as respective decoding results are compared to combined soft data bits and soft extrinsic data bits read from the memory 269. This is done to generate updated soft extrinsic data bits to be written back to the memory 269. At the conclusion of turbo decoding, combined soft data bits and soft extrinsic data bits are read from the memory 269 to supply an ultimate turbo decoding result to the input port of the quantizer 74 and the bank 75 of XOR gates shown in FIG. 20. The read addressing for the memory 269 during reading an ultimate turbo decoding result therefrom is such as to counteract the convolutional byte interleaving introduced at the DTV transmitter by the FIG. 1 convolutional byte interleaver 9.

FIG. 46 shows a soft-symbols selector 273 that selects soft data bits and soft parity bits to be supplied from first and second output ports thereof, respectively, to first and second input ports of the SISO decoder 271 during the initial half of each cycle of turbo decoding. The soft-symbols selector 273 relays soft data bits additively combined with soft extrinsic data bits, if any, as read to a first input port thereof from the memory 269, thus to generate the soft data bits supplied to the first input port of the SISO decoder 271. The soft-symbols selector 273 reproduces the soft parity bits read to a second input port thereof from the memory 270, thus generating the soft parity bits supplied to the second input port of the SISO decoder 271. In actual practice, the soft-symbols selector 273 will usually be incorporated into the structures of the memories 269 and 270.

The soft data bits supplied from the output port of the SISO decoder 271 as decoding results during the initial half of each cycle of turbo decoding are supplied to a first of two input ports of an extrinsic-data-feedback processor 274. The processor 274 differentially combines soft data bits read from the memory 269 with corresponding soft data bits of the SISO decoder 271 decoding results to generate extrinsic data feedback written into the memory 269 to update the soft extrinsic data bits temporarily stored therein.

FIG. 46 shows a soft-symbols selector 275 that selects soft data bits and soft parity bits to be supplied as input soft symbols to a soft-symbols de-interleaver 276. The soft-symbols de-interleaver 276 responds to supply de-interleaved soft data bits and de-interleaved soft parity bits from first and second output ports thereof, respectively, to first and second input ports of the SISO decoder 272 during the final half of each cycle of turbo decoding. The soft symbols selector 275 relays soft data bits additively combined with soft extrinsic data bits, if any, as read to a first input port thereof from the memory 269, thus to generate the soft data bits supplied to the soft-symbols de-interleaver 276. The soft-symbols selector 275 reproduces the soft parity bits read to a second input port thereof from the memory 268, thus to generate the soft parity bits supplied to the soft symbols de-interleaver 276. The de-interleaving provided by soft-symbols de-interleaver 276 complements the symbol interleaving provided by the symbols interleaver 231 in the FIG. 39 portion of the DTV transmitter.

The soft data bits supplied from the output port of the SISO decoder 272 as decoding results during the final half of each cycle of turbo decoding are supplied to the input port of a soft-bits interleaver 277 in FIG. 46. FIG. 46 shows the output port of the soft-bits interleaver 277 connected to a first of two input ports of an extrinsic data feedback processor 278. The interleaving provided by soft-bits interleaver 277 complements the bit de-interleaving provided by the bits de-interleaver 229 in the FIG. 39 portion of the DTV transmitter. The processor 278 differentially combines soft data bits read from the memory 269 with corresponding soft data bits of the soft-bits interleaver 277 response to generate extrinsic data feedback written into the memory 269 to update the soft extrinsic data bits temporarily stored therein.

In actual practice, the soft-symbols selector 275 will usually be incorporated into the structures of the memories 268 and 269. The soft-symbols de-interleaver 276 will usually not appear as a separate physical element either. Instead, its function is subsumed into the memories 268 and 269 by suitable addressing of them when reading soft data bits and soft parity bits directly to the first and second input ports of the SISO decoder 272. The soft-bits interleaver 277 need not appear as a separate physical element either, its function being subsumed into the memory 269 by suitable addressing during operation of the extrinsic feedback data processor 278.

After the last half cycle of the iterative turbo decoding procedure, soft data bits as additively combined with respectively corresponding soft extrinsic data bits are read from the memory 269 to the input port of the quantizer 74 and the bank 75 of XOR gates depicted in FIG. 20. Preferably, the read addressing of the memory 269 is such as to counteract the convolutional byte interleaving of time-slices introduced by the convolutional byte interleaver 29 in the portion of the DTV transmitter depicted in FIG. 3. The turbo decoder 72 shown in FIGS. 19, 21, 22 and 29 can include elements arranged similarly to the elements 268-278 in FIG. 46.

FIGS. 47, 48, 25 and 26 together provide a generic schematic diagram of an M/H DTV receiver adapted for iterative-diversity reception of COFDM signals as transmitted by the portions of the DTV transmitter depicted in FIGS. 1 and 35. Elements 349, 350, 351, 352, 353, 354, 355, 356 and 357 shown in FIG. 47 correspond in general function to elements 149, 150, 151, 152, 153, 154, 155, 156 and 157, respectively, shown in FIGS. 23 and 30.

FIG. 47 shows a reception antenna 349 used to capture the radio-frequency COFDM signal for application as input signal to a front-end tuner 350 of the receiver. FIG. 47 shows an AFPC generator 351 for generating the automatic frequency and phase control (AFPC) signal for controlling the final local oscillator within the front-end tuner 350. The output port of the front-end tuner 350 is connected for supplying digitized samples of baseband COFDM signal to the input port of a cyclic prefix detector 352. The output port of the cyclic prefix detector 352 is connected to supply indications of the phasing of COFDM symbols to a first of two input ports of timing synchronization apparatus 353. A first of two output ports of the timing synchronization apparatus 353 is connected for supplying gating control signal to the control input port of a guard-interval-removal unit 354. The signal input port of the guard-interval-removal unit 354 is connected for receiving digitized samples of baseband COFDM signal from the output port of the front-end tuner 350. The output port of the guard-interval-removal unit 354 is connected for supplying the input port of an OFDM demodulator 355 with windowed portions of the baseband COFDM signal that contain effective COFDM samples. A second of the output ports of the timing synchronization apparatus 353 is connected for supplying the OFDM demodulator 355 with synchronizing information concerning the effective COFDM samples.

A first output port of the OFDM demodulator 355 is connected for supplying demodulated pilot carrier information to the input port of a pilot and TPS carriers processor 356. A first of four output ports of the pilot and TPS carriers processor 356 is connected for supplying more accurate window positioning information to the second input port of the timing synchronization apparatus 353. The second output port of the pilot and TPS carriers processor 356 is connected for supplying the TPS information to the SMT-MH processing unit 187 shown in FIG. 26. The third output port of the pilot and TPS carriers processor 356 is connected for forwarding unmodulated pilot carriers to the input port of the AFPC generator 351 that supplies AFPC signal to the front-end tuner 350 for controlling the final local oscillator therein. The fourth output port of the pilot and TPS carriers processor 356 is connected for supplying information concerning the respective energies of unmodulated pilot carriers to a maximal-ratio code combiner 358 in the FIG. 48 portion of the receiver. The value of the total RMS energy supplied from the pilot and TPS carriers processor 356 is delayed by shim delay 359 for its application to the maximal-ratio code combiner 358.

A second output port of the OFDM demodulator 355 is connected to supply demodulated complex digital samples of 64QAM to a first input port of a frequency-domain channel equalizer 357. FIG. 47 shows the frequency-domain channel equalizer 357 having a second input port connected for receiving pilot carriers supplied from the first input port of the OFDM demodulator 355. The output port of the channel equalizer 357 is connected for supplying equalized carriers conveying FEC coding in QAM format to the input port of a de-mapper 360 for 64QAM symbols. The de-mapper 360 is operable for reproducing at an output port thereof the one-half-rate FEC coding supplied as response from the time-division multiplexer 222 in the FIG. 35 portion of the DTV transmitter.

The de-mapper 360 is designed to de-map the map of 64QAM symbol constellations shown in FIG. 36, with the 6-bit sequences being utilized as shown in FIG. 38. Essentially, the de-mapper 360 differs from the de-mapper 171 of FIG. 30 and the other de-mappers of 64QAM symbol constellations shown in FIGS. 19, 24 and 28 in the way the sets of six bits supplied in parallel from the de-mapper per se are subsequently supplied for turbo decoding.

The output port of the de-mapper 360 is connected for supplying one-half-rate FEC coding to the input port of the selector 361 for reproducing at its output port just those transmissions that are not repeated and the final ones of those transmissions repeated for iterative-diversity reception. The output port of the de-mapper 360 is further connected for supplying one-half-rate FEC coding to the input port of a selector 362 for reproducing at its output port just the initial ones of those transmissions subsequently repeated for iterative-diversity reception. The output port of the selector 362 is connected for writing to the input port of a delay memory 363 that delays the one-half-rate FEC coding of the initial transmissions subsequently once-repeated for iterative-diversity reception. The delay is such that the transmissions subsequently repeated for iterative-diversity reception are supplied from the output port of the delay memory 363 concurrently with the corresponding final transmissions as repeated for iterative-diversity reception that are supplied from the output port of the selector 361. The output port of the delay memory 363 connects to the input ports of selectors 364 and 365 shown in FIG. 48. The output port of the selector 361 connects to the input ports of selectors 366 and 367 shown in FIG. 48.

The FIG. 48 portion of the M/H DTV receiver is substantially the same as the FIG. 46 portion of the stationary DTV receiver. Elements 364, 365, 366, 367, 368, 369, 370, 371, 372, 373, 374, 375, 376, 377 and 378 shown in FIG. 48 are similar in both structure and operation to the elements 264, 265, 266, 267, 268, 269, 270, 271, 272, 273, 274, 275, 276, 277 and 278 shown in FIG. 46. Clocking may be at somewhat slower rate, though. During the reading of soft data bits of the turbo decoding results from the memory 369, its read addressing is such as to counteract the convolutional byte interleaving introduced at the DTV transmitter by the convolutional byte interleaver 34 shown in FIG. 4. The soft data bits of the turbo decoding results read from the memory 369 are supplied to the input port of the quantizer 174 shown in FIG. 25. The soft data bits of the turbo decoding results read from the memory 369 are supplied also to the bank 175 of XOR gates shown in FIG. 25. The turbo decoder 172 shown in FIGS. 24 and 29 can include elements arranged similarly to the elements 368-378 in FIG. 48.

FIG. 49 shows a modification of the FIG. 39 portion of a COFDM transmitter for a DTV system, which modification is used for transmissions intended for iterative-diversity reception by M/H DTV receivers. The FIG. 39 portion of the DTV transmitter uses the cascade connection of the bits de-interleaver 229, the encoder 230 for one-half-rate FEC coding, and the symbols interleaver 231, which together generate one-half-rate FEC coding with coded or "implied" interleaving. This cascade connection is replaced in the FIG. 49 portion of the DTV transmitter by the cascade connection of a bits interleaver 239 and a subsequent encoder 240 for one-half-rate FEC coding, which together generate first one-half-rate FEC coding of interleaved data. This symbol-interleaved first one-half-rate FEC coding will have to be de-interleaved at the receiver before data bits therefrom can be code combined with data bits from the second one-half-rate FEC coding originating from the encoder 234.

FIG. 50 combines with FIGS. 46 and 20 to provide a generic schematic diagram of a stationary DTV receiver adapted for iterative-diversity reception of COFDM signals as transmitted by the portions of the DTV transmitter as depicted in FIGS. 1 and 49. The portion of the DTV receiver shown in FIG. 50 differs from the portion of the DTV receiver shown in FIG. 45 in that delay memory 263 is replaced by delay memory 242. Delay memory 263 is addressed similarly during its being written and during its being read after N super-frames delay. Delay memory 242 is addressed differently during its being written and during its being read so as to de-interleave the symbol-interleaved first one-half-rate FEC coding supplied with N super-frames delay. Interleaving the first one-half-rate FEC coding initially transmitted rather than the second one-half-rate FEC coding subsequently transmitted makes it possible to subsume de-interleaving of the interleaved FEC coding component of the turbo coding into the delay memory 242 for the earlier transmission for iterative-diversity reception.

FIG. 51 shows a modification of the FIG. 35 portion of a COFDM transmitter for a DTV system, which modification is used for transmissions intended for iterative-diversity reception by M/H DTV receivers. The FIG. 35 portion of the DTV transmitter uses the cascade connection of the bits de-interleaver 219, the encoder 220 for one-half-rate FEC coding, and the symbols interleaver 221, which together generate one-half-rate FEC coding with coded or "implied" interleaving. This cascade connection is replaced in the FIG. 51 portion of the DTV transmitter by the cascade connection of a bits interleaver 243 and a subsequent encoder 244 for one-half-rate FEC coding, which together generate first one-half-rate FEC coding of interleaved data. This symbol-interleaved first one-half-rate FEC coding will have to be de-interleaved at the receiver before data bits therefrom can be code combined with data bits from the second one-half-rate FEC coding originating from the encoder 224.

FIG. 52 combines with FIGS. 48, 25 and 26 to provide a generic schematic diagram of an M/H DTV receiver adapted for iterative-diversity reception of COFDM signals as transmitted by the portions of the DTV transmitter as depicted in FIGS. 3 and 51. The portion of the DTV receiver shown in FIG. 52 differs from the portion of the DTV receiver shown in FIG. 47 in that delay memory 362 is replaced by delay memory 342. Delay memory 362 is addressed similarly during its being written and during its being read after N super-frames delay. Delay memory 342 is addressed differently during its being written and during its being read so as de-interleave the symbol-interleaved first one-half-rate FEC coding supplied with N super-frames delay.

Optimal Gray mapping and close-to-Gray mapping of bit-wise FEC coding at one-half and one-third code rates to QAM symbol constellations are employed in the DTV transmitter apparatuses described supra. Transmissions for iterative-diversity reception will halve the overall code rate for bit-wise FEC coding. DVB DTV broadcasting permits bit-wise FEC coding to be performed at 7/8, 5/6, 3/4, 2/3 or 1/2 code rates. Normally, those code rates other than 1/2 are secured by puncturing one-half-rate bit-wise FEC coding. Some of these other code rates are difficult to match to QAM symbol constellations in accordance with the precepts set forth in the foregoing specification. However, some of these other code rates are quite easily matched to QAM symbol constellations in accordance with the precepts set forth in the foregoing specification.

FIG. 53 shows how the eight bits associated with each of the 256 lattice points in the 256QAM symbol constellation shown in FIGS. 40A, 40B, 40C and 40D can be assigned for conveying seven-eighths-rate bit-wise FEC coding in broadcasts to stationary DTV receivers. Conveying seven-eighths-rate bit-wise FEC coding in broadcasts to M/H DTV receivers cannot be accomplished in such a straightforward way, because 256QAM symbol constellations are larger than desirable for such broadcasting.

FIG. 54 shows how the eight bits associated with each of the 256 lattice points in the 256QAM symbol constellation shown in FIGS. 40A, 40B, 40C and 40D can be assigned for conveying three-quarters-rate bit-wise FEC coding in broadcasts to stationary DTV receivers. FIG. 55 shows how the four bits associated with each of the 16 lattice points in a Gray-mapped 16QAM symbol constellation can be assigned for conveying three-quarters-rate bit-wise FEC coding in broadcasts to M/H DTV receivers. The parity bit is chosen to be one of the least frequently changing bits in the 16QAM symbol constellation space.

FIG. 56 shows how the six bits associated with each of the 64 lattice points in the 64QAM symbol constellation shown in FIG. 9 can be assigned for conveying five-sixths-rate bit-wise FEC coding either to stationary DTV receivers or to M/H DTV receivers. FIG. 56 also shows how the six bits associated with each of the 64 lattice points in the 64QAM symbol constellation shown in FIG. 36 can be assigned for conveying five-sixths-rate bit-wise FEC coding either to stationary DTV receivers or to M/H DTV receivers FIG. 57 shows how the six bits associated with each of the 64 lattice points in the 64QAM symbol constellation shown in FIG. 9 can be assigned for conveying two-thirds-rate bit-wise FEC coding either to stationary DTV receivers or to M/H DTV receivers. Referring back to FIG. 17, it shows how the nine bits associated with each of the 512 lattice points in the 512QAM symbol constellation shown in FIGS. 12A, 12B, 12C and 12D can be assigned for conveying two-thirds-rate bit-wise FEC coding in broadcasts to stationary DTV receivers.

The COFDM broadcast systems described supra employ (204, 188) Reed-Solomon coding to curtail error floor phenomena when COFDM signals are received that have a high signal-to-noise ratio. Alternatively, other forms of Bose-Chaudhuri-Hocquenghem (BCH) coding are used instead in other COFDM broadcast systems constructed in accordance with the precepts disclosed in this specification and drawing.

Frequency-domain equalization is augmented by time-domain equalization in some receiver designs. Recent advances in analog-to-digital converters will allow them to replace much of the front-end tuners in DTV receivers. It will be apparent to persons skilled in the art that various other modifications and variations can be made in the specifically described apparatus without departing from the spirit or scope of the invention. Accordingly, it is intended that these modifications and variations of the specifically described apparatus be considered to result in further embodiments of the invention, which are included within the scope of the appended claims and their equivalents.

In the appended claims, the word "said" rather than the word "the" is used to indicate the existence of an antecedent basis for a term being provided earlier in the claims. The word "the" is used for purposes other than to indicate the existence of an antecedent basis for a term having being provided earlier in the claims, the usage of the word "the" for other purposes being consistent with customary grammar in the American English language.

The invention claimed is:

1. A transmitter apparatus for generating coded orthogonal frequency-division multiplex (COFDM) transmissions in a digital television (DTV) system, said transmissions utilizable for conveying coding to be turbo decoded by DTV receivers in said DTV system, said transmitter apparatus comprising:

a source of first bit-wise forward-error-correction (FEC) coding that is at least a component of said coding to be turbo decoded by said DTV receivers in said DTV system, said first bit-wise FEC coding composed of data bits and a first set of redundant parity bits, said coding to be turbo decoded by said DTV receivers including a second set of redundant parity bits in addition to said data bits and said first set of redundant parity bits;

a first QAM symbol constellation mapper for mapping said first bit-wise FEC coding to a succession of complex samples descriptive of QAM symbol constellations, each of said QAM symbol constellations having a prescribed number of lattice points therein each having its own respective labeling, which prescribed number is the number two raised to a power that is a positive integer at least six, each said respective labeling composed of a number of bit-places equal to said power, said first QAM symbol constellation mapper operable for mapping said data bits of said first bit-wise FEC coding to bit-places within said labeling of said lattice points tending to have relatively low confidence levels of correctness associated therewith during de-mapping, said first QAM symbol constellation mapper further operable for mapping said first set of parity bits of said first bit-wise FEC coding to bit-places within said labeling of said lattice points tending to have confidence levels of correctness associated therewith during de-mapping at least as high as and in some cases higher than said data bits of said first bit-wise FEC coding tend to have;

a first OFDM modulator for orthogonal frequency-division multiplexing complex samples of plural carrier waves in each of successive OFDM windows responsive to respective OFDM symbol blocks supplied thereto;

a first parser of said complex samples descriptive of QAM symbols from said first QAM symbol constellation mapper into effective portions of successive ones of said OFDM symbol blocks supplied to said first OFDM modulator;

a first pilot-carrier-insertion unit for completing said OFDM symbol blocks supplied to said first OFDM modulator, by inserting complex samples descriptive of unmodulated pilot carrier waves and of carrier waves modulated by Transmission Parameters Signaling (TPS);

a first guard interval and cyclic prefix insertion unit for prefacing said complex symbols of said plural carrier waves in each of said successive OFDM windows employed by first OFDM modulator with complex symbols identical to those in a concluding portion of the same OFDM window, thereby to generate a respective one of a first succession of extended OFDM windows; and a digital-to-analog converter for converting said first succession of extended OFDM windows to an analog signal.

2. The transmitter apparatus as set forth in claim 1, wherein said source of first bit-wise FEC coding comprises:

a first encoder for coding a succession of 188-byte transport-stream packets of randomized data, thus to generate Bose-Chaudhuri-Hocquenghem (BCH) forward-error-correction (FEC) coding;

a first convolutional byte interleaver connected for convolutionally interleaving bytes of said BCH FEC coding, as received from said BCH encoder within at least a first selection of consecutive time-slices; and a second encoder for redundantly coding the individual bits of said convolutionally interleaved bytes of said BCH FEC coding as received from said first convolutional byte interleaver during a first succession of BCH codewords contained within regularly recurring portions of said first selection of said consecutive time-slices, to generate first bit-wise FEC coding reproducing at regular intervals therein successive individual bits of said convolutionally interleaved bytes of said BCH FEC coding, said successive individual bits of said convolutionally interleaved bytes of said first succession of BCH codewords reproduced within said first bit-wise FEC coding each being succeeded by a prescribed number at least one of parity bits of said first additional FEC coding, each of said successive individual bits of said first succession of BCH codewords reproduced within said first additional FEC coding and said prescribed number N at least one of parity bits of said first bit-wise FEC coding following thereafter being considered to be a respective symbol of said first bit-wise FEC coding.

3. The transmitter apparatus as set forth in claim 2, wherein said first convolutional byte interleaver employs a pattern of convolutionally interleaving bytes of said BCH FEC coding that has wrap-around for each of a number of time-slices of said BCH FEC coding received from said first encoder.

4. The transmitter apparatus as set forth in claim 1, wherein said first bit-wise FEC coding is further composed of said second set of redundant parity bits besides said data bits and said first set of redundant parity bits, and wherein said first QAM symbol constellation mapper is still further operable for mapping said second set of parity bits of said first bit-wise FEC coding to bit-places within said labeling of said lattice points tending to have confidence levels of correctness associated therewith higher than said data bits of said first bit-wise FEC coding tend to have.

5. The transmitter apparatus as set forth in claim 4, wherein said positive integer is a multiple of the number three, so each said respective labeling consists of a multiple of three bit-places.

6. The transmitter apparatus as set forth in claim 5, wherein said first QAM symbol constellation mapper is operable for mapping three-bit symbols of said first bit-wise FEC coding to a succession of complex samples descriptive of square 64QAM symbol constellations.

7. The transmitter apparatus as set forth in claim 5, wherein said first QAM symbol constellation mapper is operable for mapping three-bit symbols of said first bit-wise FEC coding to a succession of complex samples descriptive of cruciform 512QAM symbol constellations.

8. The transmitter apparatus as set forth in claim 1, said transmitter apparatus further comprising:

a source of second bit-wise forward-error-correction coding that is a further component of said coding to be turbo decoded by said DTV receivers in said DTV system, said second bit-wise forward-error-correction coding in part composed of ones of said data bits repeated after a prescribed time interval irrespective of any request for repeat from any receiver apparatus, said second bit-wise forward-error-correction coding in further part composed of said second set of redundant parity bits; and a time-division multiplexer for interleaving time-slices of said second bit-wise forward-error-correction coding with time-slices of said first bit-wise forward-error-correction coding to be supplied to said first QAM symbol constellation mapper, said first QAM symbol constellation mapper operable for mapping said data bits of said second bit-wise FEC coding to bit-places within said labeling of said lattice points tending to have relatively low confidence levels of correctness associated therewith during de-mapping, said first QAM symbol constellation mapper further operable for mapping said second set of parity bits of said second bit-wise FEC coding to bit-places within said labeling of said lattice points tending to have confidence levels of correctness associated therewith during de-mapping at least as high as and in some cases higher than said data bits of said second bit-wise FEC coding tend to have.

9. The transmitter apparatus as set forth in claim 8, wherein said positive integer is a multiple of the number two, so each said respective labeling consists of a multiple of two bit-places.

10. The transmitter apparatus as set forth in claim 9, wherein said first constellation mapper is operable for mapping two-bit symbols of said bit-wise FEC coding supplied from said time-division multiplexer to a succession of complex samples descriptive of square 64QAM symbol constellations.

11. The transmitter apparatus as set forth in claim 9, wherein said first constellation mapper is operable for mapping two-bit symbols of said bit-wise FEC coding supplied from said time-division multiplexer to a succession of complex samples descriptive of square 256QAM symbol constellations.

12. The transmitter apparatus as set forth in claim 1, wherein said first bit-wise FEC coding is supplied from said source thereof in successive time-slices that alternate being in a set of odd-numbered time-slices and being in a set of even-numbered time-slices, the data bits in the earlier transmitted one of said sets of time-slices being bit-interleaved respective to corresponding data bits in the later transmitted one of said sets of time-slices, the bit-interleaved data bits in the earlier transmitted one of said sets of time-slices being redundantly coded to generate parity bits conveyed in the earlier transmitted one of said sets of time-slices, the data bits in the later transmitted one of said sets of time-slices being redundantly coded similarly to the bit-interleaved data bits in the earlier transmitted one of said sets of time-slices to generate parity bits conveyed in the later transmitted one of said sets of time-slices.

13. A receiver apparatus for coded orthogonal frequency-division multiplex (COFDM) transmissions in a digital television (DTV) system in which bytes of Bose-Chaudhuri-Hocquenghem (BCH) forward-error-correction (FEC) coding of randomized data are convolutionally byte-interleaved and subjected to bit-wise additional forward-error-correction (FEC) coding, which DTV system maps said bit-wise additional FEC coding to QAM symbol constellations, said receiver apparatus comprising:
 a front-end tuner for converting a selected radio-frequency analog COFDM signal to a digitized baseband COFDM signal;
 a demodulator of said orthogonal frequency-division multiplex (OFDM) signal, for supplying complex samples of quadrature-amplitude-modulated (QAM) signal in response to said OFDM signal;
 a guard-interval-remover unit connected for removing guard-interval digital samples including samples of cyclic prefixes from said digitized baseband COFDM signal to generate OFDM signal for application to said demodulator for OFDM signal as an input signal thereto;
 a processor of unmodulated pilot carrier waves and of carrier waves modulated by Transmission Parameters Signaling (TPS) supplied from said demodulator for OFDM signal as a first output signal therefrom, said processor of unmodulated pilot carrier waves and of carrier waves modulated by TPS processing said unmodulated pilot carrier waves to generate continuing measurements of their total root-mean-square energy;
 a frequency-domain channel equalizer for equalizing complex samples of QAM signal supplied from said demodulator for OFDM signal as a second output signal therefrom, said equalizing being performed responsive to said unmodulated pilot carrier waves supplied from said demodulator for OFDM signal as a portion of said first output signal therefrom;
 a de-mapper of QAM symbol constellations, connected to respond to the second output signal from said frequency-domain channel equalizer, said de-mapper of QAM symbol constellations operable for recovering bit-wise FEC coding in soft-bit format, each of said QAM symbol constellations having a prescribed number of lattice points therein each having its own respective labeling, which prescribed number is the number two raised to a power that is a positive integer at least six, each said respective labeling composed of a number of bit-places equal to said power; and
 a turbo decoder for decoding said soft bits of said bit-wise additional FEC coding recovered by said de-mapper of QAM symbol constellations, thereby to recover soft bits of convolutionally byte-interleaved codewords of said BCH FEC coding, said turbo decoder connected for receiving soft data bits of said bit-wise additional FEC coding that are subject to adjustment during decoding from bit-places within said labeling of said lattice points most likely to have lower confidence levels of correctness associated therewith during de-mapping, said turbo decoder further connected for receiving soft parity bits of said bit-wise additional FEC coding from the other bit-places within said labeling of said lattice points.

14. The receiver apparatus as set forth in claim 13, said receiver apparatus further comprising:
 an antenna for wireless reception of radio-frequency analog COFDM signals, said antenna connected for supplying said radio-frequency analog COFDM signals to said front-end tuner for conversion of said selected one of them to said digitized baseband COFDM signal.

15. The receiver apparatus as set forth in claim 13, wherein said byte de-interleaver has wrap-around for each of a number of time-slices of said BCH FEC coding.

16. The receiver apparatus as set forth in claim 13, wherein said BCH decoder is operable for decoding Reed-Solomon coding of 188-byte said packets of randomized data bits.

17. The receiver apparatus as set forth in claim 13, wherein said de-mapper of QAM symbol constellations is operable for de-mapping cruciform 512QAM symbol constellations, said receiver apparatus further comprising:
 a byte de-interleaver connected for de-interleaving said convolutionally byte-interleaved codewords of BCH FEC coding recovered by said turbo decoder;
 a BCH decoder connected for decoding said codewords of BCH FEC coding as de-interleaved by said byte de-interleaver and thereby recovering packets of randomized data bits; and
 a data de-randomizer connected for de-randomizing said randomized data bits from said packets, thus to recover a stream of data bits.

18. The receiver apparatus as set forth in claim 13, wherein said de-mapper of QAM symbol constellations is operable for de-mapping square 64QAM symbol constellations, said receiver apparatus further comprising:
 a byte de-interleaver connected for de-interleaving said convolutionally byte-interleaved codewords of BCH FEC coding recovered by said turbo decoder;
 a BCH decoder connected for decoding said codewords of BCH FEC coding as de-interleaved by said byte de-interleaver and thereby recovering packets of randomized data bits; and
 a data de-randomizer connected for de-randomizing said randomized data bits from said packets, thus to recover a stream of data bits.

19. The receiver apparatus as set forth in claim 13, wherein said de-mapper of QAM symbol constellations is operable for de-mapping square 64QAM symbol constellations, said receiver apparatus further comprising:

a byte de-interleaver connected for de-interleaving said
convolutionally byte-interleaved codewords of BCH
FEC coding recovered by said turbo decoder;
a BCH decoder connected for decoding said codewords of
BCH FEC coding as de-interleaved by said byte de-
interleaver and thereby recovering packets of randomized data bits;
a decoder for decoding transverse coding of said packets of
randomized data bits; and
a data de-randomizer connected for de-randomizing said
randomized data bits from said packets after decoding of
their transverse coding, thus to recover a stream of data
bits.

20. The receiver apparatus as set forth in claim 13, said receiver apparatus capable of providing iterative-diversity reception of time-sliced COFDM transmissions made twice a prescribed time interval apart, said receiver apparatus further comprising:
apparatus for delaying selected time-slices of said second output signal from said channel equalizer composed of complex samples of QAM signal from earlier COFDM transmissions subsequently to be repeated, so they concur with complex samples of QAM signal from the later repeated COFDM transmissions in other time-slices of said second output signal from said channel equalizer; and
a maximal-ratio QAM combiner for combining the contemporaneous complex samples of QAM signal from COFDM transmissions subsequently to be repeated and from the repeated COFDM transmissions, thereby to generate combined complex samples of QAM signal supplied as input signal to said de-mapper of QAM symbol constellations.

21. The receiver apparatus as set forth in claim 20, wherein said de-mapper of QAM symbol constellations is operable for de-mapping cruciform 512QAM symbol constellations, said receiver apparatus further comprising:
a byte de-interleaver connected for de-interleaving said convolutionally byte-interleaved codewords of BCH FEC coding recovered by said turbo decoder;
a BCH decoder connected for decoding said codewords of BCH FEC coding as de-interleaved by said byte de-interleaver and thereby recovering packets of randomized data bits; and
a data de-randomizer connected for de-randomizing said randomized data bits from said packets, thus to recover a stream of data bits.

22. The receiver apparatus as set forth in claim 20, wherein said de-mapper of QAM symbol constellations is operable for de-mapping square 64QAM symbol constellations, said receiver apparatus further comprising:
a byte de-interleaver connected for de-interleaving said convolutionally byte-interleaved codewords of BCH FEC coding recovered by said turbo decoder;
a BCH decoder connected for decoding said codewords of BCH FEC coding as de-interleaved by said byte de-interleaver and thereby recovering packets of randomized data bits; and
a data de-randomizer connected for de-randomizing said randomized data bits from said packets, thus to recover a stream of data bits.

23. The receiver apparatus as set forth in claim 20, wherein said de-mapper of QAM symbol constellations is operable for de-mapping square 64QAM symbol constellations, said receiver apparatus further comprising:

a byte de-interleaver connected for de-interleaving said
convolutionally byte-interleaved codewords of BCH
FEC coding recovered by said turbo decoder;
a BCH decoder connected for decoding said codewords of
BCH FEC coding as de-interleaved by said byte de-
interleaver and thereby recovering packets of randomized data bits;
a decoder for decoding transverse coding of said packets of
randomized data bits; and
a data de-randomizer connected for de-randomizing said
randomized data bits from said packets after decoding of
their transverse coding, thus to recover a stream of data
bits.

24. The receiver apparatus as set forth in claim 13, said receiver apparatus capable of providing iterative-diversity reception of a pair of COFDM transmissions interleaved in time, corresponding time-slices of the earlier and later of said COFDM transmissions conveying respective redundant coding of the same data a prescribed time interval apart, said receiver apparatus further comprising:
apparatus for delaying the response of said de-mapper of QAM symbol constellations to selected time-slices of said second output signal from said channel equalizer composed of complex samples of QAM signal from said earlier COFDM transmissions, so they concur with the response of said de-mapper of QAM symbol constellations to selected corresponding time-slices of said second output signal from said channel equalizer composed of complex samples of QAM signal from said later COFDM transmissions; and
a maximal-ratio code combiner for combining (a) the resulting delayed response of said de-mapper of QAM symbol constellations to said selected time-slices of said second output signal from said channel equalizer composed of complex samples of QAM signal from said earlier COFDM transmissions with (b) the response of said de-mapper of QAM symbol constellations to selected corresponding time-slices of said second output signal from said channel equalizer composed of complex samples of QAM signal from said later COFDM transmissions, thereby to generate said soft data bits of said recovered FEC coding for decoding by said turbo decoder.

25. The receiver apparatus as set forth in claim 24, wherein said de-mapper of QAM symbol constellations is operable for de-mapping square 256QAM symbol constellations, said receiver apparatus further comprising:
a byte de-interleaver connected for de-interleaving said convolutionally byte-interleaved codewords of BCH FEC coding recovered by said turbo decoder;
a BCH decoder connected for decoding said codewords of BCH FEC coding as de-interleaved by said byte de-interleaver and thereby recovering packets of randomized data bits; and
a data de-randomizer connected for de-randomizing said randomized data bits from said packets, thus to recover a stream of data bits.

26. The receiver apparatus as set forth in claim 24, wherein said de-mapper of QAM symbol constellations is operable for de-mapping square 64QAM symbol constellations, said receiver apparatus further comprising:
a byte de-interleaver connected for de-interleaving said convolutionally byte-interleaved codewords of BCH FEC coding recovered by said turbo decoder;

a BCH decoder connected for decoding said codewords of BCH FEC coding as de-interleaved by said byte de-interleaver and thereby recovering packets of randomized data bits;

a decoder for decoding transverse coding of said packets of randomized data bits; and a data de-randomizer connected for de-randomizing said randomized data bits from said packets after decoding of their transverse coding, thus to recover a stream of data bits.

27. The receiver apparatus as set forth in claim 24, wherein symbol de-interleaving of redundant coding of earlier COFDM transmissions of data is provided by said apparatus for delaying the response of said de-mapper of QAM symbol constellations to selected time-slices of said second output signal from said channel equalizer composed of complex samples of QAM signal from said earlier COFDM transmissions.

28. The transmitter apparatus as set forth in claim 4, wherein said first bit-wise FEC coding is initially transmitted in a first set of time-slices and is subsequently re-transmitted after a prescribed time interval in a second set of time-slices separated in time and interleaved in time with said first set of time-slices, said first bit-wise FEC coding being subsequently re-transmitted irrespective of any request for repeat from any receiver apparatus.

* * * * *